(12) United States Patent
Maehashi

(10) Patent No.: US 9,406,348 B2
(45) Date of Patent: Aug. 2, 2016

(54) MEMORY CELL INCLUDING TRANSISTOR AND CAPACITOR

(71) Applicant: Semiconductor Energy Laboratory Co., Ltd., Atsugi-shi, Kanagawa-ken (JP)

(72) Inventor: Yukio Maehashi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 142 days.

(21) Appl. No.: 14/577,491

(22) Filed: Dec. 19, 2014

(65) Prior Publication Data

US 2015/0187778 A1 Jul. 2, 2015

(30) Foreign Application Priority Data

Dec. 26, 2013 (JP) ................. 2013-268614

(51) Int. Cl.
*G11C 5/06* (2006.01)
*H01L 27/11* (2006.01)
*G11C 11/24* (2006.01)
*G11C 7/10* (2006.01)

(52) U.S. Cl.
CPC ........... *G11C 5/06* (2013.01); *G11C 5/063* (2013.01); *G11C 7/1075* (2013.01); *G11C 11/24* (2013.01); *H01L 27/1116* (2013.01); *G11C 2207/2209* (2013.01)

(58) Field of Classification Search
CPC .......... G11C 5/06; G11C 5/063; G11C 11/24; G11C 2207/2209; G11C 7/1075; H01L 27/1116
See application file for complete search history.

(56) References Cited

U.S. PATENT DOCUMENTS

| | | | |
|---|---|---|---|
| 6,127,702 A | 10/2000 | Yamazaki et al. | |
| 7,674,650 B2 | 3/2010 | Akimoto et al. | |
| 8,619,464 B1 * | 12/2013 | Sinha | H01L 27/1104 365/154 |
| 8,760,907 B2 * | 6/2014 | Evans, Jr. | G11C 11/2273 365/145 |
| 2005/0052897 A1 * | 3/2005 | Luk | G11C 7/067 365/149 |
| 2010/0118597 A1 * | 5/2010 | Song | G11C 11/405 365/149 |

(Continued)

FOREIGN PATENT DOCUMENTS

| | | |
|---|---|---|
| JP | 2012-256818 A | 12/2012 |
| JP | 2013-038398 A | 2/2013 |

OTHER PUBLICATIONS

Kazunari Ishimaru; "45 nm/32 nm CMOS—Challenge and perspective"; Solid-State Electronics, vol. 52, No. 9; pp. 1266-1273; Sep. 1, 2008.

(Continued)

*Primary Examiner* — Vanthu Nguyen
(74) *Attorney, Agent, or Firm* — Fish & Richardson P.C.

(57) ABSTRACT

A semiconductor storage device capable of performing low-voltage operation, reducing standby current, and decreasing memory size is provided. The semiconductor storage device is a semiconductor device including first to fourth transistors and a capacitor. The first transistor has a function of supplying a first signal to the capacitor. The capacitor has a function of accumulating electric charge based on the first signal. The second transistor has a function of supplying the electric charge based on the first signal to a gate of the third transistor. The third transistor has a function of outputting a first potential to a wiring and a function of supplying the first potential to a gate of the fourth transistor. The fourth transistor has a function of supplying a second potential to the capacitor through the second transistor.

16 Claims, 34 Drawing Sheets

(56) References Cited

U.S. PATENT DOCUMENTS

| | | |
|---|---|---|
| 2010/0148171 A1 | 6/2010 | Hayashi et al. |
| 2011/0089417 A1 | 4/2011 | Yamazaki et al. |
| 2011/0101351 A1 | 5/2011 | Yamazaki |
| 2012/0037972 A1 | 2/2012 | Yoneda |
| 2012/0120717 A1* | 5/2012 | Sekigawa ............ H01L 27/1104 365/156 |
| 2013/0009146 A1 | 1/2013 | Nomura et al. |

OTHER PUBLICATIONS

Tomoyuki Ishii et al.; "A Poly-Silicon TFT With a Sub-5-nm Thick Channel for Low-Power Gain Cell Memory in Mobile Applications"; IEEE Transactions on Electron Devices, vol. 51, No. 11; pp. 1805-1810; Nov. 1, 2004.

Wonchan Kim et al.; "An Experimental High-Density DRAM Cell with a Built-in Gain Stage"; IEEE Journal of Solid-State Circuits, vol. 29, No. 8; pp. 978-981; Aug. 1, 1994.

Shoji Shukuri et al.; "A Complementary Gain Cell Technology for Sub-1V Supply DRAMs"; IEDM 92: Technical Digest of International Electron Devices Meeting; pp. 1006-1008; Dec. 13, 1992.

Shoji Shukuri et al.; "A Semi-Static Complementary Gain Cell Technology for Sub-1 V Supply DRAM's"; IEEE Transactions on Electron Devices, vol. 41, No. 6; pp. 926-931; Jun. 1, 1994.

\* cited by examiner

MEMORY CELL INCLUDING TRANSISTOR AND CAPACITOR

BACKGROUND OF THE INVENTION

1. Field of the Invention

One embodiment of the present invention relates to a semiconductor device, a method for driving the semiconductor device, a semiconductor storage device, a method for driving the semiconductor storage device, a memory cell, or a method for driving the memory cell.

Note that one embodiment of the present invention is not limited to the above technical field. The technical field of the invention disclosed in this specification and the like relates to an object, a method, or a manufacturing method. In addition, the present invention relates to a process, a machine, manufacture, or a composition of matter. Specifically, examples of the technical field of one embodiment of the present invention disclosed in this specification include a semiconductor device, a display device, a light-emitting device, a power storage device, a storage device, a method for driving any of them, and a method for manufacturing any of them.

2. Description of the Related Art

A static random access memory (SRAM) is known as a memory (see Patent Document 1). The SRAM is mounted on a central processing unit (CPU) or the like.

REFERENCE

Patent Document 1: Japanese Published Patent Application No. 2013-038398

SUMMARY OF THE INVENTION

In accordance with process scaling, a memory including a CMOS circuit, such as an SRAM, has problems of power supply voltage, standby current, and memory size.

In principle, the minimum value of power supply voltage is the sum of the absolute value of the threshold voltage of a p-channel transistor and the absolute value of the threshold voltage of an n-channel transistor; thus, lowering the voltage is difficult. In addition, as a transistor is scaled down, variations in the threshold voltage of the transistor become larger. Furthermore, as the variations in the threshold voltage of the transistor become larger, a static noise margin (SNM) becomes smaller. Thus, when the transistor is scaled down, lowering the voltage is more difficult.

Before the transistor is scaled down, the main component of standby current is subthreshold current. However, as the transistor is scaled down, the proportion of gate-induced drain leakage (GIDL), gate tunnel leakage, junction leakage, and the like in the standby current becomes higher. Lowering the voltage is effective in reducing these currents. However, as described above, lowering the voltage is difficult.

If the design rule is denoted by "F," SRAM memory size is approximately $120 F^2$. This corresponds to approximately ten times the memory size of a dynamic random access memory (DRAM), which is significantly larger than the memory size of the DRAM.

It is an object of one embodiment of the present invention to lower power supply voltage. Alternatively, it is an object of one embodiment of the present invention to reduce standby current. Alternatively, it is an object of one embodiment of the present invention to reduce size. Alternatively, it is an object of one embodiment of the present invention to provide a novel structure or configuration.

Note that the objects of the present invention are not limited to the above objects.

The above objects do not disturb the existence of other objects. The other objects are objects that are not described above and will be described below. The other objects will be apparent from and can be derived as appropriate from the description of the specification, the drawings, and the like by those skilled in the art.

One embodiment of the present invention achieves at least one of the above objects and the other objects.

One embodiment of the present invention is a semiconductor device including first to fourth transistors and a capacitor. One of a source and a drain of the first transistor is electrically connected to a first wiring. The other of the source and the drain of the first transistor is electrically connected to a first terminal of the capacitor. One of a source and a drain of the second transistor is electrically connected to the first terminal of the capacitor. The other of the source and the drain of the second transistor is electrically connected to a gate of the third transistor. One of a source and a drain of the third transistor is electrically connected to a second wiring. The other of the source and the drain of the third transistor is electrically connected to a third wiring and a gate of the fourth transistor. One of a source and a drain of the fourth transistor is electrically connected to a fourth wiring. The other of the source and the drain of the fourth transistor is electrically connected to the gate of the third transistor.

One embodiment of the present invention is a semiconductor device including first to seventh transistors and a capacitor. One of a source and a drain of the first transistor is electrically connected to a first wiring. The other of the source and the drain of the first transistor is electrically connected to a first terminal of the capacitor. One of a source and a drain of the second transistor is electrically connected to the first terminal of the capacitor. The other of the source and the drain of the second transistor is electrically connected to a gate of the third transistor. One of a source and a drain of the third transistor is electrically connected to a second wiring. The other of the source and the drain of the third transistor is electrically connected to a third wiring through the fourth transistor and is electrically connected to a gate of the seventh transistor through the fifth transistor. One of a source and a drain of the sixth transistor is electrically connected to a fourth wiring. The other of the source and the drain of the sixth transistor is electrically connected to the gate of the seventh transistor. One of a source and a drain of the seventh transistor is electrically connected to the fourth wiring. The other of the source and the drain of the seventh transistor is electrically connected to the gate of the third transistor.

Note that the semiconductor device may include an eighth transistor. One of a source and a drain of the eighth transistor is electrically connected to one of the source and the drain of the third transistor. The other of the source and the drain of the eighth transistor is electrically connected to the gate of the third transistor.

Note that the semiconductor device may include a ninth transistor. One of a source and a drain of the ninth transistor is electrically connected to one of the source and the drain of the first transistor. The other of the source and the drain of the ninth transistor is electrically connected to the gate of the third transistor.

One embodiment of the present invention is a semiconductor device including first to fourth transistors and a capacitor. The first transistor has a function of supplying a first signal to the capacitor. The capacitor has a function of accumulating electric charge based on the first signal. The second transistor has a function of supplying the electric charge based on the first signal to a gate of the third transistor. The third transistor has a function of outputting a first potential to a wiring and a function of supplying the first potential to a gate of the fourth transistor. The fourth transistor has a function of supplying a second potential to the capacitor through the second transistor.

One embodiment of the present invention is a semiconductor device including first to seventh transistors and a capacitor. The first transistor has a function of supplying a first signal to the capacitor. The capacitor has a function of accumulating electric charge based on the first signal. The second transistor has a function of supplying the electric charge based on the first signal to a gate of the third transistor. The third transistor has a function of supplying a first potential to a first wiring through the fourth transistor and a function of supplying the first potential to a gate of the seventh transistor through the fifth transistor. The sixth transistor has a function of supplying a second potential to the gate of the seventh transistor. The seventh transistor has a function of supplying the second potential to the capacitor through the second transistor.

Note that the semiconductor device may include an eighth transistor. The eighth transistor has a function of supplying the first potential to the gate of the third transistor.

Note that the semiconductor device may include a ninth transistor. The ninth transistor has a function of supplying the first signal to the capacitor through the second transistor.

In the semiconductor device, the first transistor and the second transistor may each include an oxide semiconductor.

One embodiment of the present invention can lower power supply voltage. Alternatively, one embodiment of the present invention can reduce standby current. Alternatively, one embodiment of the present invention can reduce size. Alternatively, one embodiment of the present invention can provide a novel structure or configuration.

Note that the effects of the present invention are not limited to the above effects.

The above effects do not disturb the existence of other effects. The other effects are effects that are not described above and will be described below. The other effects will be apparent from and can be derived as appropriate from the description of the specification, the drawings, and the like by those skilled in the art.

One embodiment of the present invention has at least one of the above effects and the other effects. Accordingly, one embodiment of the present invention does not have the above effects in some cases.

DETAILED DESCRIPTION OF THE INVENTION

Figure 1:
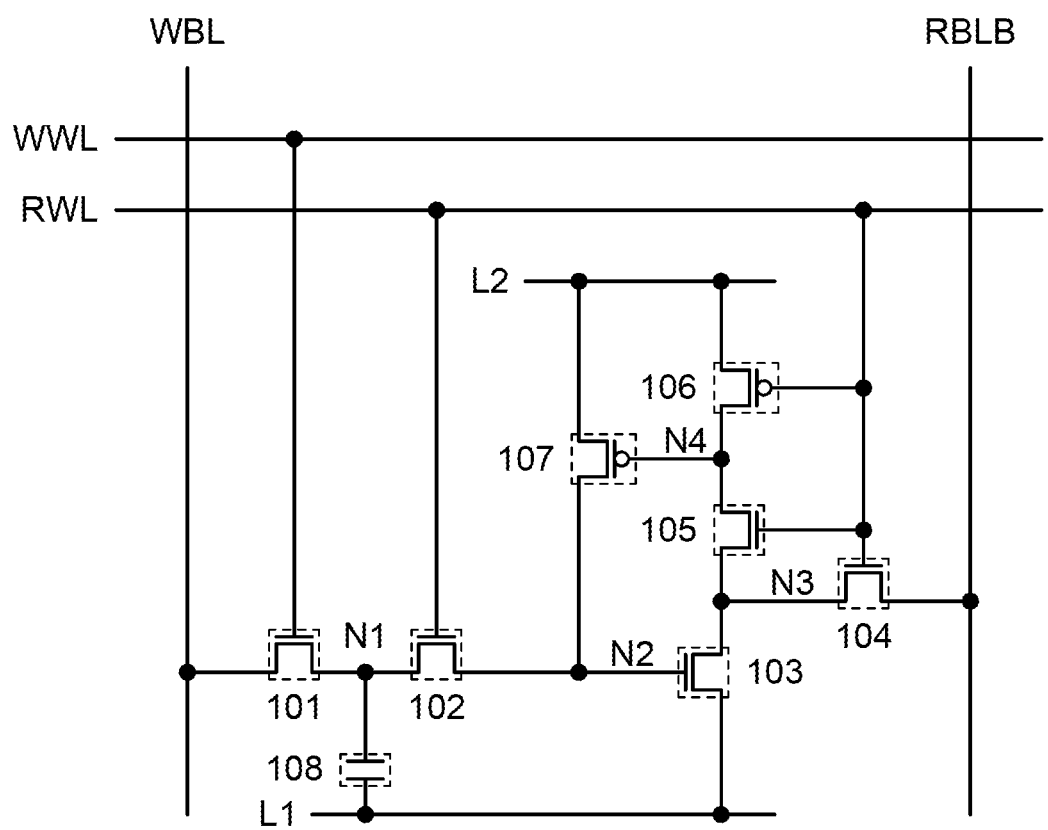
FIG. 1 is a circuit diagram illustrating one embodiment of the present invention.

Embodiments will be described below with reference to the drawings. Note that the embodiments can be implemented in various different ways and it will be readily appreciated by those skilled in the art that modes and details of the present invention can be modified in various ways without departing from the spirit and scope of the present invention. The present invention therefore should not be construed as being limited to the following description of the embodiments. Note that in structures of the invention described below, reference numerals denoting the same portions are used in common in different drawings.

In the drawings, the size, the layer thickness, or the region is exaggerated for clarity in some cases. Thus, embodiments of the present invention are not limited to such scales. Note that the drawings are schematic views showing ideal examples, and embodiments of the present invention are not limited to shapes or values shown in the drawings. For example, the following can be included: variation in signal, voltage, or current due to noise or difference in timing.

In this specification and the like, a transistor is an element having at least three terminals: a gate (a gate terminal or a gate electrode), a drain, and a source. The transistor includes a channel region between the drain (a drain terminal, a drain region, or a drain electrode) and the source (a source terminal, a source region, or a source electrode) and current can flow through the drain, the channel region, and the source.

Here, since the source and the drain of the transistor change depending on the structure, the operating condition, and the like of the transistor, it is difficult to define which is a source or a drain. Thus, regions that function as a source or a drain are each not referred to as a source or a drain in some cases. In that case, one of the source and the drain might be referred to as a first terminal, and the other of the source and the drain might be referred to as a second terminal.

In this specification, ordinal numbers such as "first," "second," and "third" are used to avoid confusion among components, and thus do not limit the number of the components.

In this specification, the expression "A and B are connected" means the case where "A and B are electrically connected" in addition to the case where "A and B are directly connected." Here, the expression "A and B are electrically connected" means the case where electric signals can be transmitted and received between A and B when an object having any electric action exists between A and B.

In this specification, terms for describing arrangement, such as "over" and "under," are used for convenience for describing the positional relationship between components with reference to drawings. Furthermore, the positional relationship between components is changed as appropriate in accordance with a direction in which each component is described. Thus, there is no limitation on terms used in this specification, and description can be made appropriately depending on the situation.

The positional relationships of circuit blocks in diagrams are specified for description, and even in the case where different circuit blocks have different functions in the diagrams, the different circuit blocks might be provided in an actual circuit or region so that different functions are achieved in the same circuit block. The functions of circuit blocks in diagrams are specified for description, and even in the case where one circuit block is illustrated, blocks might be provided in an actual circuit or region so that processing performed by one circuit block is performed by a plurality of circuit blocks.

Voltage refers to a difference between a given potential and a reference potential (e.g., a ground potential) in many cases. Thus, voltage, a potential, and a potential difference can also be referred to as a potential, voltage, and a voltage difference, respectively. Note that voltage refers to a difference between potentials of two points, and a potential refers to electrostatic energy (electric potential energy) of a unit charge at a given point in an electrostatic field.

Note that a ground potential is not always 0 V.

In this specification and the like, the term "parallel" indicates that an angle formed between two straight lines is −10 to 10°, and accordingly includes the case where the angle is −5 to 5°. In addition, the term "perpendicular" indicates that an angle formed between two straight lines is 80 to 100°, and accordingly includes the case where the angle is 85 to 95°.

In this specification and the like, trigonal and rhombohedral crystal systems are included in a hexagonal crystal system.

Embodiment 1

In this embodiment, a memory cell and a semiconductor storage device that can include the memory cell are described. Note that the memory cell is also referred to as a semiconductor device. In addition, the semiconductor storage device is also referred to as a semiconductor device.

First, a memory cell structure is described with reference to a circuit diagram of a memory cell in FIG. 1.

The memory cell in FIG. 1 includes transistors 101 to 107 and a capacitor 108.

The conductivity types of the transistors 101 to 107 are not limited as long as the following operation can be performed. Note that for convenience, the transistors 101 to 105 are n-channel transistors, and the transistors 106 and 107 are p-channel transistors.

A first terminal of the transistor 101 is connected to a wiring WBL. A gate of the transistor 101 is connected to a wiring WWL. A first terminal of the transistor 102 is connected to a second terminal of the transistor 101. A gate of the transistor 102 is connected to a wiring RWL. A first terminal of the transistor 103 is connected to a wiring L1. A gate of the transistor 103 is connected to a second terminal of the transistor 102. A first terminal of the transistor 104 is connected to a second terminal of the transistor 103. A second terminal of the transistor 104 is connected to a wiring RBLB. A gate of the transistor 104 is connected to the wiring RWL. A first terminal of the transistor 105 is connected to the second terminal of the transistor 103. A gate of the transistor 105 is connected to the wiring RWL. A first terminal of the transistor 106 is connected to a wiring L2. A second terminal of the transistor 106 is connected to a second terminal of the transistor 105. A gate of the transistor 106 is connected to the wiring RWL. A first terminal of the transistor 107 is connected to the wiring L2. A second terminal of the transistor 107 is connected to the gate of the transistor 103. A gate of the transistor 107 is connected to the second terminal of the transistor 106. A first terminal of the capacitor 108 is connected to the wiring L1. A second terminal of the capacitor 108 is connected to the second terminal of the transistor 101.

Note that a node N1 corresponds to a connection portion of the second terminal of the transistor 101 and the first terminal of the transistor 102. A node N2 corresponds to a connection portion of the second terminal of the transistor 102, the gate of the transistor 103, and the second terminal of the transistor 107. A node N3 corresponds to a connection portion of the second terminal of the transistor 103, the first terminal of the transistor 104, and the first terminal of the transistor 105. A node N4 corresponds to a connection portion of the second terminal of the transistor 105, the second terminal of the transistor 106, and the gate of the transistor 107.

A signal $V_{WBL}$ is input to the wiring WBL. The signal $V_{WBL}$ controls the value of data written to the memory cell and corresponds to the data written to the memory cell. Although details are described later, the on or off state of the transistor 103 is controlled by the signal $V_{WBL}$. Thus, the signal $V_{WBL}$ has a potential at which the transistor 103 can be turned on and a potential at which the transistor 103 can be turned off. For convenience, the potential of the signal $V_{WBL}$ at which the transistor 103 can be turned on is referred to as a high level, and the potential of the signal $V_{WBL}$ at which the transistor 103 can be turned off is referred to as a low level.

A signal $V_{WWL}$ is input to the wiring WWL. The signal $V_{WWL}$ controls the on or off state of the transistor 101 and has two states (active and inactive states). When the signal $V_{WWL}$ is activated, the transistor 101 is turned on. When the signal $V_{WWL}$ is deactivated, the transistor 101 is turned off. For convenience, the potential of the signal $V_{WWL}$ in the active state is referred to as a high level, and the potential of the signal $V_{WWL}$ in the inactive state is referred to as a low level.

A signal $V_{RWL}$ is input to the wiring RWL. The signal $V_{RWL}$ controls the on or off state of each of the transistors 102, 104, 105, and 106 and has two states (active and inactive states). When the signal $V_{RWL}$ is activated, the transistors 102, 104, and 105 are turned on and the transistor 106 is turned off. When the signal $V_{RWL}$ is deactivated, the transistors 102, 104, and 105 are turned off and the transistor 106 is turned on. For convenience, the potential of the signal $V_{RWL}$ in the active state is referred to as a high level, and the potential of the signal $V_{RWL}$ in the inactive state is referred to as a low level.

A signal $V_{RBLB}$ is input to the wiring RBLB. The signal $V_{RBLB}$ is controlled in accordance with data read from the memory cell and corresponds to the data read from the memory cell. By detecting the signal $V_{RBLB}$, the value of the data read from the memory cell can be determined.

A potential $V_{L1}$ is input to the wiring L1. Although details are described later, to turn on the transistor 107, the potential $V_{L1}$ is supplied to the node N4 in some cases. Thus, the potential $V_{L1}$ can turn on the transistor 107. In addition, to change the potential of the precharged wiring RBLB, the potential $V_{L1}$ is supplied to the wiring RBLB in some cases. Accordingly, the potential $V_{L1}$ is different from the potential of the precharged wiring RBLB. Note that for convenience, in the case where the potential $V_{L1}$ is supplied to a node or a wiring, the potential of the node or the wiring is set at a low level.

A potential $V_{L2}$ is input to the wiring L2. Although details are described later, to turn off the transistor 107, the potential $V_{L2}$ is supplied to the node N4 in some cases. Thus, the potential $V_{L2}$ can turn off the transistor 107. In addition, when the transistor 103 is on, the potential $V_{L2}$ is supplied to the node N1 in some cases to store electric charge in the capacitor 108. Thus, the potential $V_{L2}$ can turn on the transistor 103. Note that for convenience, in the case where the potential $V_{L2}$ is supplied to a node or a wiring, the potential of the node or the wiring is set at a high level.

Note that the signal, the potential, and the like input to the wiring WBL, the wiring WWL, the wiring RWL, the wiring RBLB, the wiring L1, and/or the wiring L2 are not limited to those described above.

The transistor 101 has a function of controlling conduction or non-conduction between the wiring WBL and the node N1. When the transistor 101 is on, the wiring WBL and the node N1 are brought into conduction, and the signal $V_{WBL}$ is supplied to the node N1 through the transistor 101. Then, electric charge based on the signal $V_{WBL}$ (also referred to as electric charge $Q_{WBL}$) is accumulated in the capacitor 108, and the potential of the node N1 is based on the signal $V_{WBL}$. On the other hand, when the transistor 101 is off, the wiring WBL and the node N1 are brought out of conduction, and the signal $V_{WBL}$ is not supplied to the node N1.

The transistor 102 has a function of controlling conduction or non-conduction between the nodes N1 and N2. When the transistor 102 is on, the nodes N1 and N2 are brought into conduction, and the electric charge $Q_{WBL}$ accumulated in the capacitor 108 is supplied to the node N2 through the transistor 102. Then, the potential of the node N2 is based on the electric charge $Q_{WBL}$ accumulated in the capacitor 108. In other words, the potential of the node N2 is based on the signal $V_{WBL}$. On the other hand, when the transistor 102 is off, the nodes N1 and N2 are brought out of conduction, and the electric charge accumulated in the capacitor 108 is not supplied to the node N2.

The transistors 101 and 102 are described in detail. When the transistors 101 and 102 are turned off, the node N1, the wiring WBL, and the node N2 are brought out of conduction and the node N1 becomes floating. Then, the electric charge $Q_{WBL}$ is continuously accumulated in the capacitor 108, and the potential of the node N1 remains based on the signal $V_{WBL}$.

The transistor 103 has a function of controlling conduction or non-conduction between the wiring L1 and the node N3. The on or off state of the transistor 103 is controlled by the potential of the node N2. When the transistor 103 is on, the wiring L1 and the node N3 are brought into conduction, and the potential $V_{L1}$ is supplied to the node N3 through the transistor 103. Then, the potential of the node N3 is based on the potential $V_{L1}$. On the other hand, when the transistor 103 is off, the wiring L1 and the node N3 are brought out of conduction, and the potential $V_{L1}$ is not supplied to the node N3.

The transistors 102 and 103 are described in detail. When the transistor 102 is on, the potential of the node N2 is based on the electric charge $Q_{WBL}$ accumulated in the capacitor 108. The on or off state of the transistor 103 is controlled by the potential of the node N2. Thus, the on or off state of the transistor 103 is controlled by the electric charge $Q_{WBL}$ accumulated in the capacitor 108. In other words, the on or off state of the transistor 103 is controlled by the signal $V_{WBL}$.

The transistor 104 has a function of controlling conduction or non-conduction between the node N3 and the wiring RBLB. When the transistor 104 is on, the node N3 and the wiring RBLB are brought into conduction. On the other hand, when the transistor 104 is off, the node N3 and the wiring RBLB are brought out of conduction.

The transistors 103 and 104 are described in detail. When the transistor 104 is on, conduction or non-conduction between the wiring L1 and the wiring RBLB is controlled in accordance with the on or off state of the transistor 103. The on or off state of the transistor 103 is controlled by the electric charge $Q_{WBL}$ accumulated in the capacitor 108. Thus, the conduction or non-conduction between the wiring L1 and the wiring RBLB is controlled by the electric charge $Q_{WBL}$ accumulated in the capacitor 108. In other words, the conduction or non-conduction between the wirings L1 and RBLB is controlled by the signal $V_{WBL}$. When the transistor 103 is on, the wirings L1 and RBLB are brought into conduction, and the potential $V_{L1}$ is supplied to the wiring RBLB through the transistors 103 and 104. Then, the signal $V_{RBLB}$ is based on the potential $V_{L1}$. Specifically, when the potential of the signal $V_{RBLB}$ is different from the potential $V_{L1}$, the signal $V_{RBLB}$ is changed in accordance with the potential $V_{L1}$. On the other hand, when the transistor 103 is off, the wirings L1 and RBLB are brought out of conduction, and the potential $V_{L1}$ is not supplied to the wiring RBLB. Thus, the signal $V_{RBLB}$ is not changed.

The transistor 105 has a function of controlling conduction or non-conduction between the nodes N3 and N4. When the transistor 105 is on, the nodes N3 and N4 are brought into conduction. On the other hand, when the transistor 105 is off, the nodes N3 and N4 are brought out of conduction.

The transistors 103 and 105 are described in detail. When the transistor 105 is on, conduction or non-conduction between the wiring L1 and the node N4 is controlled in accordance with the on or off state of the transistor 103. The on or off state of the transistor 103 is controlled by the electric charge $Q_{WBL}$ accumulated in the capacitor 108. Thus, the conduction or non-conduction between the wiring L1 and the node N4 is controlled by the electric charge $Q_{WBL}$ accumulated in the capacitor 108. In other words, the conduction or non-conduction between the wiring L1 and the node N4 is controlled in accordance with the signal $V_{WBL}$. When the transistor 103 is on, the wiring L1 and the node N4 are brought into conduction, and the potential $V_{L1}$ is supplied to the node N4 through the transistors 103 and 105. Then, the potential of the node N4 is based on the potential $V_{L1}$. On the other hand, when the transistor 103 is off, the wiring L1 and the node N4 are brought out of conduction, and the potential $V_{L1}$ is not supplied to the node N4.

The transistor 106 has a function of controlling conduction or non-conduction between the wiring L2 and the node N4. When the transistor 106 is on, the wiring L2 and the node N4 are brought into conduction, and the potential $V_{L2}$ is supplied to the node N4 through the transistor 106. Then, the potential of the node N4 is based on the potential $V_{L2}$. On the other hand, when the transistor 106 is off, the wiring L2 and the node N4 are brought out of conduction, and the potential $V_{L2}$ is not supplied to the node N4.

The transistor 107 has a function of controlling conduction or non-conduction between the wiring L2 and the node N2. The on or off state of the transistor 107 is controlled by the potential of the node N4. When the transistor 107 is on, the wiring L2 and the node N2 are brought into conduction, and the potential $V_{L2}$ is supplied to the node N2 through the transistor 107. Then, the potential of the node N2 is based on the potential $V_{L2}$. On the other hand, when the transistor 107 is off, the wiring L2 and the node N2 are brought out of conduction, and the potential $V_{L2}$ is not supplied to the node N2.

Next, an operation example of the memory cell in FIG. 1 is described. Here, for convenience, the whole period is divided into three periods: a data write period, a data retention period, and a data read period.

Figure 2:
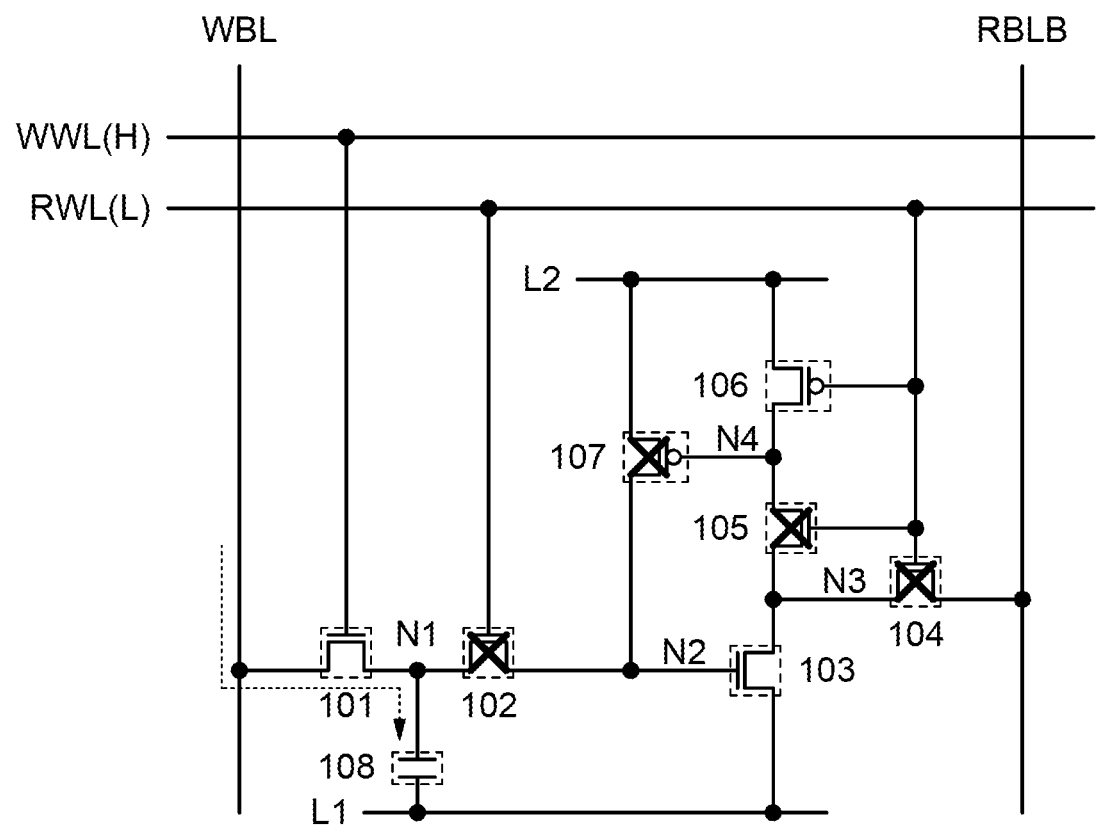
FIG. 2 is an operation schematic diagram illustrating one embodiment of the present invention.

First, operation of the memory cell in the data write period is described with reference to an operation schematic diagram in FIG. 2. In the data write period, the signal $V_{WBL}$ is supplied to the capacitor 108 and the electric charge $Q_{WBL}$ is accumulated in the capacitor 108 to write data. Note that as described above, the electric charge $Q_{WBL}$ is based on the signal $V_{WBL}$. The operation is described in detail below.

In the data write period, the signal $V_{WWL}$ is activated to turn on the transistor 101. When the transistor 101 is turned on, the signal $V_{WBL}$ is supplied to the node N1, the electric charge $Q_{WBL}$ is accumulated in the capacitor 108, and the potential of the node N1 is based on the signal $V_{WBL}$. In this manner, data can be written to the memory cell.

Note that in the data write period, the signal $V_{RWL}$ is deactivated to turn off the transistors 102, 104, and 105 and turn on the transistor 106. When the transistor 106 is turned on, the potential $V_{L2}$ is supplied to the node N4 and the potential of the node N4 is set at a high level. When the potential of the node N4 is set at a high level, the transistor 107 is turned off. In addition, since the transistors 102 and 107 are turned off, the node N2 becomes floating. When the node N2 becomes floating, the potential of the node N2 is not determined, so that the on or off state of the transistor 103 is not determined in many cases.

Figure 3:
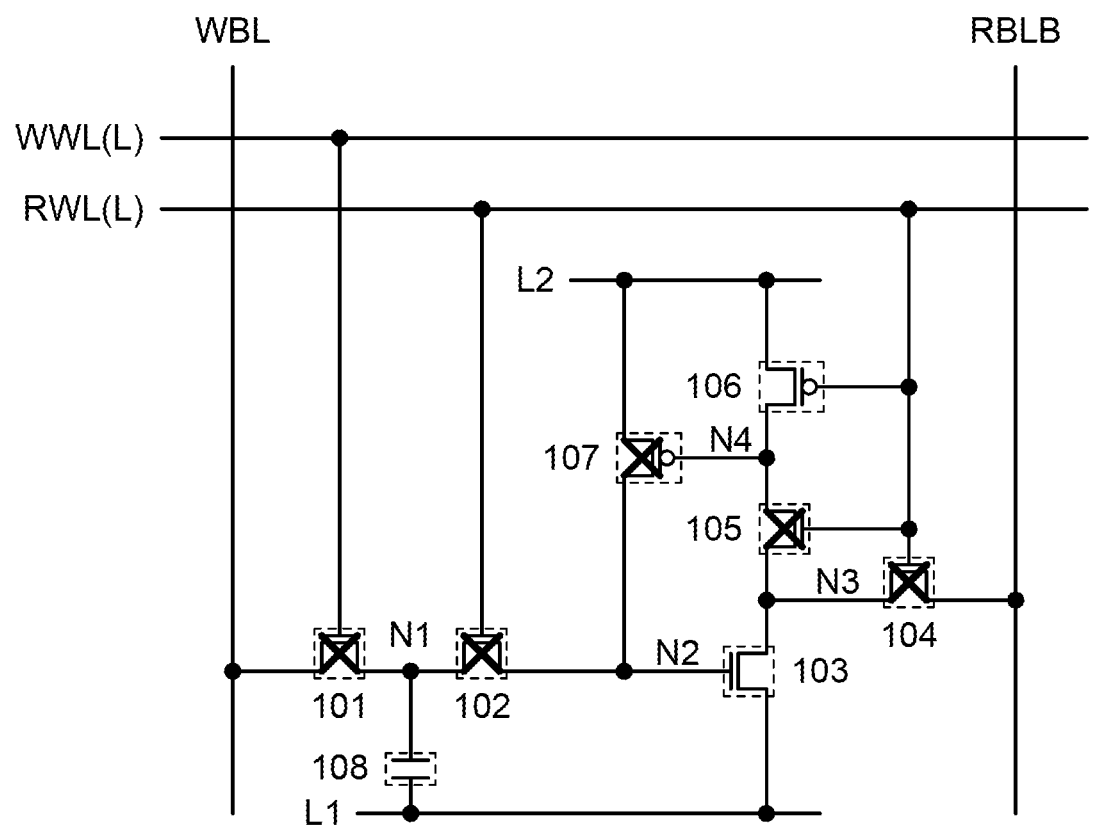
FIG. 3 is an operation schematic diagram illustrating one embodiment of the present invention.

Next, operation of the memory cell in the data retention period is described with reference to an operation schematic diagram in FIG. 3. In the data retention period, the node N1 becomes floating and the electric charge $Q_{WBL}$ is continuously accumulated in the capacitor 108 to retain data. The operation is described in detail below.

In the data retention period, the signals $V_{WWL}$ and $V_{RWL}$ are deactivated to turn off the transistors 101 and 102. When the transistors 101 and 102 are turned off, the node N1 becomes floating. Thus, the electric charge $Q_{WBL}$ is continuously accumulated in the capacitor 108, and the potential of the node N1 remains based on the signal $V_{WBL}$. In this manner, data can be retained in the memory cell.

Note that in the data retention period, the signal $V_{RWL}$ is deactivated to turn off the transistors 104 and 105 and turn on the transistor 106. When the transistor 106 is turned on, the potential $V_{L2}$ is supplied to the node N4 and the potential of the node N4 is set at a high level. When the potential of the node N4 is set at a high level, the transistor 107 is turned off. In addition, since the transistors 102 and 107 are turned off, the node N2 becomes floating. When the node N2 becomes floating, the potential of the node N2 is not determined, so that the on or off state of the transistor 103 is not determined in many cases.

Figure 4:
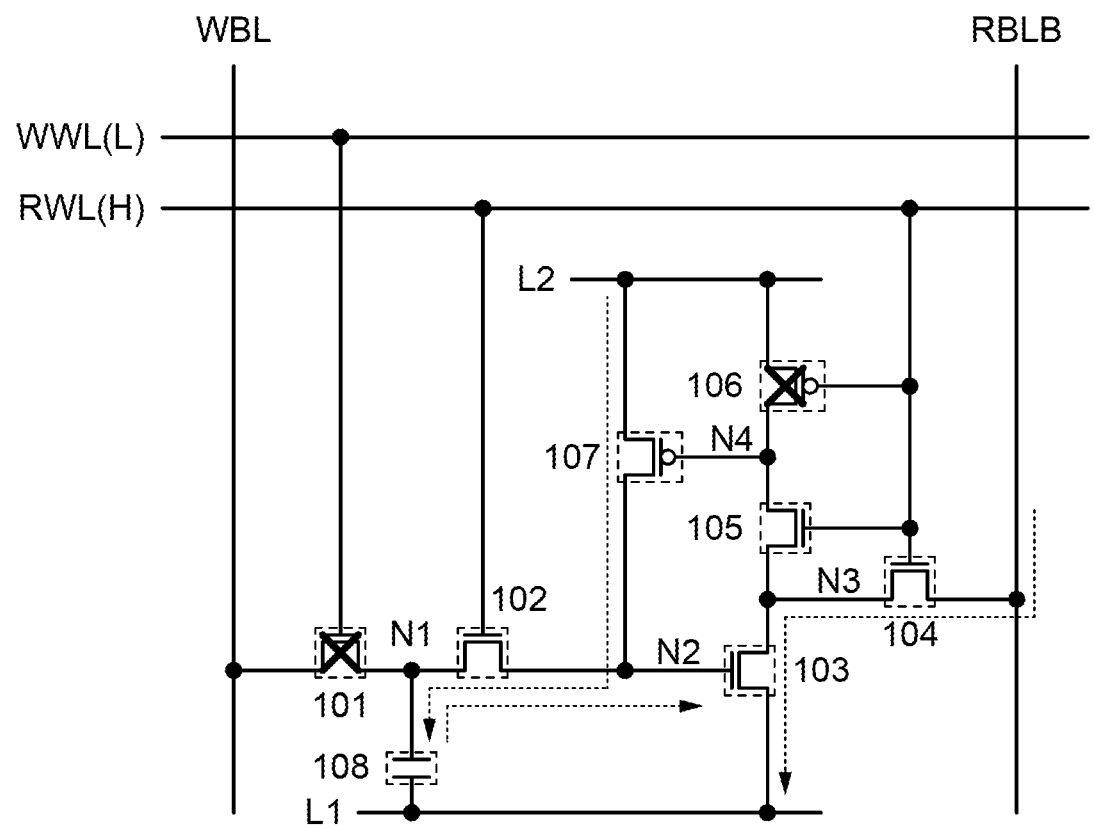
FIG. 4 is an operation schematic diagram illustrating one embodiment of the present invention.
Figure 5:
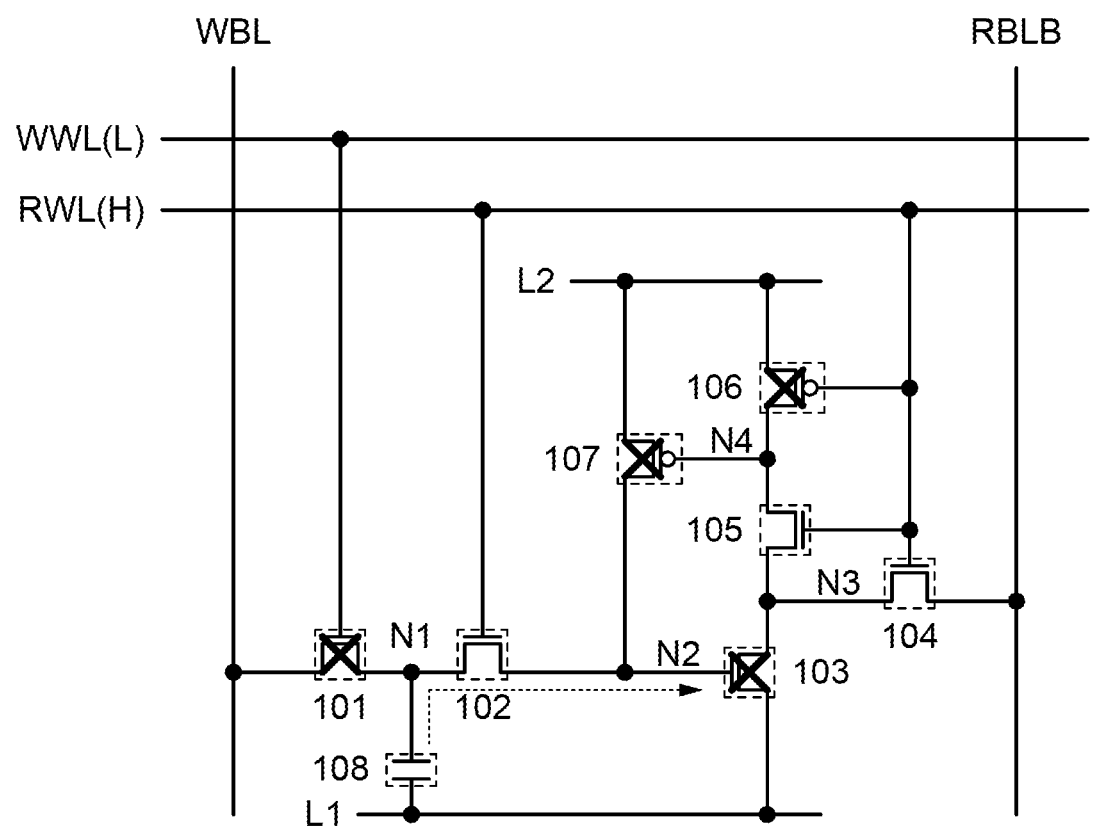
FIG. 5 is an operation schematic diagram illustrating one embodiment of the present invention.

Next, operation of the memory cell in the data read period is described with reference to operation schematic diagrams in FIG. 4 and FIG. 5. In the data read period, the on or off state of the transistor 103 is controlled by the electric charge $Q_{WBL}$ accumulated in the capacitor 108. When the signal $V_{RBLB}$ is controlled in accordance with the on or off state of the transistor 103, data is read. The operation is described in detail below. Note that for convenience, the wiring RBLB is precharged so that the signal $V_{RBLB}$ is set at a high level before data is read from the memory cell.

In the data read period, the signal $V_{RWL}$ is activated to turn on the transistor 102. When the transistor 102 is turned on, the electric charge $Q_{WBL}$ accumulated in the capacitor 108 is supplied to the node N2, and the potential of the node N2 is based on the electric charge $Q_{WBL}$ accumulated in the capacitor 108. The on or off state of the transistor 103 is controlled by the potential of the node N2. In other words, the on or off state of the transistor 103 is controlled by the signal $V_{WBL}$ input to the memory cell in the data write period. Since the signal $V_{RWL}$ is activated, the transistor 104 is turned on. When the transistor 104 is turned on, whether to supply the potential $V_{L1}$ to the wiring RBLB is controlled in accordance with the on or off state of the transistor 103. In addition, the signal $V_{RBLB}$ is controlled depending on whether to supply the potential $V_{L1}$ to the wiring RBLB. In other words, the signal $V_{RBLB}$ is controlled by the signal $V_{WBL}$ input to the memory cell in the data write period. By detecting the signal $V_{RBLB}$, the value of data read can be determined. In this manner, data can be read from the memory cell. For example, when electric charge based on the signal $V_{WBL}$ at a high level is accumulated in the capacitor 108, the node N2 is set at a high level, so that the transistor 103 is turned on. When the transistor 103 is turned on, the potential $V_{L1}$ is supplied to the wiring RBLB, so that the signal $V_{RBLB}$ is set at a low level. Thus, when the detected signal $V_{RBLB}$ is at a low level, it can be determined that the value of data retained in the memory cell is based on the signal $V_{WBL}$ at a high level (see FIG. 4). On the other hand, when electric charge based on the signal $V_{WBL}$ at a low level is accumulated in the capacitor 108, the node N2 is set at a low level, so that the transistor 103 is turned off. When the transistor 103 is turned off, the potential $V_{L1}$ is not supplied to the wiring RBLB, so that the signal $V_{RBLB}$ remains at a high level. Thus, when the detected signal $V_{RBLB}$ is at a high level, it can be determined that the value of data retained in the memory cell is based on the signal $V_{WBL}$ at a low level (see FIG. 5).

In the data read period, the signal $V_{RWL}$ is activated to turn on the transistor 105 and turn off the transistor 106. When the transistor 105 is turned on, whether to supply the potential $V_{L1}$ to the node N4 is controlled in accordance with the on or off state of the transistor 103. In addition, the potential of the node N4 is controlled depending on whether to supply the potential $V_{L1}$ to the node N4, and the on or off state of the transistor 107 is controlled by the potential of the node N4. Furthermore, since the transistor 102 is on, whether to supply the potential $V_{L2}$ to the capacitor 108 is controlled in accordance with the on or off state of the transistor 107. For example, when electric charge based on the signal $V_{WBL}$ at a high level is accumulated in the capacitor 108, the node N2 is set at a high level, so that the transistor 103 is turned on. When the transistor 103 is turned on, the potential $V_{L1}$ is supplied to the node N4 to set the node N4 at a low level, so that the transistor 107 is turned on. When the transistor 107 is turned on, the potential $V_{L2}$ is supplied to the capacitor 108. In this manner, electric charge can be stored in the capacitor 108 (see FIG. 4). On the other hand, when electric charge based on the signal $V_{WBL}$ at a low level is accumulated in the capacitor 108, the node N2 is set at a low level, so that the transistor 103 is turned off. When the transistor 103 is turned off, the potential $V_{L1}$ is not supplied to the node N4 and the node N4 is set at a high level, so that the transistor 107 is turned off. When the transistor 107 is turned off, the potential $V_{L2}$ is not supplied to the capacitor 108 (see FIG. 5).

Note that in the data read period, the signal $V_{WWL}$ is deactivated to turn off the transistor 101.

As described above, in the memory cell in FIG. 1, data is written by supply of the signal $V_{WBL}$ to the capacitor 108, and data is retained by accumulation of the electric charge $Q_{WBL}$ in the capacitor 108. The on or off state of the transistor 103 is controlled by the electric charge $Q_{WBL}$ accumulated in the capacitor 108, and the on or off state of the transistor 103 is controlled in accordance with the on or off state of the transistor 103. The data is read by detecting the signal $V_{RBLB}$.

Next, effects of the memory cell in FIG. 1 are described.

In the memory cell in FIG. 1, the signal $V_{WBL}$ has amplitude voltage low enough to control the on or off state of the transistor 103; thus, the amplitude voltage of the signal $V_{WBL}$ can be lowered.

The memory cell in FIG. 1 does not have a problem in that SNMs are decreased by variations in the threshold voltage of the transistors; thus, power supply voltage can be lowered.

Since the memory cell in FIG. 1 does not have a problem in that SNMs are decreased by variations in the threshold voltage of the transistors, scaled down transistors can be used. Consequently, the memory cell size can be reduced.

In the memory cell in FIG. 1, the electric charge $Q_{WBL}$ accumulated in the capacitor 108 is not directly moved to the wiring RBLB; thus, loss of the electric charge accumulated in the capacitor 108 due to data reading can be prevented. In other words, data breakage due to data reading can be prevented.

In the memory cell in FIG. 1, in the case where electric charge based on the signal $V_{WBL}$ at a high level is accumulated in the capacitor 108, the potential $V_{L2}$ can be supplied to the capacitor 108 when data is read. Thus, electric charge can be stored in the capacitor 108. Thus, what is called auto-refresh can be achieved.

Note that in the memory cell in FIG. 1, the amplitude voltage of the signal $V_{WBL}$ can be lowered and a decrease in electric charge accumulated in the capacitor 108 due to data reading can be inhibited. In contrast, in a memory that retains data by using a CMOS circuit, such as an SRAM, lowering signal amplitude voltage or power supply voltage is difficult because signal amplitude voltage needs to be at least larger than the sum of the absolute value of the threshold voltage of a p-channel transistor and the threshold voltage of an n-channel transistor, though electric charge might not be decreased due to data reading. In addition, in a DRAM-like memory, it may be possible to lower signal amplitude voltage; however, electric charge accumulated in the capacitor 108 at the time of data reading is probably decreased.

Note that in the memory cell in FIG. 1, power supply voltage can be lowered and the transistor size can be reduced. In contrast, in a memory that retains data by using a CMOS circuit, such as an SRAM, SNMs are decreased by variations in the threshold voltage of transistors; thus, lowering power supply voltage and reducing the transistor size are difficult.

Next, the functions of the transistors 101 to 107 and the capacitor 108 are described in consideration of the operation of the memory cell in FIG. 1.

The transistor 101 has a function of supplying the signal $V_{WBL}$ to the capacitor 108. The capacitor 108 has a function of accumulating electric charge based on the signal $V_{WBL}$. The transistor 102 has a function of supplying electric charge based on the signal $V_{WBL}$ that is accumulated in the capacitor 108 to the gate of the transistor 103. The transistor 103 has a function of supplying the potential $V_{L1}$ to the wiring RBLB through the transistor 104 and a function of supplying the potential $V_{L1}$ to the gate of the transistor 107 through the transistor 105. The transistor 106 has a function of supplying the potential $V_{L2}$ to the gate of the transistor 107. The transistor 107 has a function of supplying the potential $V_{L2}$ to the capacitor 108 through the transistor 102.

Next, a preferred example of the memory cell in FIG. 1 is described.

As the off-state current of the transistors 101 and 102 becomes lower, a decrease in electric charge in the capacitor 108 in the data retention period can be inhibited, and the data retention time can be prolonged. Thus, it is preferable to use a transistor that has extremely low off-state current and includes an oxide semiconductor (OS) in a semiconductor layer (such a transistor is also referred to as an OS transistor) as the transistor 101. In addition, it is preferable to use an OS transistor that has extremely low off-state current as the transistor 102.

As the off-state current of the transistor 105 becomes lower, current flowing between the wirings L1 and L2 in the data write period and the data retention period can be reduced, so that power consumption can be reduced. In other words, standby current can be reduced, so that power consumption can be reduced. Thus, it is preferable to use an OS transistor that has extremely low off-state current as the transistor 105.

As the current supply capabilities of the transistors 103 and 104 become higher, data read speed can be increased. Thus, it is preferable to use a transistor that includes silicon (Si) in a semiconductor layer (such a transistor is also referred to as a Si transistor) as the transistor 103. In addition, it is preferable to use a Si transistor as the transistor 104.

Forming a p-channel Si transistor is easier than forming a p-channel OS transistor. Thus, in the case where the transistors 106 and 107 are p-channel transistors, it is preferable to use a Si transistor as the transistor 106. In addition, it is preferable to use a Si transistor as the transistor 107. Consequently, yield can be improved.

By stacking a Si transistor and an OS transistor, the memory cell size can be reduced. An example of a stack of a Si transistor and an OS transistor is a structure in which at least an insulating layer is provided between a channel formation region of a Si transistor and a channel formation region of an OS transistor.

The transistor 107 has current supply capability high enough to terminate accumulation of electric charge based on the potential $V_{L2}$ in the capacitor 108 by the end of the data read period and does not need to have high current supply capability. Furthermore, even when the transistor 107 has high current supply capability, data write speed, data read speed, data retention characteristics, and the like are not improved greatly. On the other hand, as the current supply capabilities of the transistors 103 and 104 become higher, the data read speed can be increased. Thus, channel width W/channel length L of the transistor 107 is preferably smaller than W/L of the transistor 103. Furthermore, W/L of the transistor 107 is preferably smaller than W/L of the transistor 104. In this manner, the memory cell size can be reduced by decreasing W/L of the transistor 107 and the data write speed can be increased by increasing W/L of the transistor 103 or 104.

The transistor 106 has current supply capability high enough to maintain the potential of the node N4 in the data retention period and does not need to have high current supply capability. Furthermore, even when the transistor 106 has high current supply capability, the data write speed, the data read speed, the data retention characteristics, and the like are not improved greatly. On the other hand, as the current supply capabilities of the transistors 103 and 104 become higher, the data read speed can be increased. Thus, W/L of the transistor 106 is preferably smaller than W/L of the transistor 103. Furthermore, W/L of the transistor 106 is preferably smaller than W/L of the transistor 104. In this manner, the memory cell size can be reduced by decreasing W/L of the transistor 106 and the data write speed can be increased by increasing W/L of the transistor 103 or 104.

As described above, the transistors 106 and 107 do not need to have high current supply capabilities. However, the transistor 107 needs to have current supply capability high enough to terminate accumulation of electric charge based on the potential $V_{L2}$ in the capacitor 108 by the end of the data read period. Thus, W/L of the transistor 106 is preferably smaller than W/L of the transistor 107. In this manner, the memory cell size can be reduced by decreasing W/L of the transistor 106 and the data read period can be shortened by increasing W/L of the transistor 107.

The transistor 105 has current supply capability high enough to set the potential of the node N4 to a potential at which the transistor 107 is turned on in the data read period and does not need to have high current supply capability. On the other hand, as the current supply capability of the transistor 101 becomes higher, the data write speed can be increased. Furthermore, as the current supply capability of the transistor 102 becomes higher, the data read speed can be increased. Thus, W/L of the transistor 105 is preferably smaller than W/L of the transistor 101. Furthermore, W/L of the transistor 105 is preferably smaller than W/L of the transistor 102. In this manner, the memory cell size can be reduced by decreasing W/L of the transistor 105 and the data write speed can be increased by increasing W/L of the transistor 101. Furthermore, the memory cell size can be reduced by decreasing W/L of the transistor 105 and the data read speed can be increased by increasing W/L of the transistor 102.

In the data read period, the signal $V_{RBLB}$ is supplied to the node N4 through the transistors 104 and 105 in some cases. Thus, it is preferable to set the high level of the signal $V_{RBLB}$ to a level at which the transistor 107 is not turned on.

A conductive layer that includes a region serving as one of a source electrode and a drain electrode of the transistor 101 (the second terminal of the transistor 101) preferably includes a region serving as one of a source electrode and a drain electrode of the transistor 102 (the first terminal of the transistor 102). Accordingly, reduction in layout area can be achieved.

Next, the structure of the semiconductor storage device is described with reference to a circuit diagram of the semiconductor storage device in FIG. 6.

Figure 6:
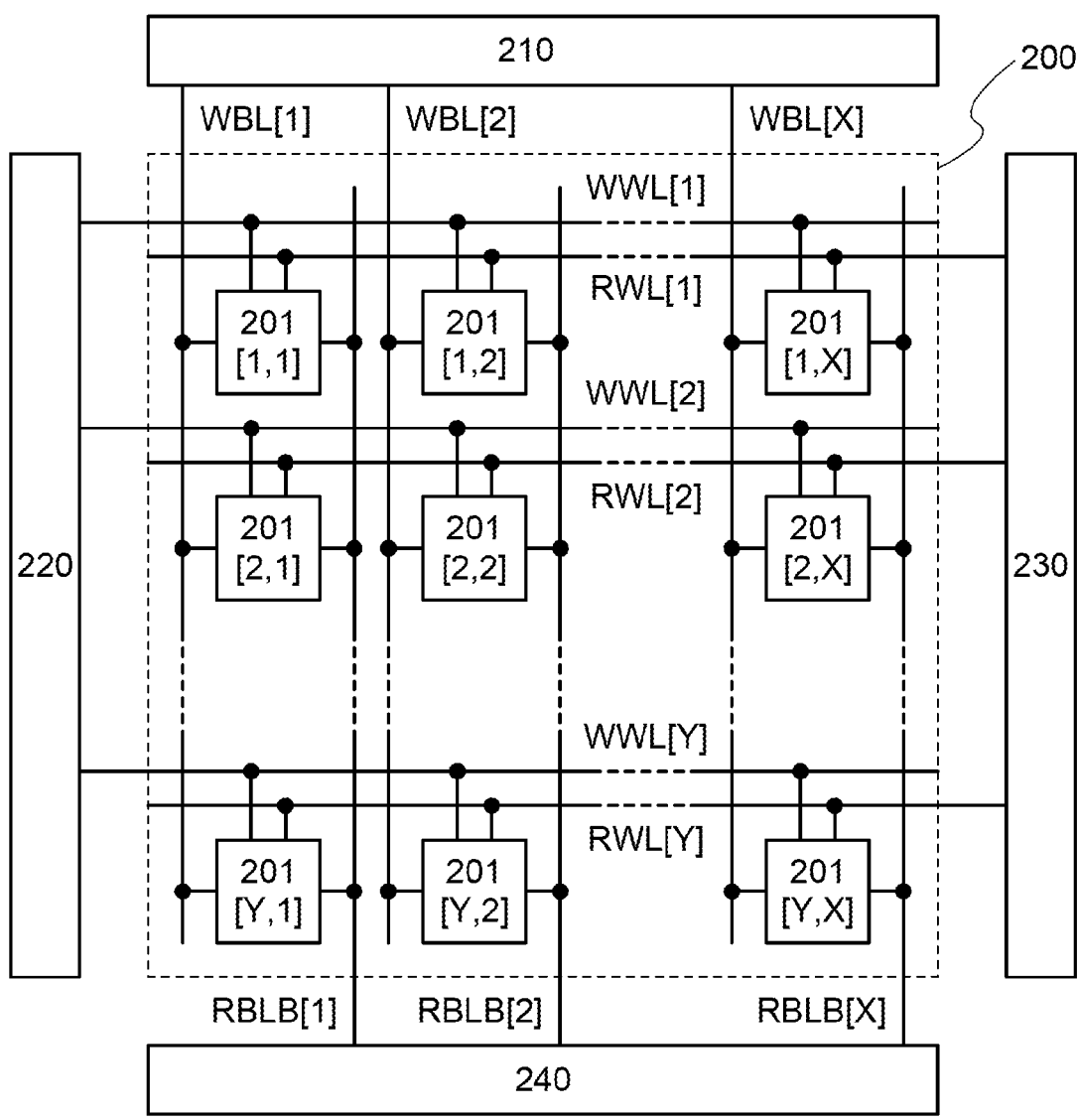
FIG. 6 is circuit diagram illustrating one embodiment of the present invention.

The semiconductor storage device in FIG. 6 includes a memory cell array 200, a WBL driver circuit 210, a WWL driver circuit 220, an RWL driver circuit 230, and an RBLB driver circuit 240. The memory cell array 200 includes memory cells 201 (memory cells 201[1,1] to 201[Y,X]) arranged in Y rows (Y is a natural number) and X columns (X is a natural number).

The WBL driver circuit 210 is connected to X wirings WBL (wirings WBL[1] to WBL[X]). The WWL driver circuit 220 is connected to Y wirings WWL (wirings WWL[1] to WWL[Y]). The RWL driver circuit 230 is connected to Y wirings RWL (wirings RWL[1] to RWL[Y]). The RBLB driver circuit 240 is connected to X wirings RBLB (wirings RBLB[1] to RBLB [X]). The memory cells 201[1,1] to 201[Y,X] are each connected to one of the wirings WBL[1] to WBL[X], one of the wirings WWL[1] to WWL[Y], one of the wirings RWL[1] to RWL[Y], and one of the wirings RBLB[1] to RBLB[X]. For example, the memory cell 201 (memory cell 201[i,j]) in an i-th row (i is any one of 1 to Y) and a j-th column (j is any one of 1 to X) is connected to a j-th wiring WBL (wiring WBL[j], an i-th wiring WWL (wiring WWL[i]), an i-th wiring RWL (wiring RWL[i]), and a j-th wiring RBLB (wiring RBLB[j]).

The memory cell in FIG. 1 can be used as each of the memory cells 201[1,1] to 201[Y,X]. When the memory cell in FIG. 1 is used as each of the memory cells 201[1,1] to 201[Y,X], each of the wirings WBL[1] to WBL[X] corresponds to the wiring WBL of the memory cell in FIG. 1. Each of the wirings WWL[1] to WWL[Y] corresponds to the wiring WWL of the memory cell in FIG. 1. Each of the wirings RWL[1] to RWL[Y] corresponds to the wiring RWL of the memory cell in FIG. 1. Each of the wirings RBLB[1] to RBLB[X] corresponds to the wiring RBLB of the memory cell in FIG. 1.

The WBL driver circuit 210 has a function of outputting signals $V_{WBL}[1]$ to $V_{WBL}[X]$ to the wirings WBL[1] to WBL[X], respectively. For example, the WBL driver circuit 210 outputs the signal $V_{WBL}[j]$ to the wiring WBL[j]. Each of the signals $V_{WBL}[1]$ to $V_{WBL}[X]$ corresponds to the signal $V_{WBL}$ of the memory cell in FIG. 1.

The WWL driver circuit 220 has a function of outputting signals $V_{WWL}[1]$ to $V_{WWL}[Y]$ to the wirings WWL[1] to WWL[Y], respectively. For example, the WWL driver circuit 220 outputs the signal $V_{WWL}[j]$ to the wiring WWL[j]. Each of the signals $V_{WWL}[1]$ to $V_{WWL}[Y]$ corresponds to the signal $V_{WWL}$ of the memory cell in FIG. 1.

The RWL driver circuit 230 has a function of outputting signals $V_{RWL}[1]$ to $V_{RWL}[Y]$ to the wirings RWL[1] to RWL[Y], respectively. For example, the RWL driver circuit 230 outputs the signal $V_{RWL}[j]$ to the wiring RWL[j]. Each of the signals $V_{RWL}[1]$ to $V_{RWL}[Y]$ corresponds to the signal $V_{RWL}$ of the memory cell in FIG. 1.

The RBLB driver circuit 240 has a function of detecting signals $V_{RBLB}[1]$ to $V_{RBLB}[X]$ from the wirings RBLB[1] to RBLB[X], respectively. For example, the RBLB driver circuit 240 detects the signal $V_{RBLB}[j]$ from the wiring RBLB[j]. The RBLB driver circuit 240 also has a function of precharging the wirings RBLB[1] to RBLB[X] so that each of the signals $V_{RBLB}[1]$ to $V_{RBLB}[X]$ is set at a high level. For example, the RBLB driver circuit 240 has a function of precharging the wiring RBLB[j] so that the signal $V_{RBLB}[j]$ is set at a high level. Each of the signals $V_{RBLB}[1]$ to $V_{RBLB}[X]$ corresponds to the signal $V_{RBLB}$ of the memory cell in FIG. 1.

Figure 7:
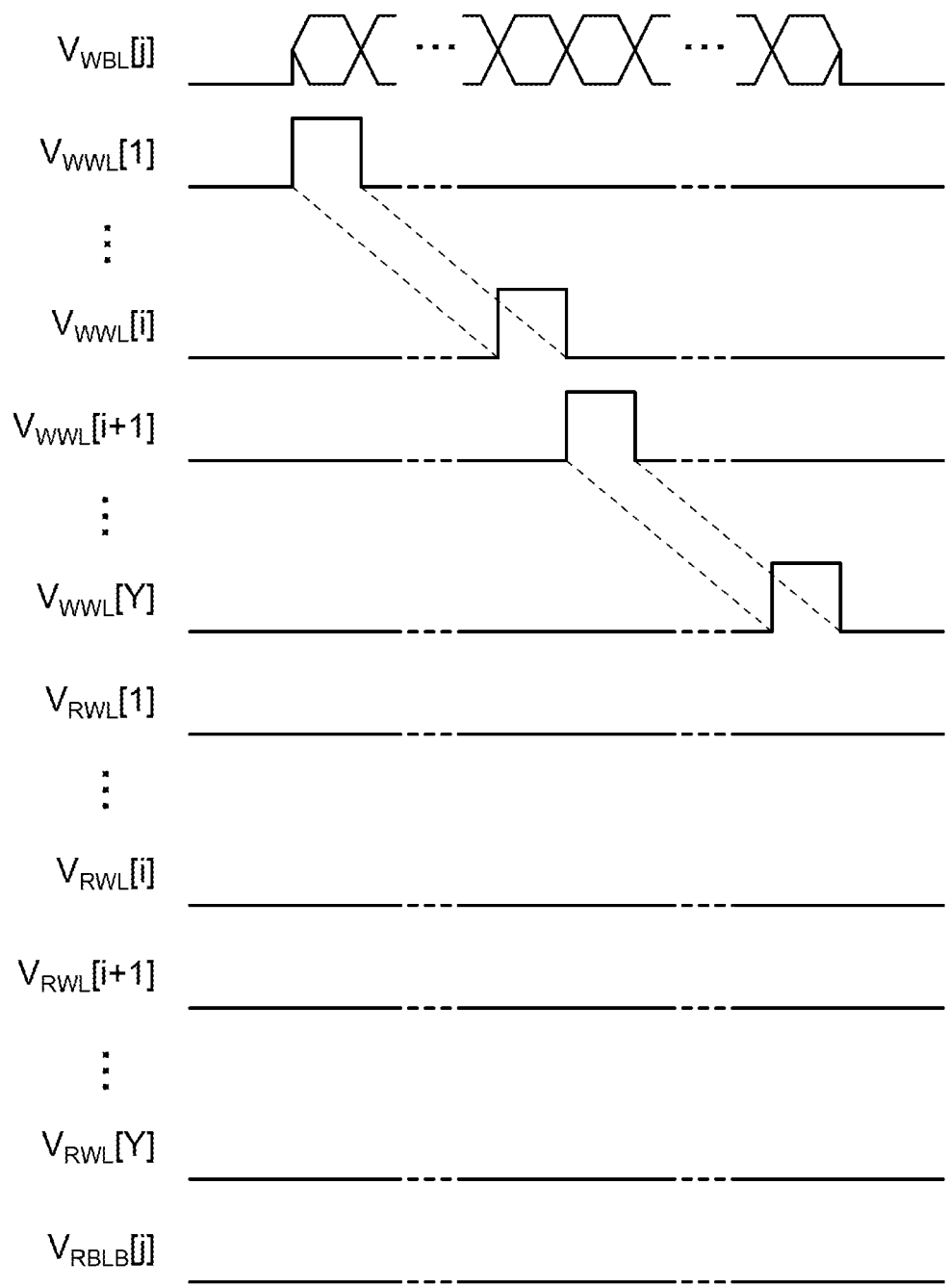
FIG. 7 is a timing chart illustrating one embodiment of the present invention.
Figure 8:
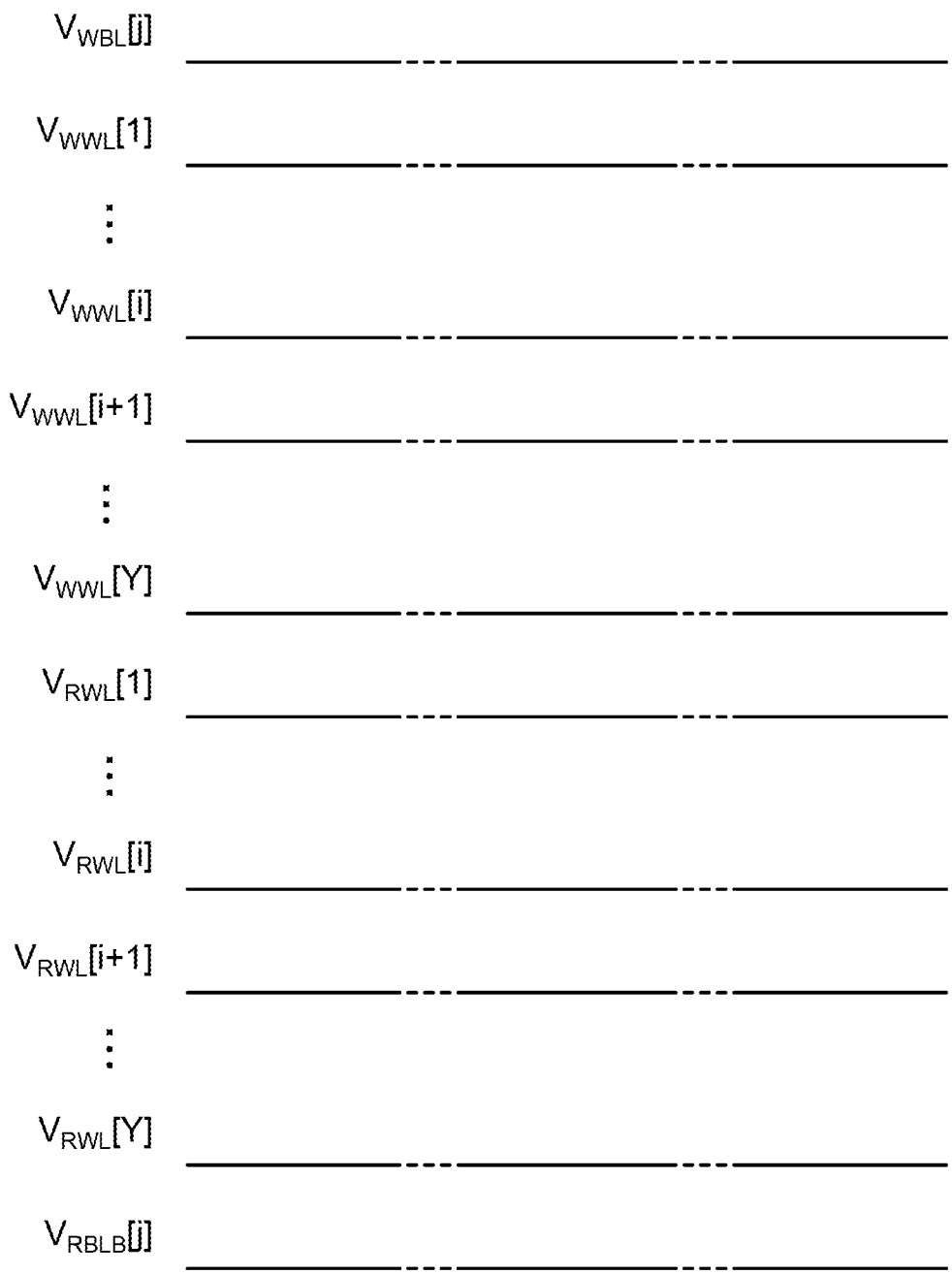
FIG. 8 is a timing chart illustrating one embodiment of the present invention.
Figure 9:
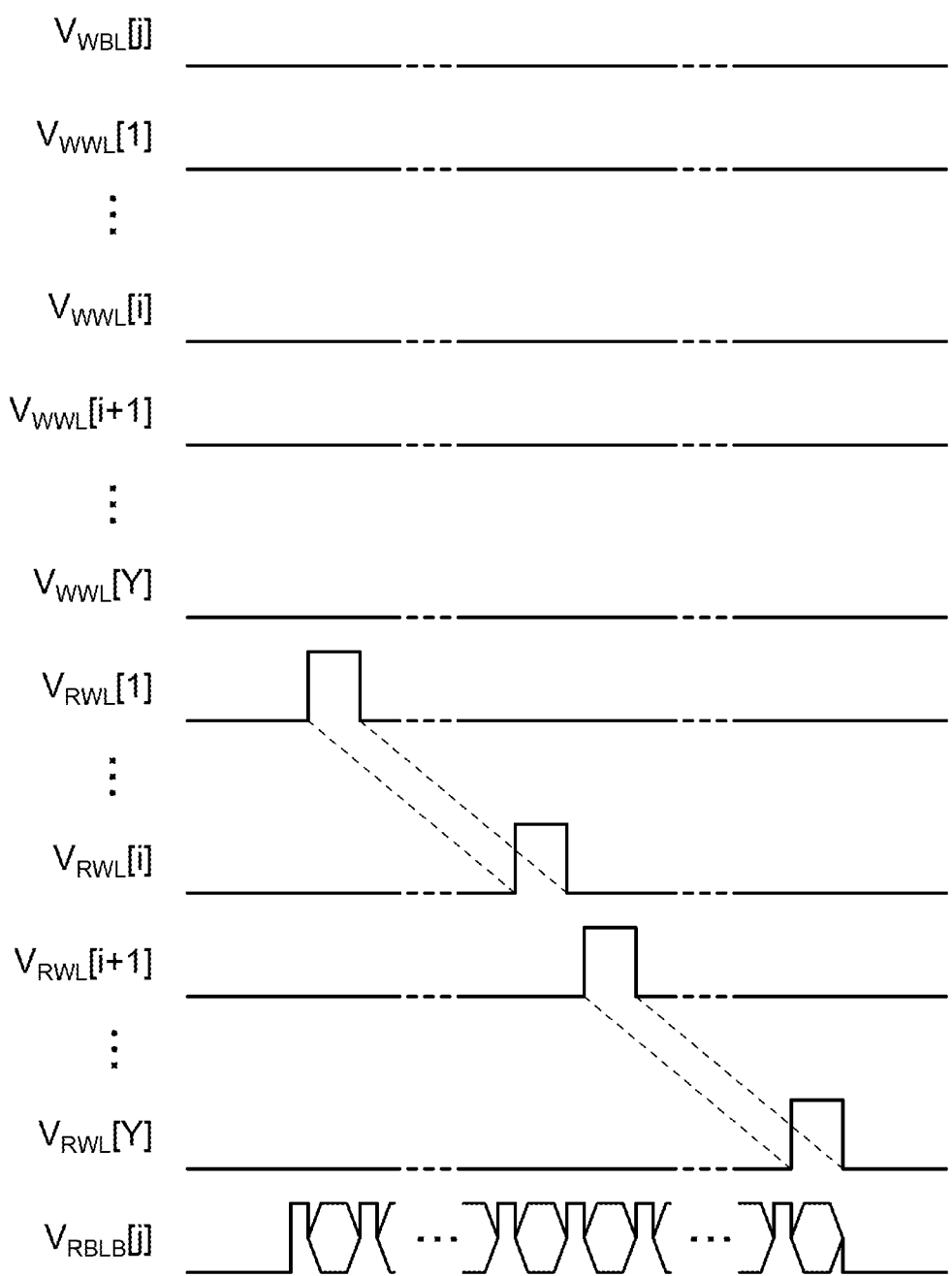
FIG. 9 is a timing chart illustrating one embodiment of the present invention.

Next, an operation example of the semiconductor storage device in FIG. 6 is described with reference to FIG. 7, FIG. 8, and FIG. 9. FIG. 7 is a timing chart in a period during which data is written to each of the memory cells 201[1,1] to 201[Y,X]. FIG. 8 is a timing chart in a period during which data is retained in each of the memory cells 201[1,1] to 201[Y,X]. FIG. 9 is a timing chart in a period during which data is read from each of the memory cells 201[1,1] to 201[Y,X]. Here, for convenience, the whole period is divided into three periods: a data write period, a data retention period, and a data read period.

First, the operation of the semiconductor storage device in the data write period is described with reference to the timing chart in FIG. 7.

In the data write period, the memory cells 201[1,1] to 201[Y,X] are sequentially selected row by row from the memory cells 201[1,1] to 201[1,X] by sequentially activating the signals $V_{WWL}[1]$ to $V_{WWL}[Y]$ one by one from the signal $V_{WWL}[1]$. The signals $V_{WBL}[1]$ to $V_{WBL}[X]$ are input to the memory cells 201 in the X columns in the selected row. In this manner, data is written to each of the memory cells 201[1,1] to 201[Y,X]. For example, when the signal $V_{WWL}[i]$ is activated, the memory cells 201[i,1] to 201[i,X] are selected. Then, the signals $V_{WBL}[1]$ to $V_{WBL}[X]$ are input to the memory cells 201[i,1] to 201[i,X], respectively. In this manner, data is written to each of the memory cells 201[i,1] to 201[i,X]. After that, the signal $V_{WWL}[i]$ is deactivated and the signal $V_{WWL}[i+1]$ is activated. Thus, the memory cells 201[i,1] to 201[i,X] are not selected and the memory cells 201[i+1,1] to 201[i+1,X] are selected. Then, the signals $V_{WBL}[1]$ to $V_{WBL}[X]$ are input to the memory cells 201[i+1,1] to 201[i+1,X], respectively. In this manner, data is written to each of the memory cells 201[i+1,1] to 201 [i+1,X].

Note that the signals $V_{RWL}[1]$ to $V_{RWL}[Y]$ are all inactive.

Note that the signals $V_{WWL}[1]$ to $V_{WWL}[Y]$ may be activated one by one in a given order.

Note that some of the signals $V_{WWL}[1]$ to $V_{WWL}[Y]$ may be activated and the other of the signals $V_{WWL}[1]$ to $V_{WWL}[Y]$ may not be activated. In that case, only rows of the memory cells 201 to which data needs to be written (rewritten) among the memory cells 201[1,1] to 201[Y,X] are selected and the other rows are not selected, so that power consumed by data rewriting can be reduced.

Next, the operation of the semiconductor storage device in the data retention period is described with reference to the timing chart in FIG. 8.

In the data retention period, the signals $V_{WWL}[1]$ to $V_{WWL}[Y]$ and the signals $V_{RWL}[1]$ to $V_{RWL}[Y]$ are deactivated. Thus, data is retained in each of the memory cells 201[1,1] to 201[Y,X].

Next, the operation of the semiconductor storage device in the data read period is described with reference to the timing chart in FIG. 9.

In the data read period, the memory cells 201[1,1] to 201[Y,X] are sequentially selected row by row from the memory cells 201[1,1] to 201[1,X] by sequentially activating the signals $V_{RWL}[1]$ to $V_{RWL}[Y]$ one by one from the signal $V_{RWL}[1]$. The signals $V_{RBLB}[1]$ to $V_{RBLB}[X]$ are controlled in accordance with data read from the memory cells 201 in the X columns in the selected row. The RBLB driver circuit 240 detects the signals $V_{RBLB}[1]$ to $V_{RBLB}[X]$ and determines the value of the data read from the memory cells 201 in the X columns in the selected row in accordance with the signals $V_{RBLB}[1]$ to $V_{RBLB}[X]$. In this manner, data is read from the memory cells 201[1,1] to 201[Y,X]. For example, when the signal $V_{RWL}[i]$ is activated, the memory cells 201[i,1] to 201[i,X] are selected. Then, the signals $V_{RBLB}[1]$ to $V_{RBLB}[X]$ are controlled in accordance with data read from the memory cells 201[i,1] to 201[i,X]. The RBLB driver circuit 240 detects the signals $V_{RBLB}[1]$ to $V_{RBLB}[X]$ and determines the value of the data read from the memory cells 201[i,1] to 201[i,X] in accordance with the signals $V_{RBLB}[1]$ to $V_{RBLB}[X]$. After that, the signal $V_{RWL}[i]$ is deactivated and the signal $V_{RWL}[i+1]$ is activated. Thus, the memory cells 201[i,1] to 201[i,X] are not selected and the memory cells 201[i+1,1] to 201[i+1,X] are selected. Then, the signals $V_{RBLB}[1]$ to $V_{RBLB}[X]$ are controlled in accordance with data read from the memory cells 201[i+1,1] to 201[i+1,X]. The RBLB driver circuit 240 detects the signals $V_{RBLB}[1]$ to $V_{RBLB}[X]$ and determines the value of the data read from the memory cells 201[i+1,1] to 201[i+1,X] in accordance with the signals $V_{RBLB}[1]$ to $V_{RBLB}[X]$.

Note that the data read period preferably has a period during which the signals $V_{RWL}[1]$ to $V_{RWL}[Y]$ are all inactive before a period during which any one of the signals $V_{RWL}[1]$ to $V_{RWL}[Y]$ is active. For example, the data read period preferably has a period during which the signal $V_{RWL}[i]$ is active and the signals $V_{RWL}[1]$ to $V_{RWL}[i-1]$ and the signals $V_{RWL}[i+1]$ to $V_{RWL}[Y]$ are inactive, a period during which the signals $V_{RWL}[1]$ to $V_{RWL}[Y]$ are inactive, and a period during which the signal $V_{RWL}[i+1]$ is active and the signals $V_{RWL}[1]$ to $V_{RWL}[i]$ and the signals $V_{RWL}[i+2]$ to $V_{RWL}[Y]$ are inactive. Furthermore, in the period during which the signals $V_{RWL}[1]$ to $V_{RWL}[Y]$ are inactive, the wirings RBLB[1] to RBLB[X] are preferably precharged so that the signals $V_{RBLB}[1]$ to $V_{RBLB}[X]$ are each set at a high level.

Note that the signals $V_{RWL}[1]$ to $V_{RWL}[Y]$ are all inactive.

Note that the signals $V_{RWL}[1]$ to $V_{RWL}[Y]$ may be activated one by one in a given order.

Note that some of the signals $V_{RWL}[1]$ to $V_{RWL}[Y]$ may be activated and the other of the signals $V_{RWL}[1]$ to $V_{RWL}[Y]$ may not be activated. In that case, only rows of the memory cells 201 in which necessary data is retained among the memory cells 201[1,1] to 201[Y,X] are selected and the other rows are not selected, so that power consumed by data reading can be reduced.

The semiconductor storage device in FIG. 6 can have an effect similar to that of the memory cell in FIG. 1 by using the memory cell in FIG. 1.

Note that the description of this embodiment can be combined with description disclosed in this specification and the like, such as another description disclosed in this embodiment and the description of any of the other embodiments, as appropriate.

Embodiment 2

In this embodiment, a memory cell different from the memory cell in Embodiment 1 is described. Note that components in common with those in Embodiment 1 are denoted by the same reference numerals, and description thereof is omitted. In addition, the description of Embodiment 1 can be applied to a memory cell in this embodiment.

Figure 10:
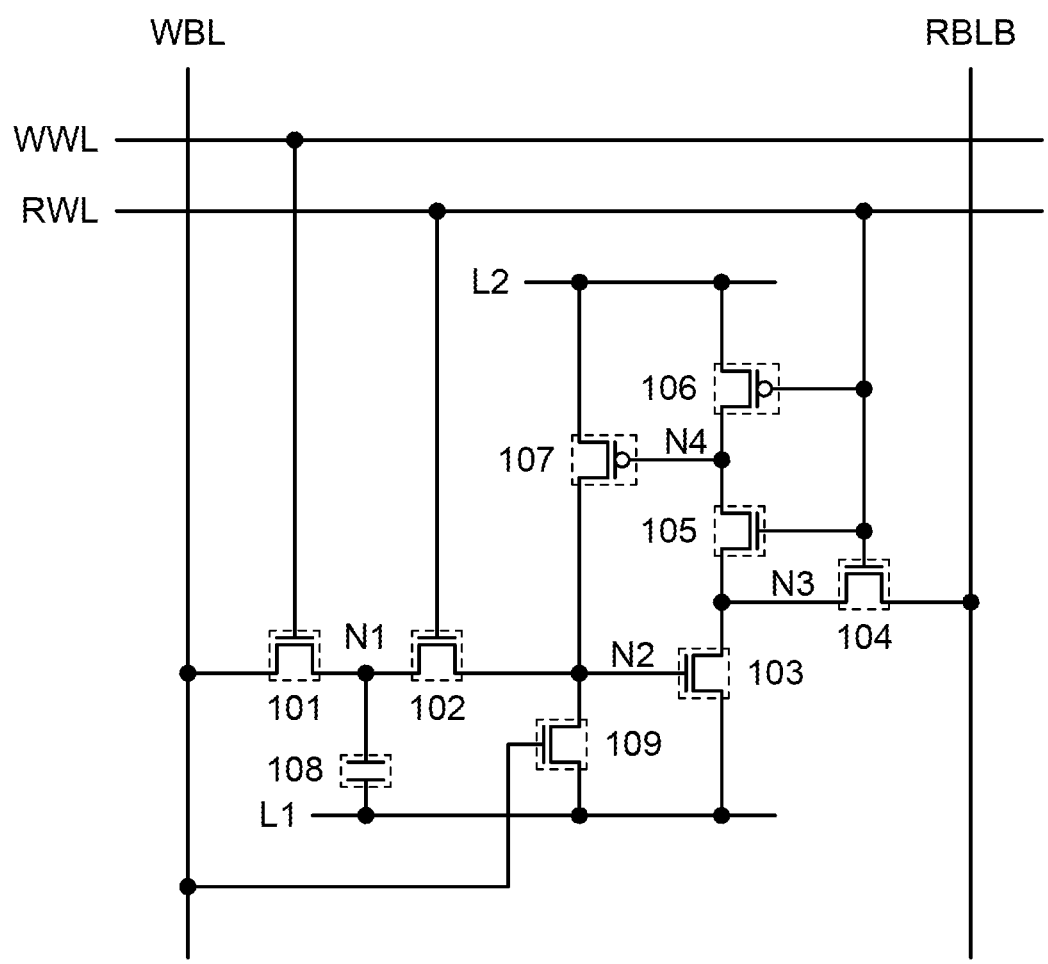
FIG. 10 is a circuit diagram illustrating one embodiment of the present invention.

First, a memory cell in FIG. 10 differs from the memory cell in FIG. 1 in that a transistor 109 whose first terminal is connected to the wiring L1, whose second terminal is connected to the node N2, and whose gate is connected to the wiring WBL is provided. The on or off state of the transistor 109 is controlled by the signal $V_{WBL}$.

An operation example of the memory cell in FIG. 10 is described. Before the start time of a data read period, i.e., in a data write period or a data retention period, to turn on the transistor 109, the signal $V_{WBL}$ is set at a potential (e.g., high level) at which the transistor 109 is turned on. When the transistor 109 is turned on, the potential $V_{L1}$ is supplied to the node N2 and the potential of the node N2 is set at a low level. When the potential of the node N2 is set at a low level, the transistor 103 is turned off. In addition, in the data read period, to turn off the transistor 109, the signal $V_{WBL}$ is set at a potential (e.g., low level) at which the transistor 109 is turned off.

Next, effects of the memory cell in FIG. 10 are described. In the memory cell in FIG. 10, the transistor 103 can be turned off at the start time of the data read period. Thus, even if the transistors 104 and 105 are turned on before the transistor 102 is turned on, malfunction of data rewriting due to supply of the potential $V_{L1}$ to the wiring RBLB or the node N4 regardless of electric charge accumulated in the capacitor 108 can be prevented. In addition, in the memory cell in FIG. 10, the potential of the node N2 can be set at a low level at the start time of the data read period. Thus, in the case where electric charge based on the signal $V_{WBL}$ at a low level is accumulated in the capacitor 108, a decrease in the electric charge due to supply of the electric charge accumulated in the capacitor 108 to the node N2 can be reduced. Note that as described above, in the case where electric charge based on the signal $V_{WBL}$ at a high level is accumulated in the capacitor 108, the electric charge is stored in the capacitor 108.

As the off-state current of the transistor 109 becomes lower, current flowing between the wirings L1 and L2 can be reduced, so that power consumption can be reduced. Thus, it is preferable to use an OS transistor that has extremely low off-state current as the transistor 109.

The transistor 109 has current supply capability high enough to set the potential of the node N2 at a low level before the start time of the data read period and does not need to have high current supply capability. Furthermore, even when the transistor 109 has high current supply capability, data write speed, data read speed, data retention characteristics, and the like are not improved greatly. On the other hand, as the current supply capability of the transistor 101 becomes higher, the data write speed can be increased. Furthermore, as the current supply capability of the transistor 102 becomes higher, the data read speed can be increased. Thus, W/L of the transistor 109 is preferably smaller than W/L of the transistor 101. Furthermore, W/L of the transistor 109 is preferably smaller than W/L of the transistor 102. In this manner, the memory cell size can be reduced by decreasing W/L of the transistor 109 and the data write speed can be increased by increasing W/L of the transistor 101. Furthermore, the memory cell size can be reduced by decreasing W/L of the transistor 109 and the data read speed can be increased by increasing W/L of the transistor 102.

Note that the gate of the transistor 109 may be connected to the wiring WWL. In that case, in the data write period, the transistor 109 is turned on. In addition, in the data retention period and the data read period, the transistor 109 is turned off.

Note that the gate of the transistor 109 may be connected to an unillustrated wiring. The on or off state of the transistor 109 may be controlled by a signal input to the wiring.

Note that the gate of the transistor 109 may be connected to the wiring WWL of a memory cell in the next row. For example, the gate of the transistor 109 of a memory cell in the i-th row may be connected to the wiring WWL in the (i+1)th row.

Note that the gate of the transistor 109 may be connected to the wiring RWL of a memory cell in the previous row. For example, the gate of the transistor 109 of the memory cell in the i-th row may be connected to the wiring RWL in the (i−1)th row. In that case, immediately before the data read period, the potential of the node N2 can be set at a low level, so that the transistor 103 can be turned off.

Figure 11:
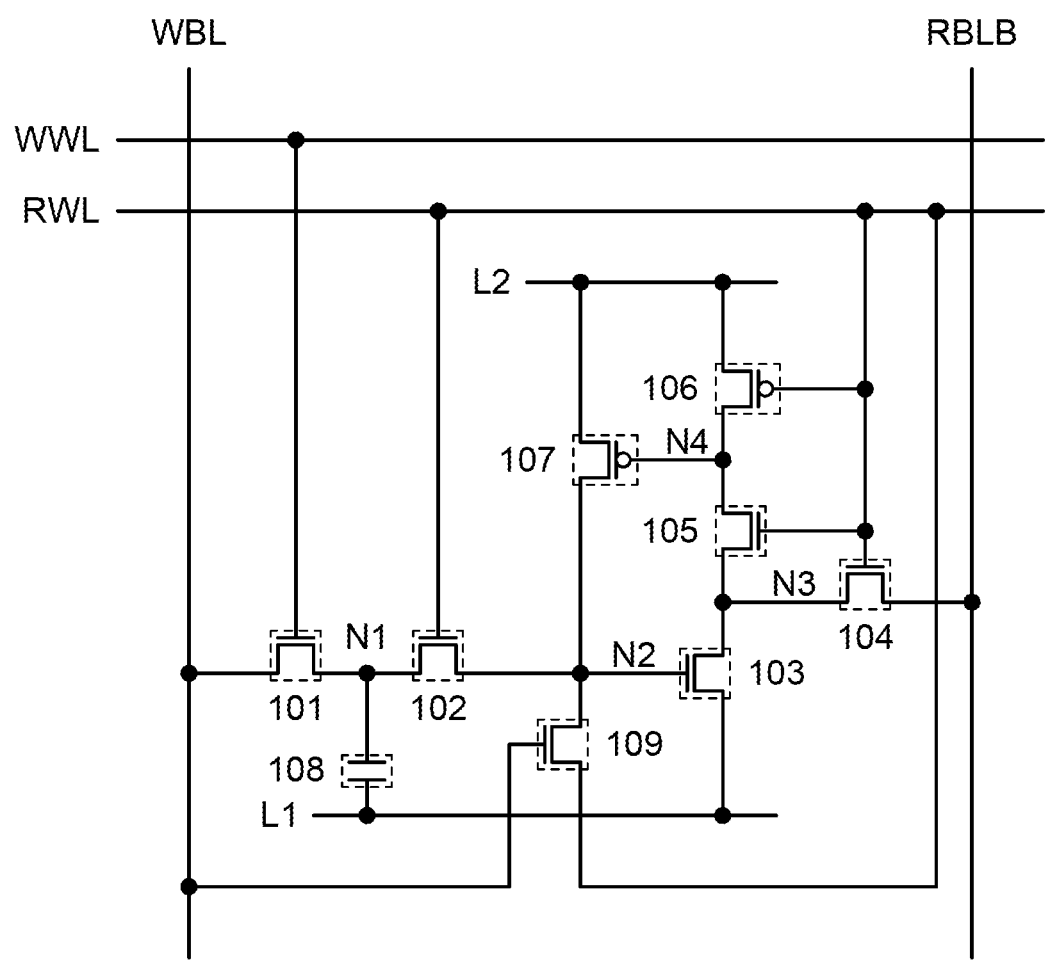
FIG. 11 is a circuit diagram illustrating one embodiment of the present invention.

Next, a memory cell in FIG. 11 differs from the memory cell in FIG. 10 in that the first terminal of the transistor 109 is connected to the wiring RWL.

An operation example of the memory cell in FIG. 11 is described. Before the start time of a data read period, i.e., in a data write period or a data retention period, when the transistor 109 is turned on, the signal $V_{RWL}$ is supplied to the node N2. When the signal $V_{RWL}$ is at a low level, the potential of the node N2 is set at a low level, so that the transistor 103 is turned off. In addition, in the data read period, the signal $V_{RWL}$ is not supplied to the node N2 because the transistor 109 is turned off.

Effects of the memory cell in FIG. 11 are described. The memory cell in FIG. 11 has effects similar to those of the memory cell in FIG. 10.

Figure 12:
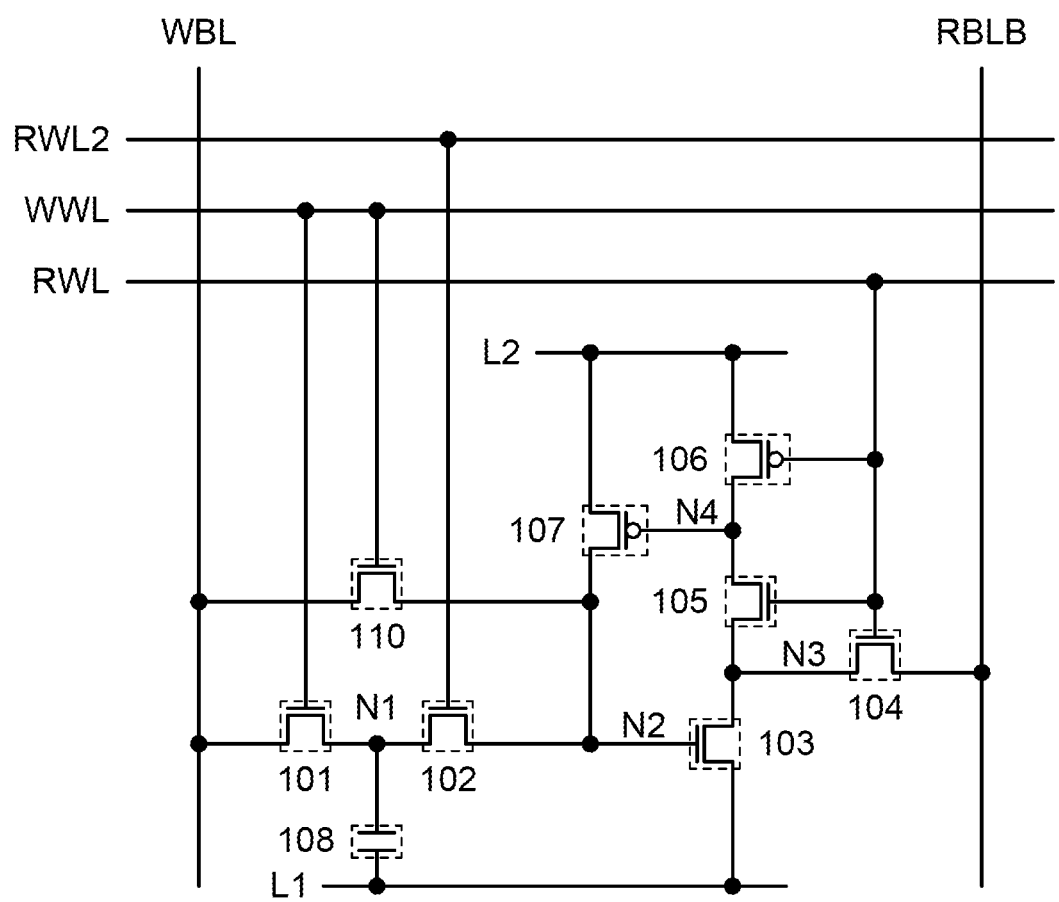
FIG. 12 is a circuit diagram illustrating one embodiment of the present invention.

Next, a memory cell in FIG. 12 differs from the memory cell in FIG. 1 in that a transistor 110 whose first terminal is connected to the wiring WBL, whose second terminal is connected to the node N2, and whose gate is connected to the wiring WWL is provided and that the gate of the transistor 102 is connected to a wiring RWL2. A signal $V_{RWL2}$ is supplied to the wiring RWL2. The signal $V_{RWL2}$ controls the on or off state of the transistor 102 and has two states (active and inactive states). When the signal $V_{RWL2}$ is activated, the transistor 102 is turned on. When the signal $V_{RWL2}$ is deactivated, the transistor 102 is turned off. For convenience, the potential of the signal $V_{RWL2}$ in the active state is referred to as a high level, and the potential of the signal $V_{RWL2}$ in the inactive state is referred to as a low level.

An operation example of the memory cell in FIG. 12 is described. In a data write period, the signals $V_{WWL}$ and $V_{RWL2}$ are activated to turn on the transistors 101, 102, and 110. When the transistors 101, 102, and 110 are turned on, the signal $V_{WBL}$ is supplied to the node N1 through the transistor 101 and is supplied to the node N1 through the transistors 110 and 102, so that electric charge based on the signal $V_{WBL}$ is accumulated in the capacitor 108. In a data retention period, the signals $V_{WWL}$ and $V_{RWL2}$ are deactivated to turn off the transistors 101, 102, and 110. In a data read period, the signal $V_{WWL}$ is deactivated to turn off the transistors 101 and 110. In addition, the signal $V_{RWL2}$ is activated to turn on the transistor 102.

Effects of the memory cell in FIG. 12 are described. The memory cell in FIG. 12 can supply the signal $V_{WBL}$ to the node N1 via a path through the transistor 101 and a path through the transistors 110 and 102. Thus, storing electric charge in the capacitor 108 can be completed quickly, and data write speed can be increased.

When the current supply capability of the transistor 110 is high, the data write speed can be increased. Thus, it is preferable to use a Si transistor as the transistor 110.

On the other hand, as described above, the transistors 106 and 107 do not need to have high current supply capabilities. Thus, W/L of the transistor 110 is preferably larger than W/L of the transistor 106. Furthermore, W/L of the transistor 110 is preferably larger than W/L of the transistor 107. In this manner, the data write speed can be increased by increasing W/L of the transistor 110 and the memory cell size can be reduced by decreasing W/L of the transistors 106 and 107.

Note that when the current supply capability of the transistor 101 is high, the data write speed can be increased. On the other hand, when the current supply capability of the transistor 102 is high, data read speed as well as the data write speed can be increased. Thus, increasing the current supply capability of the transistor 102 prior to the transistor 101 is efficient. Accordingly, W/L of the transistor 102 is preferably larger than W/L of the transistor 101.

Figure 33:
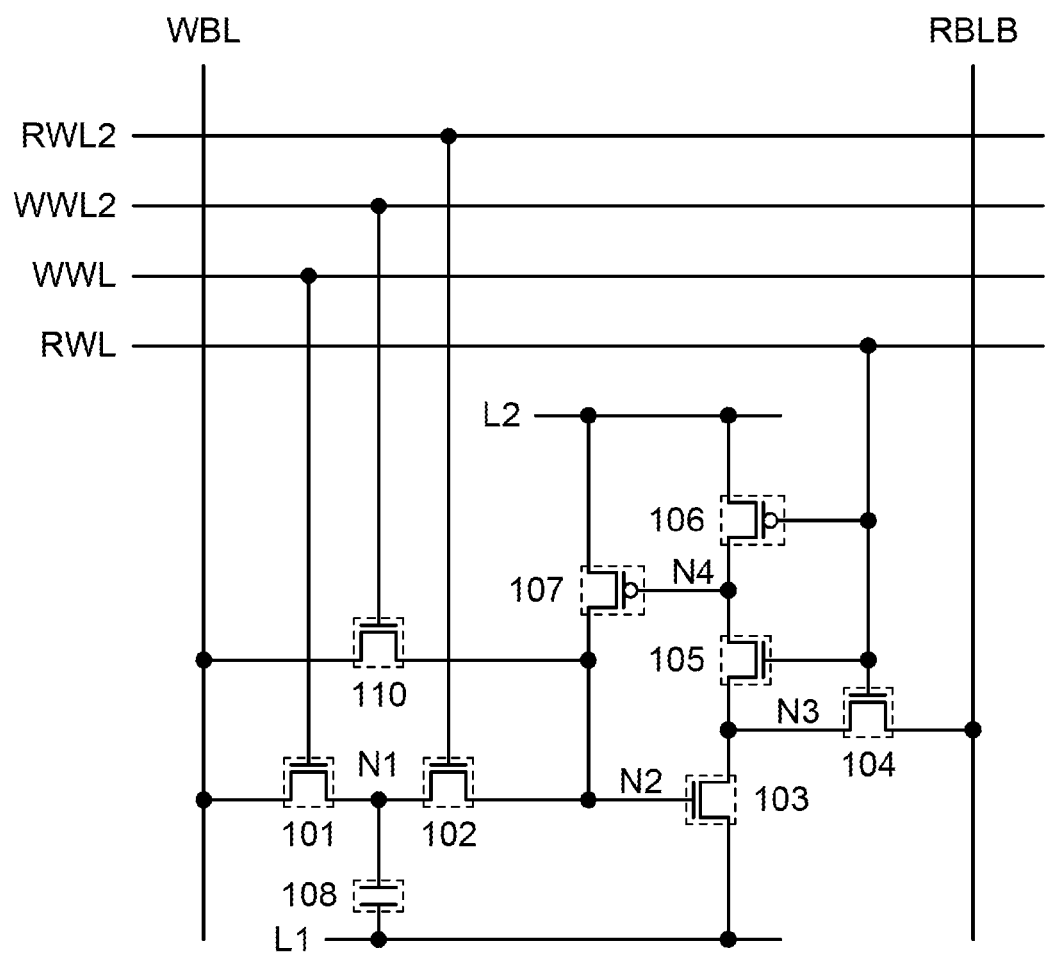
FIG. 33 is a circuit diagram illustrating one embodiment of the present invention.

Next, a memory cell in FIG. 33 differs from the memory cell in FIG. 12 in that the gate of the transistor 110 is connected to a wiring WWL2. A signal $V_{WWL2}$ is supplied to the wiring WWL2. The signal $V_{WWL2}$ controls the on or off state of the transistor 110 and has two states (active and inactive states). When the signal $V_{WWL2}$ is activated, the transistor 110 is turned on. When the signal $V_{WWL2}$ is deactivated, the transistor 110 is turned off. For convenience, the potential of the signal $V_{WWL2}$ in the active state is referred to as a high level, and the potential of the signal $V_{WWL2}$ in the inactive state is referred to as a low level.

An operation example of the memory cell in FIG. 33 is described. In a data write period, the signal $V_{WWL2}$ is activated to turn on the transistor 110. Before the start time of a data read period, i.e., in a data retention period, the signal $V_{WWL2}$ is activated to turn on the transistor 110 and set the signal $V_{WBL}$ at a low level. When the transistor 110 is turned on, the signal $V_{WBL}$ at a low level is supplied to the node N2 and the potential of the node N2 is set at a low level. When the potential of the node N2 is set at a low level, the transistor 103 is turned off. In addition, in the data read period, the signal $V_{WWL2}$ is deactivated to turn off the transistor 110.

Effects of the memory cell in FIG. 33 are described. As in the memory cell in FIG. 10, in the memory cell in FIG. 33, at the start time of a data read period, the potential of the node N2 can be set at a low level and the transistor 103 can be turned off. As in the memory cell in FIG. 12, the memory cell in FIG. 33 can supply the signal $V_{WBL}$ to the node N1 via a path through the transistor 101 and a path through the transistors 110 and 102. In other words, the memory cell in FIG. 33 can have the effects of the memory cells in FIG. 10 and FIG. 12.

Figure 13:
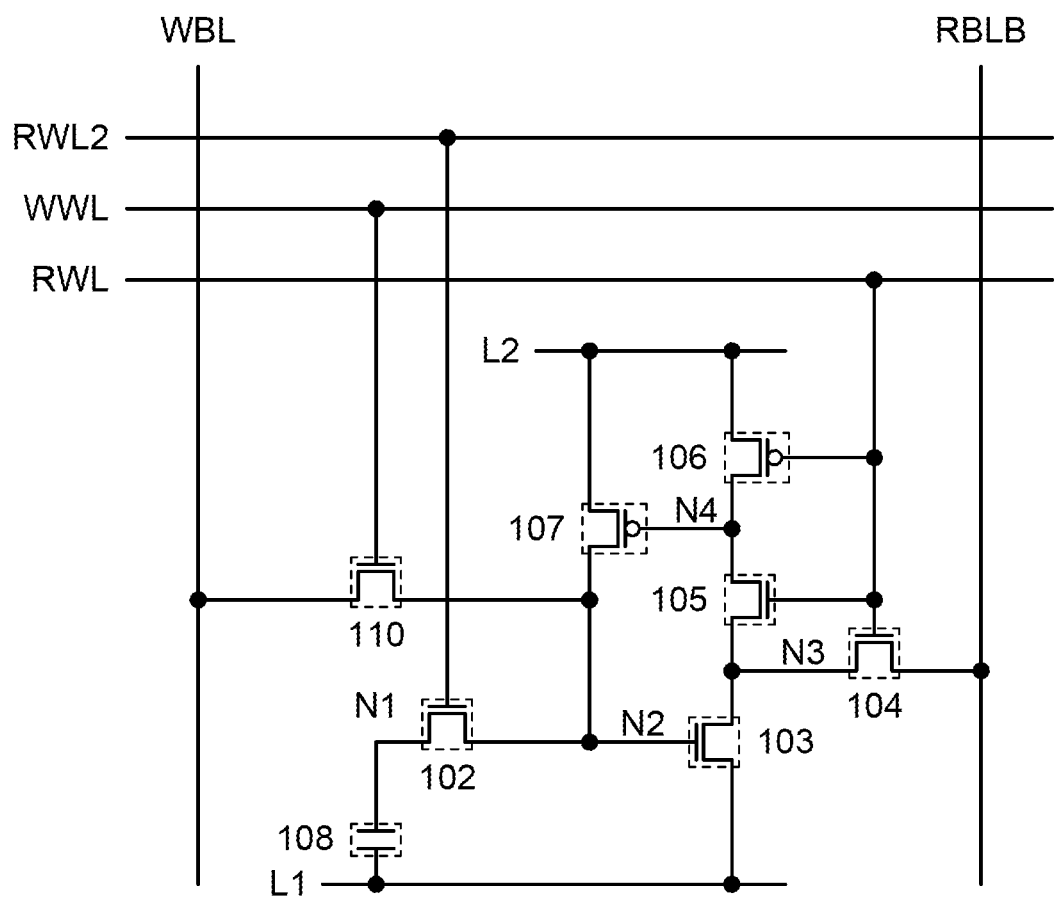
FIG. 13 is a circuit diagram illustrating one embodiment of the present invention.

Next, a memory cell in FIG. 13 differs from the memory cell in FIG. 12 in that the transistor 101 is not provided.

Effects of the memory cell in FIG. 13 are described. Since the memory cell in FIG. 13 does not include the transistor 101, the number of elements can be reduced. Thus, the memory cell size can be reduced.

Figure 14:
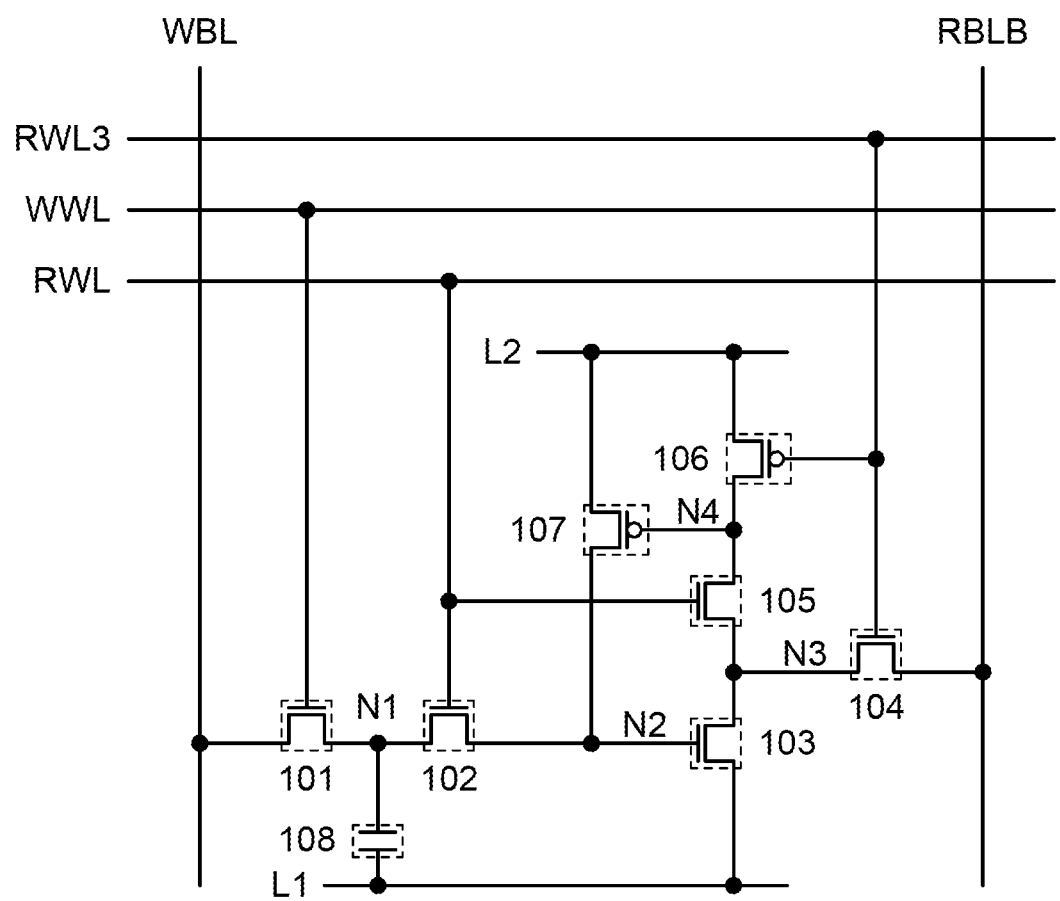
FIG. 14 is a circuit diagram illustrating one embodiment of the present invention.

Next, a memory cell in FIG. 14 differs from the memory cell in FIG. 1 in that the gates of the transistors 104 and 106 are connected to a wiring RWL3. A signal $V_{RWL3}$ is supplied to the wiring RWL3. The signal $V_{RWL3}$ controls the on or off state of each of the transistors 104 and 106 and has two states (active and inactive states). When the signal $V_{RWL3}$ is activated, the transistor 104 is turned on and the transistor 106 is turned off. When the signal $V_{RWL3}$ is deactivated, the transistor 104 is turned off and the transistor 106 is turned on. For convenience, the potential of the signal $V_{RWL3}$ in the active state is referred to as a high level, and the potential of the signal $V_{RWL3}$ in the inactive state is referred to as a low level.

An operation example of the memory cell in FIG. 14 is described. In a data write period and a data retention period, the signal $V_{RWL3}$ is deactivated to turn off the transistor 104 and turn on the transistor 106. In a data read period, the signal $V_{RWL3}$ is activated to turn on the transistor 104 and turn off the transistor 106. In other words, the operation of the memory cell in FIG. 14 is the same as that of the memory cell in FIG. 1.

Effects of the memory cell in FIG. 14 are described. The memory cell in FIG. 14 can separate a signal that controls the on or off state of each of the transistors 102 and 105 from the signal that controls the on or off state of each of the transistors 104 and 106. Thus, in the data read period, after the transistors 102 and 105 are turned on, the transistor 104 can be turned on and the transistor 106 can be turned off. Accordingly, malfunction of data rewriting due to supply of the potential $V_{L1}$ to the wiring RBLB or the node N4 regardless of electric charge accumulated in the capacitor 108 can be prevented. The memory cell in FIG. 14 is effective when OS transistors are used as the transistors 102 and 105 and Si transistors are used as the transistors 104 and 106. This is because the amplitude voltage of a signal required to control the on or off state of the Si transistor can be lower than the amplitude voltage of a signal required to control the on or off state of the OS transistor. Consequently, the amplitude voltage of the signal $V_{RWL3}$ can be lower than the amplitude voltage of the signal $V_{RWL}$, so that power consumption can be reduced.

Figure 15:
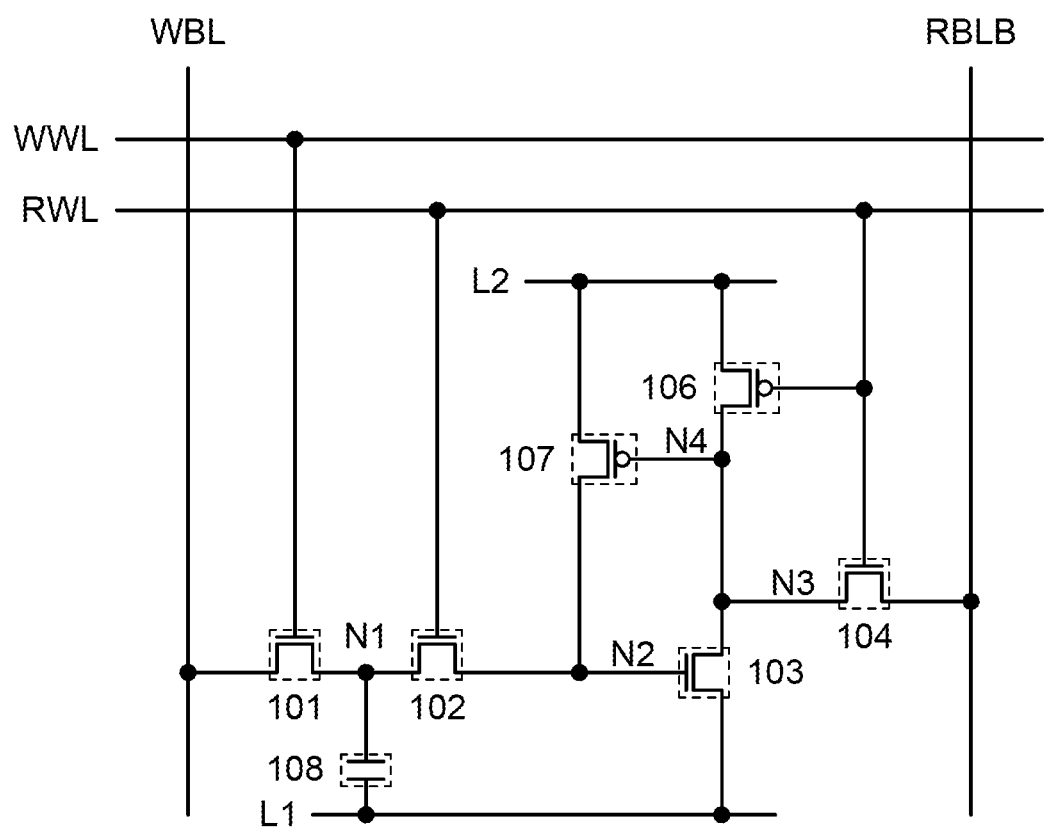
FIG. 15 is a circuit diagram illustrating one embodiment of the present invention.

Next, a memory cell in FIG. 15 differs from the memory cell in FIG. 1 in that the transistor 105 is not provided.

Effects of the memory cell in FIG. 15 are described. Since the memory cell in FIG. 15 does not include the transistor 105, the memory cell size can be reduced. In a data read period, the timing of turning on the transistor 107 can be quickened; thus, electric charge can be stored in the capacitor 108 quickly.

Figure 16:
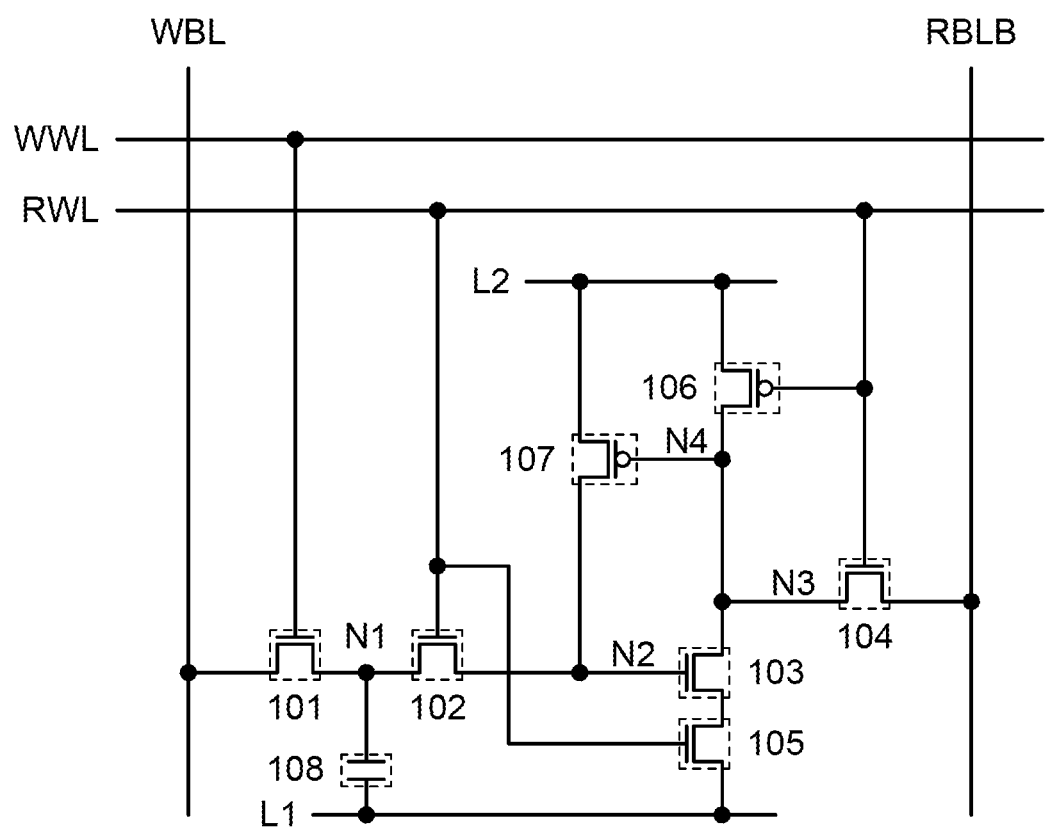
FIG. 16 is a circuit diagram illustrating one embodiment of the present invention.

Next, a memory cell in FIG. 16 differs from the memory cell in FIG. 1 in that the transistor 105 is connected between the first terminal of the transistor 103 and the wiring L1.

Effects of the memory cell in FIG. 16 are described. The memory cell in FIG. 16 can inhibit malfunction of data rewriting due to supply of the potential $V_{L1}$ to the wiring RBLB or the node N4 regardless of electric charge accumulated in the capacitor 108 in a data read period.

Note that the transistor 105 may be connected between a node of the second terminal of the transistor 106 and the second terminal of the transistor 103, and the first terminal of the transistor 104.

Figure 17:
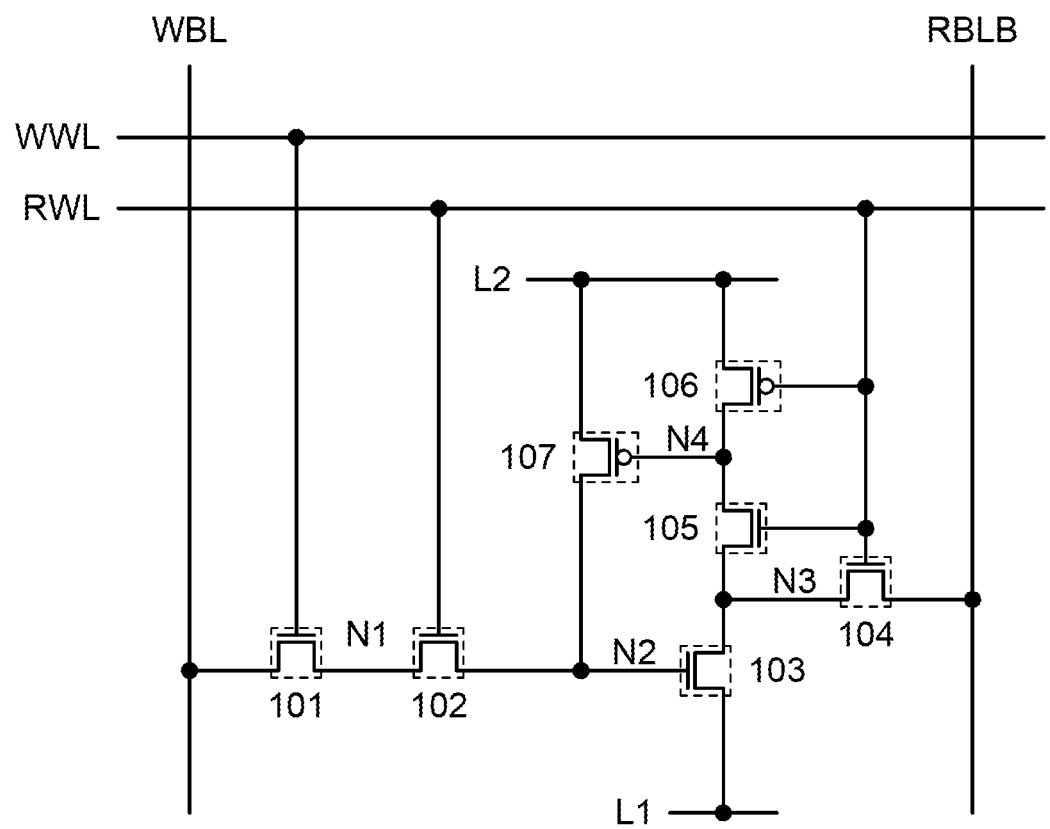
FIG. 17 is a circuit diagram illustrating one embodiment of the present invention.

Next, a memory cell in FIG. 17 differs from the memory cell in FIG. 1 in that the capacitor 108 is not provided.

Effects of the memory cell in FIG. 17 are described. Since the memory cell in FIG. 17 does not include the capacitor 108, the memory cell size can be reduced.

Figure 18:
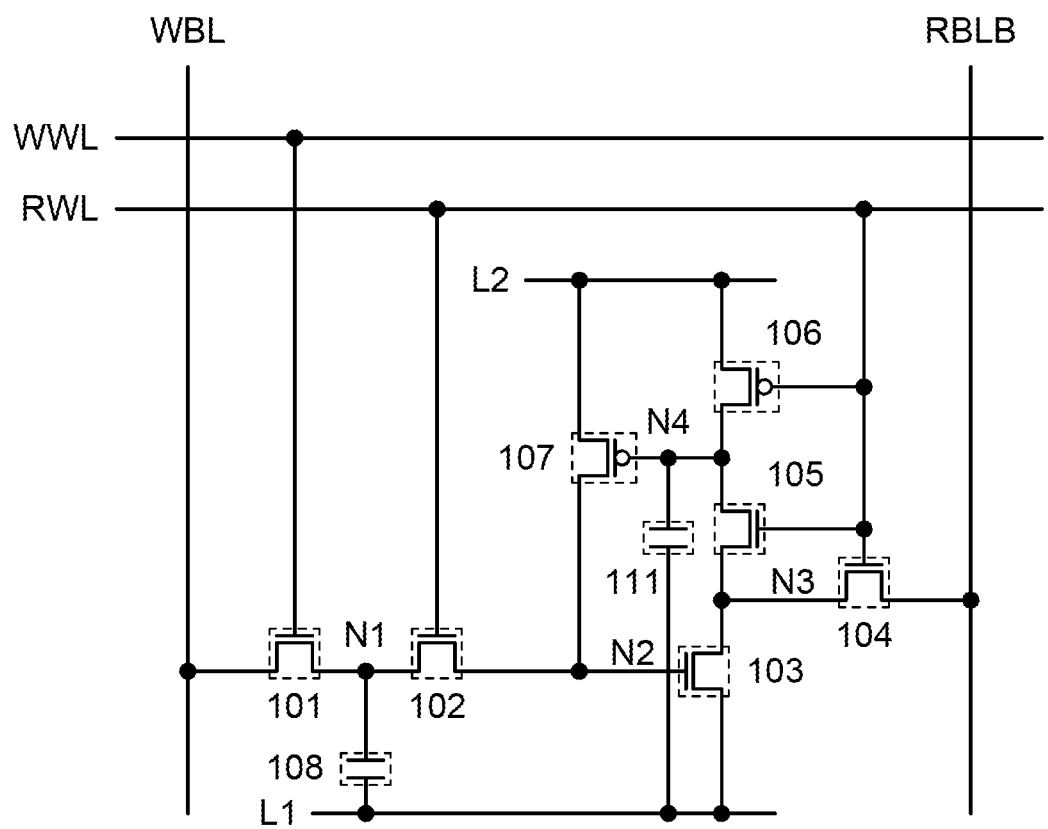
FIG. 18 is a circuit diagram illustrating one embodiment of the present invention.

Next, a memory cell in FIG. 18 differs from the memory cell in FIG. 1 in that a capacitor 111 whose first terminal is connected to the node N4 and whose second terminal is connected to the wiring L1 is provided. The capacitor 111 has a function of accumulating electric charge based on the potential $V_{L2}$.

Effects of the memory cell in FIG. 18 are described. In the memory cell in FIG. 18, in a data read period, the amount of electric charge supplied from the node N4 to the wiring RBLB can be increased. Thus, the potential of the wiring RBLB can be increased, so that data read performance can be improved.

Note that the second terminal of the capacitor 111 may be connected to the wiring L2.

Figure 19:
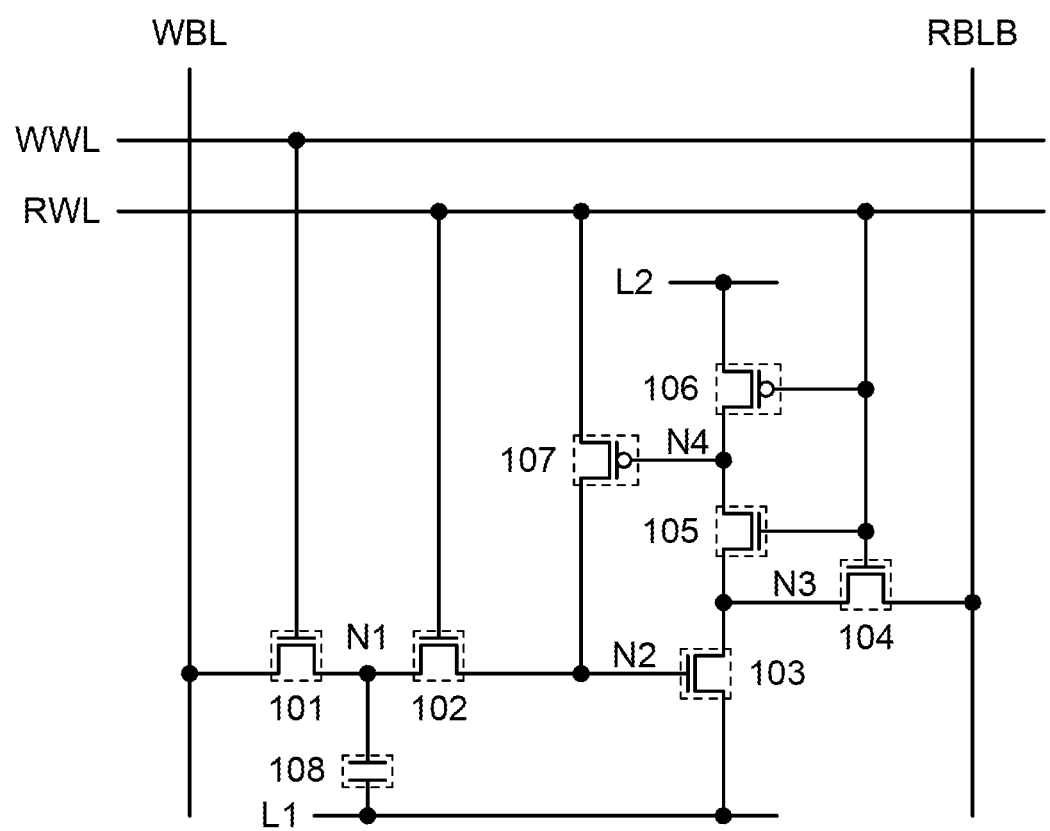
FIG. 19 is a circuit diagram illustrating one embodiment of the present invention.

Next, a memory cell in FIG. 19 differs from the memory cell in FIG. 1 in that the first terminal of the transistor 107 is connected to the wiring RWL.

An operation example of the memory cell in FIG. 19 is described. In a data write period and a data retention period, the transistor 107 is turned off. The signal $V_{RWL}$ is inactive. Thus, in the case where the data retention period is comparatively long and the signal $V_{RWL}$ is at a low level, the potential of the node N2 is made close to the low level of the signal $V_{RWL}$ by the leakage current of the transistor 107. When the potential of the node N2 is made close to the low level of the signal $V_{RWL}$, the transistor 103 is turned off. In a data read period, when electric charge is accumulated in the capacitor 108 in accordance with the signal $V_{WBL}$ at a low level, the transistor 107 is turned off. On the other hand, when electric charge is accumulated in the capacitor 108 in accordance with the signal $V_{WBL}$ at a high level, the transistor 107 is turned on. When the transistor 107 is turned on, the signal $V_{RWL}$ is supplied to the capacitor 108. Since the signal $V_{RWL}$ is at a high level, electric charge is stored in the capacitor 108.

Effects of the memory cell in FIG. 19 are described. In the memory cell in FIG. 19, at the start time of the data read period, the potential of the node N2 can be set at a low level and the transistor 103 can be turned off; thus, the effects of the memory cell in FIG. 19 are similar to those of the memory cell in FIG. 10.

Figure 20:
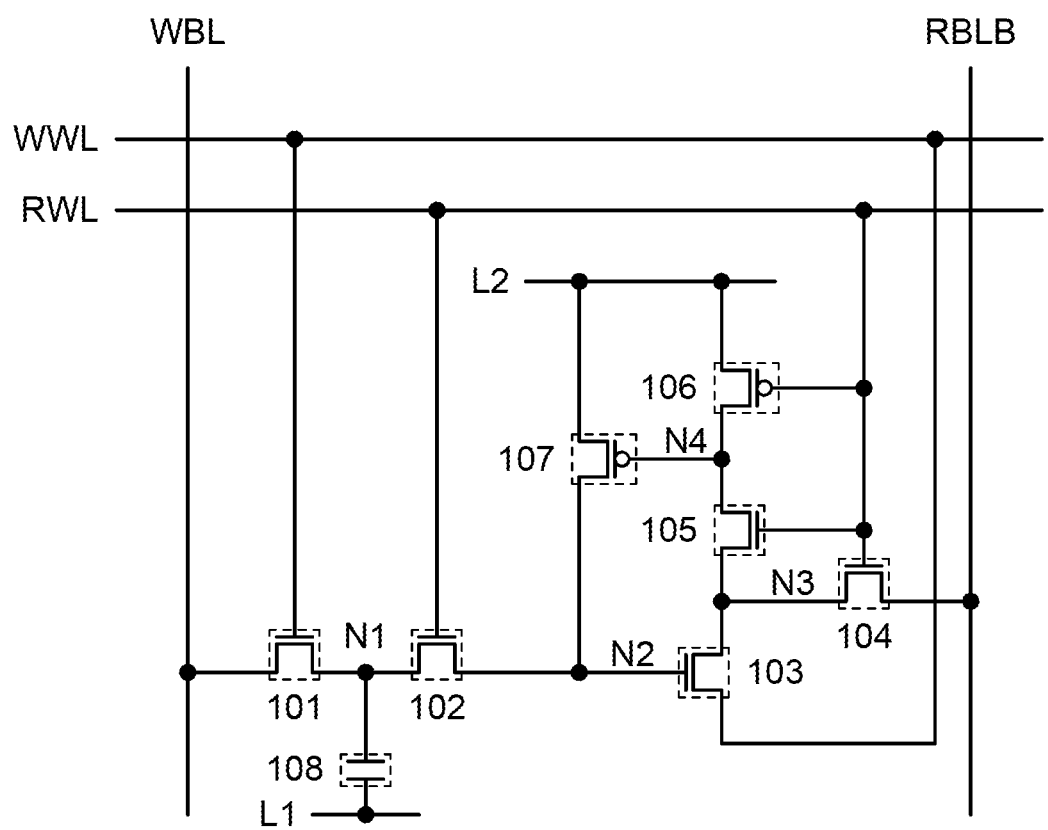
FIG. 20 is a circuit diagram illustrating one embodiment of the present invention.

Next, a memory cell in FIG. 20 differs from the memory cell in FIG. 1 in that the first terminal of the transistor 103 is connected to the wiring WWL.

An operation example of the memory cell in FIG. 20 is described. In a data write period and a data retention period, the transistors 104 and 103 are turned off; thus, the signal $V_{WWL}$ is not supplied to the wiring RBLB or the node N4. In a data read period, the transistors 104 and 105 are turned on; thus, whether to supply the signal $V_{WWL}$ to the wiring RBLB or the node N4 is determined in accordance with the on or off state of the transistor 103. When the transistor 103 is off, the signal $V_{WWL}$ is not supplied to the wiring RBLB or the node N4. On the other hand, when the transistor 103 is on, the signal $V_{WWL}$ is supplied to the wiring RBLB or the node N4. Thus, when the signal $V_{WWL}$ is at a low level, the signal $V_{RBLB}$ is set at a low level, so that the potential of the node N4 is set at a low level.

Figure 21:
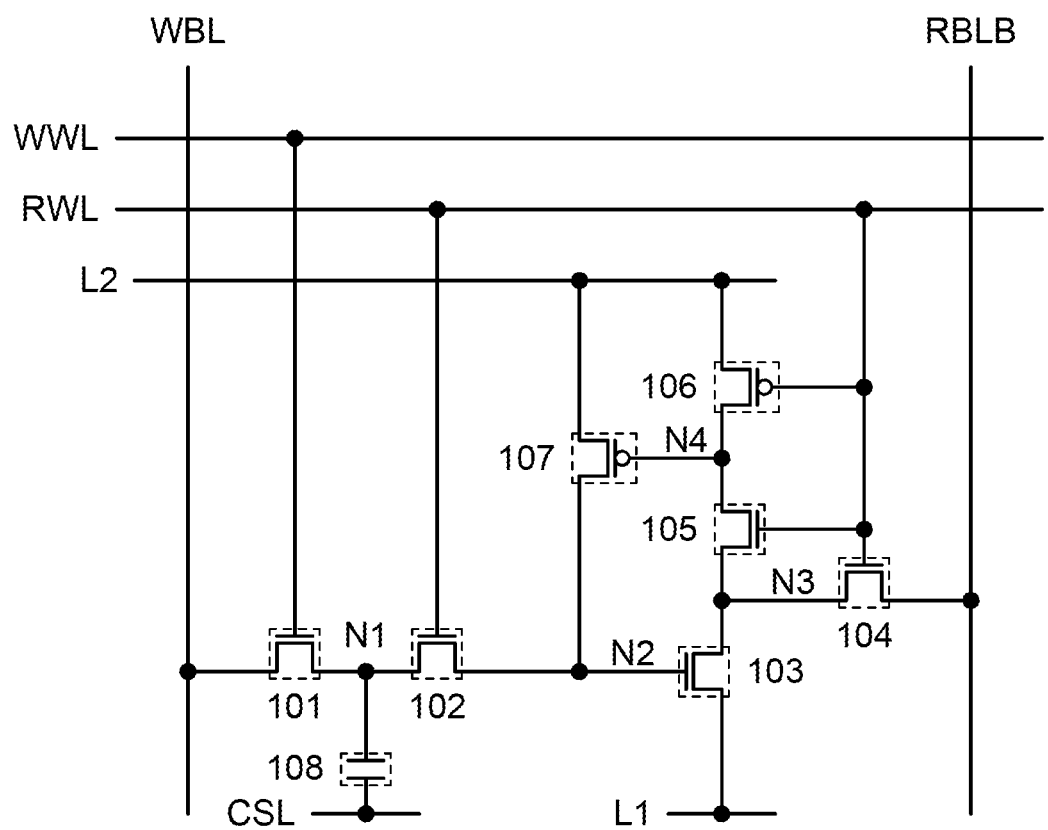
FIG. 21 is a circuit diagram illustrating one embodiment of the present invention.

Next, a memory cell in FIG. 21 differs from the memory cell in FIG. 1 in that the first terminal of the capacitor 108 is connected to a wiring CSL. A signal $V_{CSL}$ is supplied to the wiring CSL. The signal $V_{CSL}$ controls the potential of the first terminal of the capacitor 108.

Effects of the memory cell in FIG. 21 are described. The memory cell in FIG. 21 can control the potential of the node N1 by the signal $V_{CSL}$. For example, in a data read period, by changing the potential of the signal $V_{CSL}$ in various ways, the memory cell can be a multi-level memory cell.

Note that the first terminal of the capacitor 108 may be connected to the wiring RWL.

The first terminal of the capacitor 108 may be connected to the wiring WWL.

The first terminal of the capacitor 108 may be connected to the wiring L2.

Figure 22:
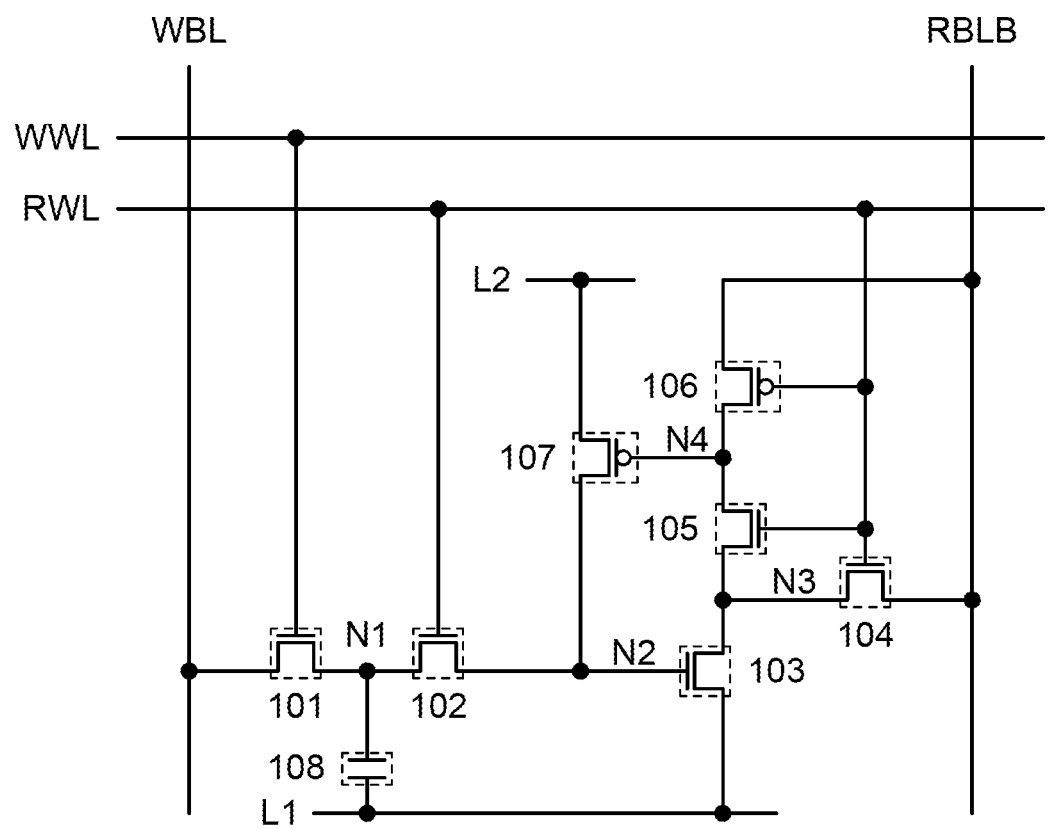
FIG. 22 is a circuit diagram illustrating one embodiment of the present invention.

Next, a memory cell in FIG. 22 differs from the memory cell in FIG. 1 in that the first terminal of the transistor 106 is connected to the wiring RBLB.

An operation example of the memory cell in FIG. 22 is described. In a data write period and a data retention period, the transistor 106 is turned on; thus, the signal $V_{RBLB}$ is supplied to the node N4. Thus, when the signal $V_{RBLB}$ is at a high level, the potential of the node N4 is set at a high level. In addition, in a data read period, the signal $V_{RBLB}$ is not supplied to the node N4 because the transistor 106 is turned off.

Note that in the case where the first terminal of the transistor 106 is connected to the wiring RBLB, the signal $V_{RBLB}$ is preferably set at a high level in the data write period and the data retention period.

Next, an example is described in which the above description, i.e., the memory cells in FIG. 10, FIG. 11, FIG. 12, FIG. 13, FIG. 14, FIG. 15, FIG. 16, FIG. 17, FIG. 18, FIG. 19, FIG. 20, FIG. 21, FIG. 22, and FIG. 33 are combined with description thereof as appropriate. Note that the memory cells in FIG. 10, FIG. 11, FIG. 12, FIG. 13, FIG. 14, FIG. 15, FIG. 16, FIG. 17, FIG. 18, FIG. 19, FIG. 20, FIG. 21, FIG. 22, and FIG. 33 can be combined with the description thereof other than the following description, as appropriate.

Figure 23:
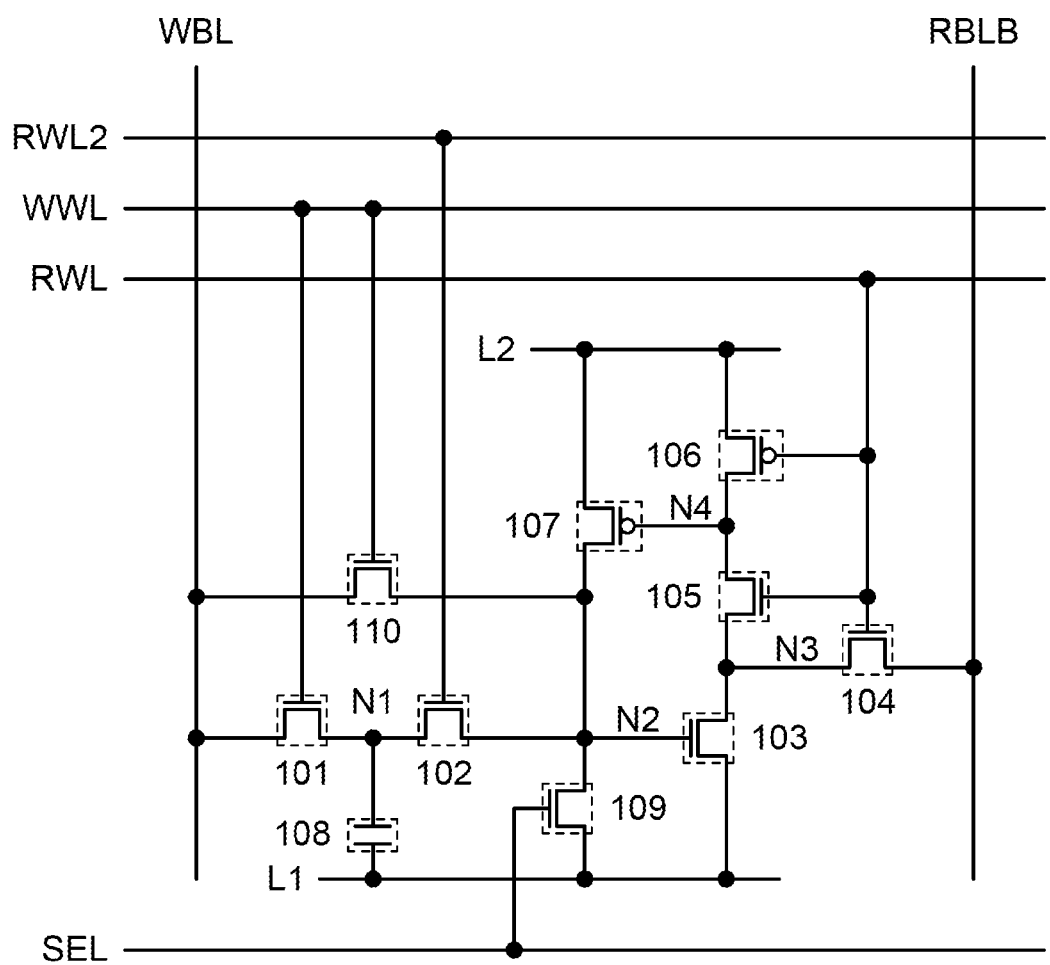
FIG. 23 is a circuit diagram illustrating one embodiment of the present invention.

First, a memory cell in FIG. 23 is obtained by a combination of the memory cell in FIG. 10 and the memory cell in FIG. 12. Note that in a data write period, when both the transistors 109 and 110 are turned on, the wirings WBL and L1 are probably brought into conduction. Thus, in the memory cell in FIG. 23, the gate of the transistor 109 is connected to a wiring SEL. A signal $V_{SEL}$ is input to the wiring SEL. The signal $V_{SEL}$ controls the on or off state of the transistor 109 and has two states (active and inactive states). When the signal $V_{SEL}$ is activated, the transistor 109 is turned on. When the signal $V_{SEL}$ is deactivated, the transistor 109 is turned off. For convenience, the potential of the signal $V_{SEL}$ in the active state is referred to as a high level, and the potential of the signal $V_{SEL}$ in the inactive state is referred to as a low level.

The operation of the memory cell in FIG. 23 is described. In the data write period, the signal $V_{SEL}$ is deactivated to turn off the transistor 109. In part or all of a data retention period, the signal $V_{SEL}$ is activated to turn on the transistor 109. In a data read period, the signal $V_{SEL}$ is deactivated to turn off the transistor 109.

Note that as described above, the gate of the transistor 109 may be connected to the wiring WWL of a memory cell in the next row.

Note that as described above, the gate of the transistor 109 may be connected to the wiring RWL of a memory cell in the previous row.

Figure 24:
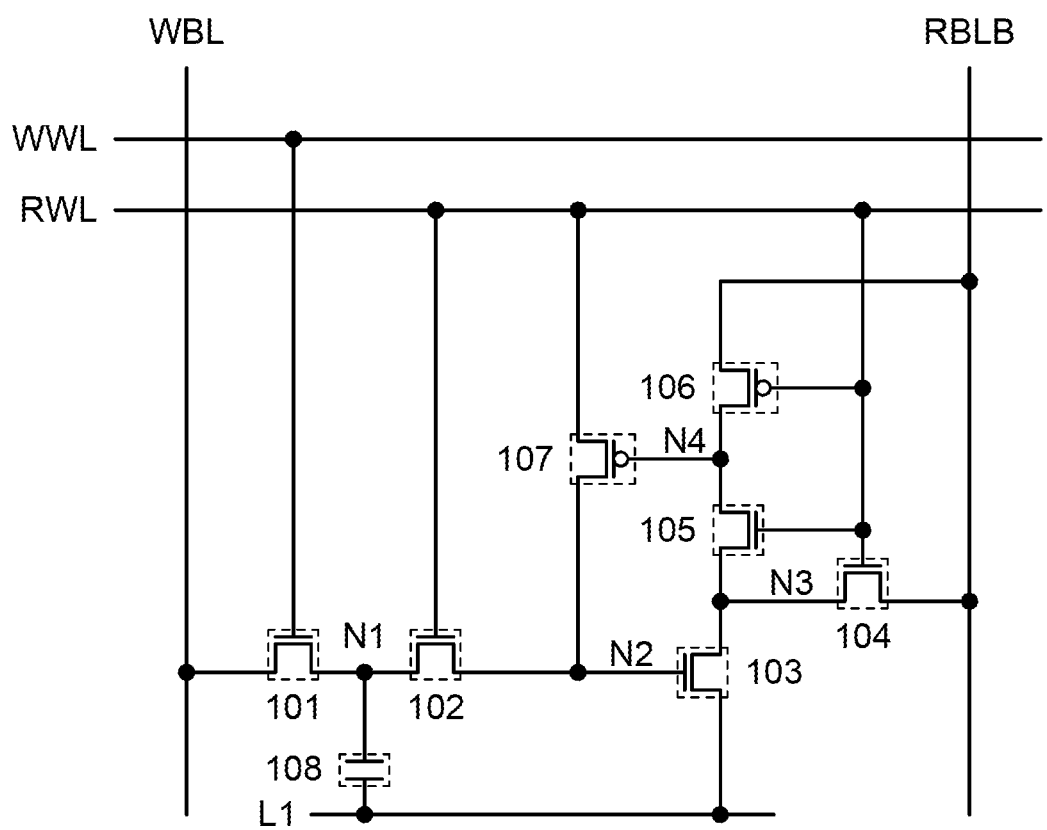
FIG. 24 is a circuit diagram illustrating one embodiment of the present invention.

Next, a memory cell in FIG. 24 is obtained by a combination of the memory cell in FIG. 19 and the memory cell in FIG. 22. Since the wiring L2 can be omitted, the memory cell size can be reduced.

Figure 25:
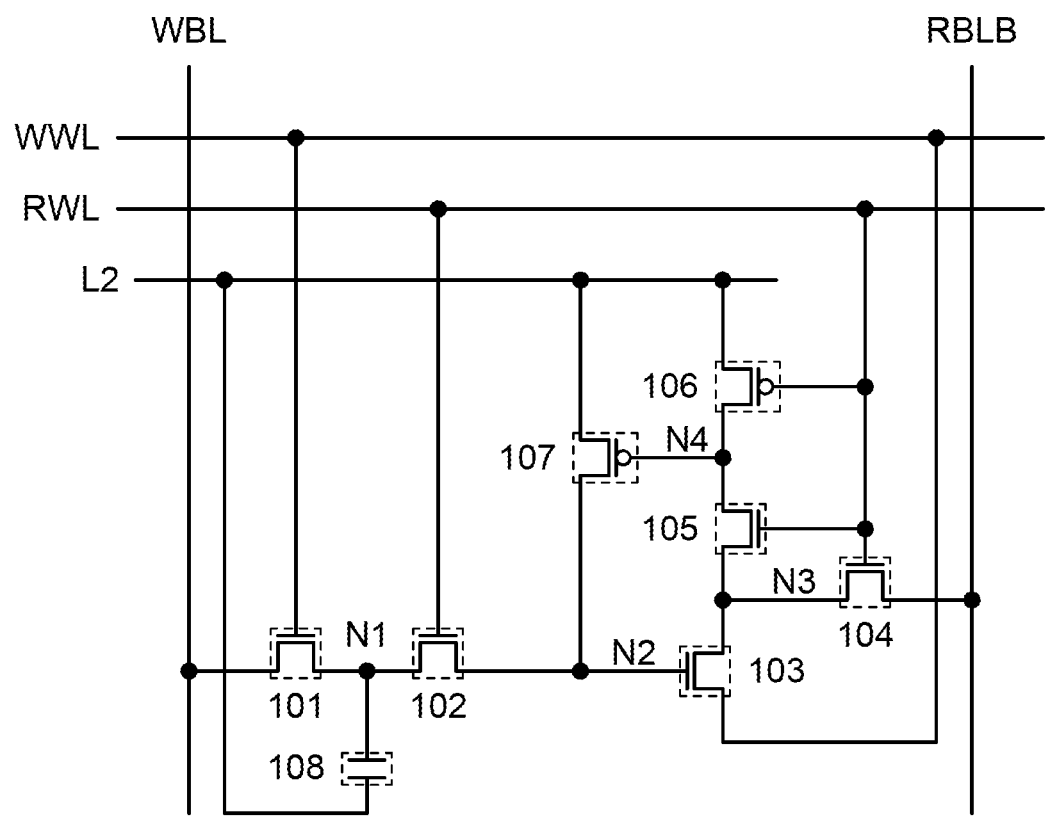
FIG. 25 is a circuit diagram illustrating one embodiment of the present invention.

Next, a memory cell in FIG. 25 is obtained by a combination of the memory cell in FIG. 20 and the memory cell in FIG. 21. Since the wiring L1 can be omitted, the memory cell size can be reduced.

One embodiment of the present invention includes the following semiconductor device in its category.

One embodiment of the present invention is a semiconductor device including the transistors 101, 102, 103, and 107. The first terminal of the transistor 101 is connected to the wiring WBL. The second terminal of the transistor 101 is connected to the capacitor 108. The first terminal of the transistor 102 is connected to the capacitor 108. The second terminal of the transistor 102 is connected to the gate of the transistor 103. The first terminal of the transistor 103 is connected to the wiring L1. The second terminal of the transistor 103 is connected to the wiring RBLB and the gate of the transistor 107. The first terminal of the transistor 107 is connected to the wiring L2. The second terminal of the transistor 107 is connected to the gate of the transistor 103 (see FIG. 32A).

Figure 32A:
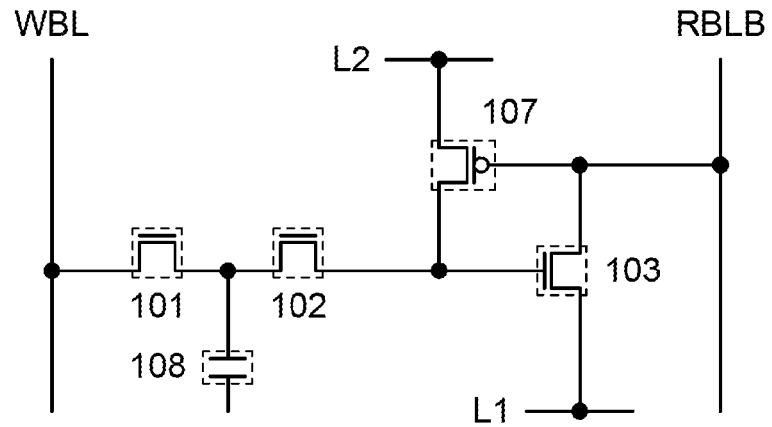
FIGS. 32A to 32C are circuit diagrams illustrating one embodiment of the present invention.

One embodiment of the present invention is a semiconductor device including the transistors 101, 102, 103, and 107 (see FIG. 32A). The transistor 101 has a function of supplying the signal $V_{WBL}$ to the capacitor 108. The capacitor 108 has a function of accumulating electric charge based on the signal $V_{WBL}$. The transistor 102 has a function of supplying electric charge based on the signal $V_{WBL}$ to the transistor 103. The transistor 103 has a function of supplying the potential $V_{L1}$ to the wiring RBLB. The transistor 103 has a function of supplying the potential $V_{L1}$ to the gate of the transistor 107. The transistor 107 has a function of supplying the potential $V_{L2}$ to the capacitor 108 through the transistor 102.

Figure 32B:
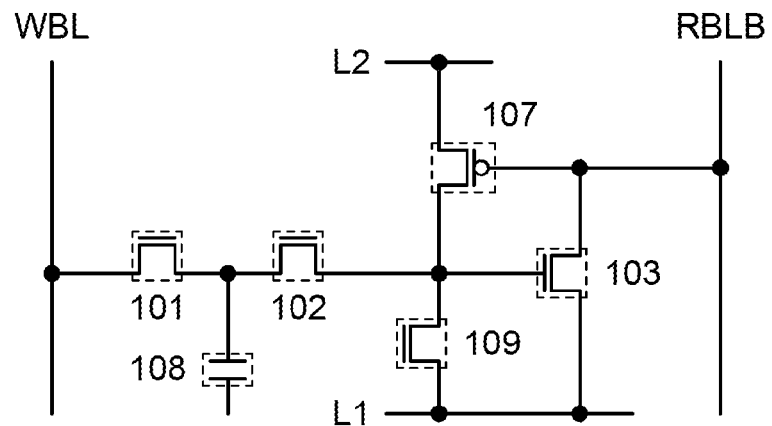

Note that in the semiconductor device, the transistor 109 may be provided (see FIG. 32B). The first terminal of the transistor 109 is connected to the wiring L1. A second terminal of the transistor 109 is connected to the gate of the transistor 103. The transistor 109 has a function of supplying the potential $V_{L1}$ to the gate of the transistor 103.

Figure 32C:
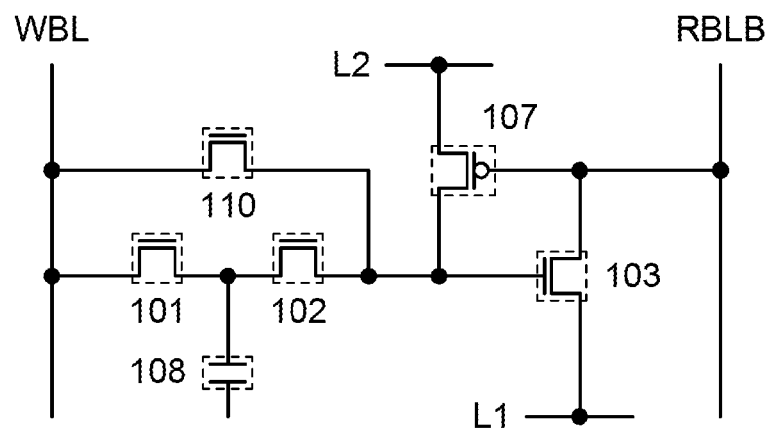

Note that in the semiconductor device, the transistor 110 may be provided (see FIG. 32C). A first terminal of the transistor 110 is connected to the wiring WBL. A second terminal of the transistor 110 is connected to the gate of the transistor 103. The transistor 110 has a function of supplying the signal $V_{WBL}$ to the capacitor 108 through the transistor 102.

Note that the description of this embodiment can be combined with description disclosed in this specification and the like, such as another description disclosed in this embodiment and the description of any of the other embodiments, as appropriate.

Embodiment 3

In this embodiment, a semiconductor device is described. The semiconductor device in this embodiment can be applied to the RBLB driver circuit 240 in FIG. 6.

First, the structure of the semiconductor device is described with reference to a circuit diagram of a semiconductor device in FIG. 26.

Figure 26:
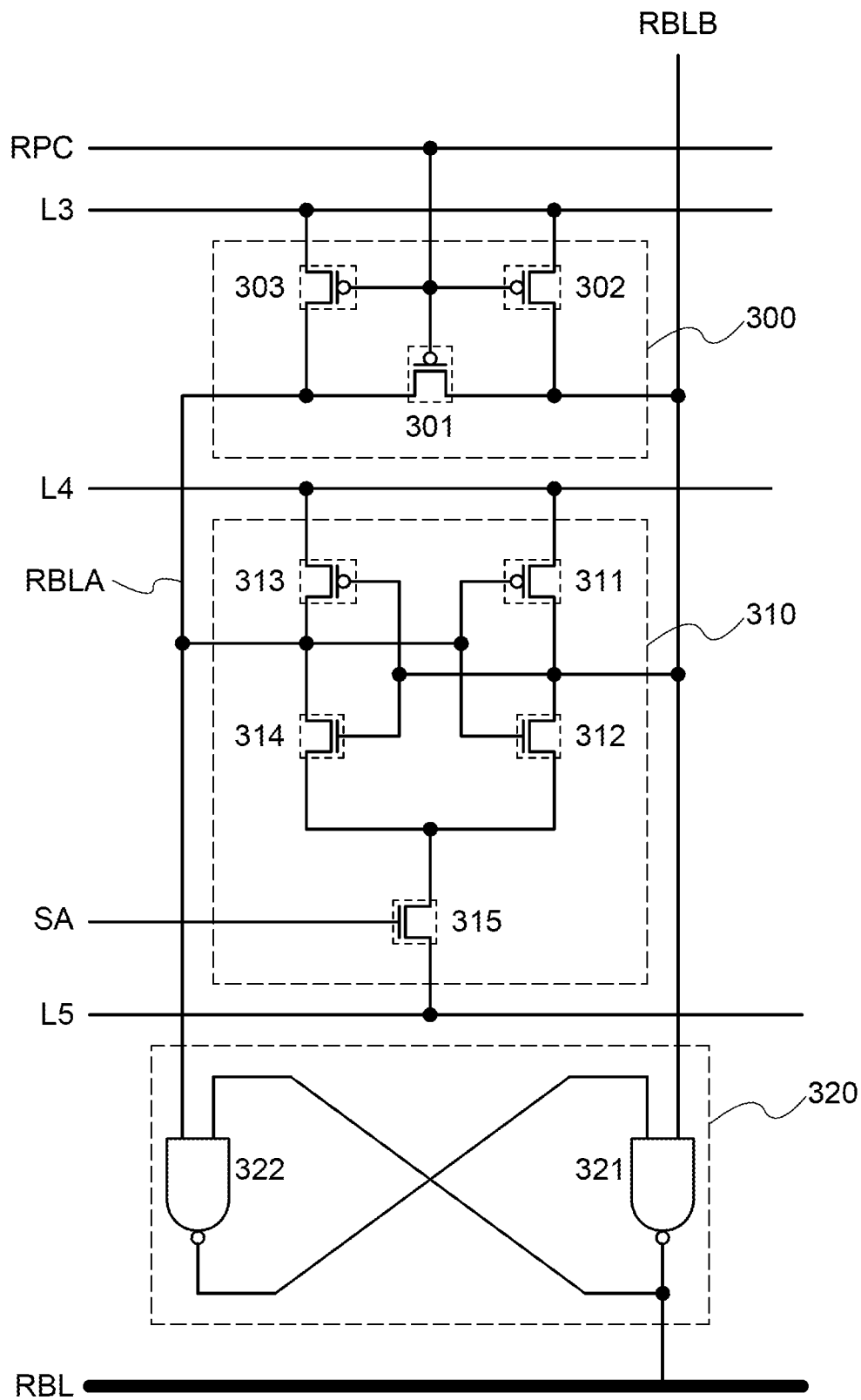
FIG. 26 is a circuit diagram illustrating one embodiment of the present invention.

The semiconductor device in FIG. 26 includes a precharge circuit 300, a sense amplifier 310, and a data latch circuit 320. The precharge circuit 300 is connected to the wiring RBLB, a wiring RBLA, a wiring RPC, and a wiring L3. The sense amplifier 310 is connected to the wiring RBLB, the wiring RBLA, a wiring SA, a wiring L4, and a wiring L5. The data latch circuit 320 is connected to the wiring RBLB, the wiring RBLA, and a wiring RBL.

The signal $V_{RBLB}$ is input to the wiring RBLB. The signal $V_{RBLB}$ is controlled by data read from a memory cell.

A signal $V_{RPC}$ is input to the wiring RPC. The signal $V_{RPC}$ controls the precharge circuit 300 and has two states (active and inactive states). When the signal $V_{RPC}$ is activated, the precharge circuit 300 supplies potentials to the wirings RBLB and RBLA. When the signal $V_{RPC}$ is deactivated, the precharge circuit 300 stops the supply of potentials to the wirings RBLB and RBLA. For convenience, the potential of the signal $V_{RPC}$ in the active state is referred to as a low level, and the potential of the signal $V_{RPC}$ in the inactive state is referred to as a high level.

A signal $V_{SA}$ is input to the wiring SA. The signal $V_{SA}$ controls the sense amplifier 310 and has two states (active and inactive states). When the signal $V_{SA}$ is activated, the sense amplifier 310 can operate. When the signal $V_{SA}$ is deactivated, the sense amplifier 310 cannot operate. For convenience, the potential of the signal $V_{SA}$ in the active state is referred to as a high level, and the potential of the signal $V_{SA}$ in the inactive state is referred to as a low level.

A signal $V_{RBL}$ is output to the wiring RBL from the data latch circuit 320.

A potential $V_{L3}$ is input to the wiring L3. Although details are described later, the potential $V_{L3}$ is a potential for precharging the wirings RBLB and RBLA.

A potential $V_{L4}$ is input to the wiring L4. A potential $V_{L5}$ is input to the wiring L5. The potential $V_{L4}$ is higher than the potential $V_{L5}$. In addition, the potential $V_{L4}$ is higher than the potential $V_{L3}$, and the potential $V_{L5}$ is lower than the potential $V_{L3}$.

The precharge circuit 300 has a function of precharging the wirings RBLB and RBLA. For example, after the precharge circuit 300 supplies the potential $V_{L3}$ to the wirings RBLB and RBLA, the precharge circuit 300 stops the supply of the potential $V_{L3}$ to the wirings RBLB and RBLA. In this manner, the wirings RBLB and RBLA are precharged with the potential $V_{L3}$.

The sense amplifier 310 has a function of amplifying a potential difference between the wirings RBLB and RBLA. For example, in the case where the potential of the wiring RBLB is higher than the potential of the wiring RBLA, the sense amplifier 310 supplies the potential $V_{L4}$ to the wiring RBLB and supplies the potential $V_{L5}$ to the wiring RBLA. In contrast, in the case where the potential of the wiring RBLB is lower than the potential of the wiring RBLA, the sense amplifier 310 supplies the potential $V_{L5}$ to the wiring RBLB and supplies the potential $V_{L4}$ to the wiring RBLA. Note that when a signal $V_{SE}$ is deactivated, the sense amplifier 310 cannot operate and stops its function.

Note that the sense amplifier 310 includes at least one OS transistor, and the OS transistor is preferably connected between the wirings L4 and L5. Since the off-state current of the OS transistor is low, standby current flowing between the wirings L4 and L5 when the sense amplifier 310 cannot operate can be reduced. Thus, power consumption can be reduced. Note that Si transistors may be used as all the plurality of transistors included in the sense amplifier 310. Accordingly, the operation speed of the sense amplifier 310 can be increased, so that read speed can be increased.

The data latch circuit 320 has functions of reading and holding the potentials of the wirings RBLB and RBLA.

Next, specific examples of the precharge circuit 300, the sense amplifier 310, and the data latch circuit 320 are described.

The precharge circuit 300 includes transistors 301 to 303. A first terminal of the transistor 301 is connected to the wiring RBLB. A second terminal of the transistor 301 is connected to the wiring RBLA. A gate of the transistor 301 is connected to the wiring RPC. A first terminal of the transistor 302 is connected to the wiring L3. A second terminal of the transistor 302 is connected to the wiring RBLB. A gate of the transistor 302 is connected to the wiring RPC. A first terminal of the transistor 303 is connected to the wiring L3. A second terminal of the transistor 303 is connected to the wiring RBLA. A gate of the transistor 303 is connected to the wiring RPC.

The sense amplifier 310 includes transistors 311 to 315. A first terminal of the transistor 311 is connected to the wiring L4. A second terminal of the transistor 311 is connected to the wiring RBLB. A gate of the transistor 311 is connected to the wiring RBLA. A first terminal of the transistor 312 is connected to a first terminal of the transistor 314. A second terminal of the transistor 312 is connected to the wiring RBLB. A gate of the transistor 312 is connected to the wiring RBLA. A first terminal of the transistor 313 is connected to the wiring L4. A second terminal of the transistor 313 is connected to the wiring RBLA. A gate of the transistor 313 is connected to the wiring RBLB. A first terminal of the transistor 314 is connected to the first terminal of the transistor 312. A second terminal of the transistor 314 is connected to the wiring RBLA. A gate of the transistor 314 is connected to the wiring RBLB. A first terminal of the transistor 315 is connected to the wiring L5. A second terminal of the transistor 315 is connected to the first terminal of the transistor 312. A gate of the transistor 315 is connected to the wiring SA.

The data latch circuit 320 includes NAND circuits 321 and 322. A first input terminal of the NAND circuit 321 is connected to the wiring RBLB, a second input terminal of the NAND circuit 321 is connected to an output terminal of the NAND circuit 322, and an output terminal of the NAND circuit 321 is connected to the wiring RBL. A first input terminal of the NAND circuit 322 is connected to the wiring RBLA, a second input terminal of the NAND circuit 322 is connected to the output terminal of the NAND circuit 321, and the output terminal of the NAND circuit 322 is connected to the second input terminal of the NAND circuit 321.

The transistors 301, 302, 303, 311, and 313 are p-channel transistors. The transistors 312, 314, and 315 are n-channel transistors. Note that the conductivity type of each transistor is not limited thereto.

Figure 27:
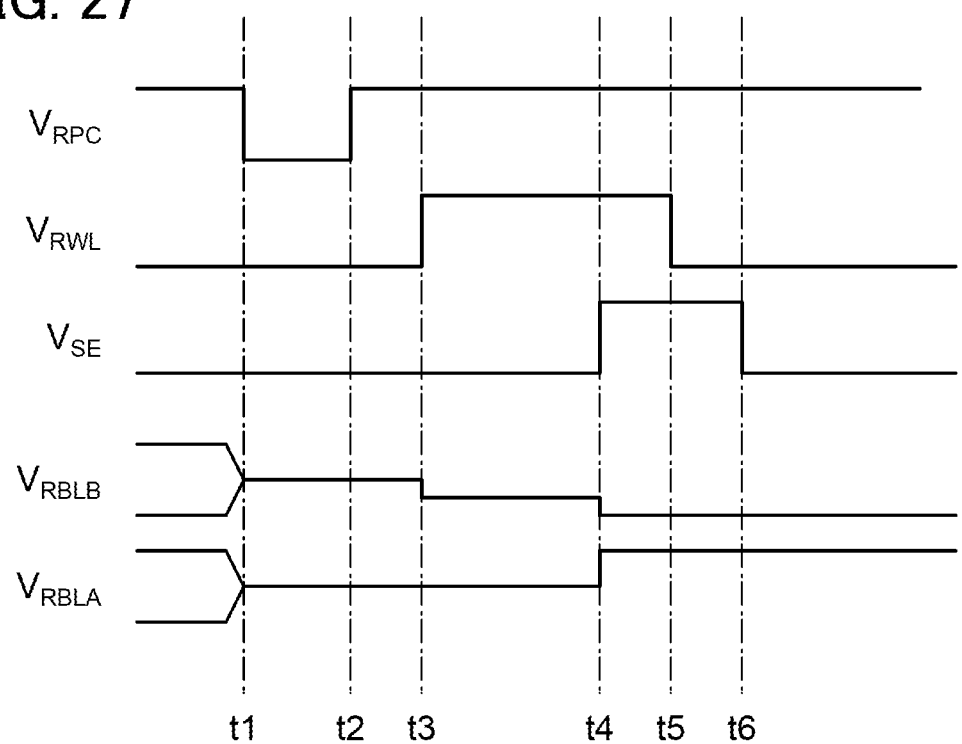
FIG. 27 is a timing chart illustrating one embodiment of the present invention.

Next, an operation example of the semiconductor device in FIG. 26 is described with reference to a timing chart in FIG. 27. Here, for convenience, the operation time is divided into times t1 to t6.

First, at the time t1, the signal $V_{RPC}$ is activated to supply the potential $V_{L3}$ to the wirings RBLB and RBLA from the precharge circuit 300 and bring the wirings RBLB and RBLA into conduction. Specifically, the transistors 301 to 303 are turned on, the wirings RBLB and RBLA are brought into conduction, the wirings L3 and RBLB are brought into conduction, and the wirings L3 and RBLA are brought into conduction. Then, the potential $V_{L3}$ is supplied to the wirings RBLB and RBLA. After that, the potentials of the wirings RBLB and RBLA are each set at the potential $V_{L3}$.

Note that at the time t1, by deactivating the signal $V_{RWL}$, data is made not to be read from the memory cell. By deactivating the signal $V_{SA}$, the sense amplifier 310 cannot operate. Specifically, the transistor 315 is turned off.

Next, at the time t2, by deactivating the signal $V_{RPC}$, the potential $V_{L3}$ is not supplied to the wirings RBLB and RBLA, and the wirings RBLB and RBLA are brought out of conduction. Specifically, the transistors 301 to 303 are turned off.

Then, at the time t3, by activating the signal $V_{RWL}$, data is read from the memory cell. The potential of the wiring RBLB is controlled in accordance with the data read from the memory cell. The timing chart in FIG. 27 illustrates the case where the potential of the wiring RBLB is slightly lower than the potential $V_{L3}$.

Next, at the time t4, by activating the signal $V_{SA}$, the sense amplifier 310 can operate. Specifically, the transistor 315 is turned on. When the sense amplifier 310 can operate, the sense amplifier 310 amplifies the potential difference between the wirings RBLB and RBLA. The data latch circuit 320 retains data of the wirings RBLB and RBLA and outputs the signal $V_{RBL}$ based on the data to the wiring RBL.

Then, at the time t5, by deactivating the signal $V_{RWL}$, data is made not to be read from the memory cell.

Next, at the time t6, by deactivating the signal $V_{SE}$, the sense amplifier 310 cannot operate.

The above is the description of the operation example of the semiconductor device in FIG. 26.

As the off-state current of the transistor 315 becomes lower, current flowing between the wirings L4 and L5 can be reduced when the sense amplifier 310 cannot operate, so that power consumption can be reduced. Thus, it is preferable to use an OS transistor that has extremely low off-state current as the transistor 315.

Note that when data is read from the memory cell, the potential of the wiring RBLB is not sufficiently increased in some cases. In such a case, for example, the potential of the wiring RBLB is not much higher than the potential of the wiring RBLA, so that the sense amplifier 310 does not operate correctly in some cases. Accordingly, even when the potential of the wiring RBLB is not sufficiently increased, the sense amplifier 310 preferably supplies the potentials $V_{L4}$ and $V_{L5}$ to the wirings RBLB and RBLA, respectively. To achieve this, W/L of the transistor 311 is preferably larger than W/L of the transistor 313. In addition, W/L of the transistor 314 is preferably larger than W/L of the transistor 312. In this manner, malfunction can be prevented.

Note that the transistor 301 may be omitted.

Note that one of the transistors 302 and 303 may be omitted.

Note that the memory cell described in Embodiment 1 or 2 may be used as the memory cell connected to the wiring RBLB.

Note that the transistors 311 and 312 may be omitted. In that case, one of the transistors 301 and 303 may be omitted.

Figure 34:
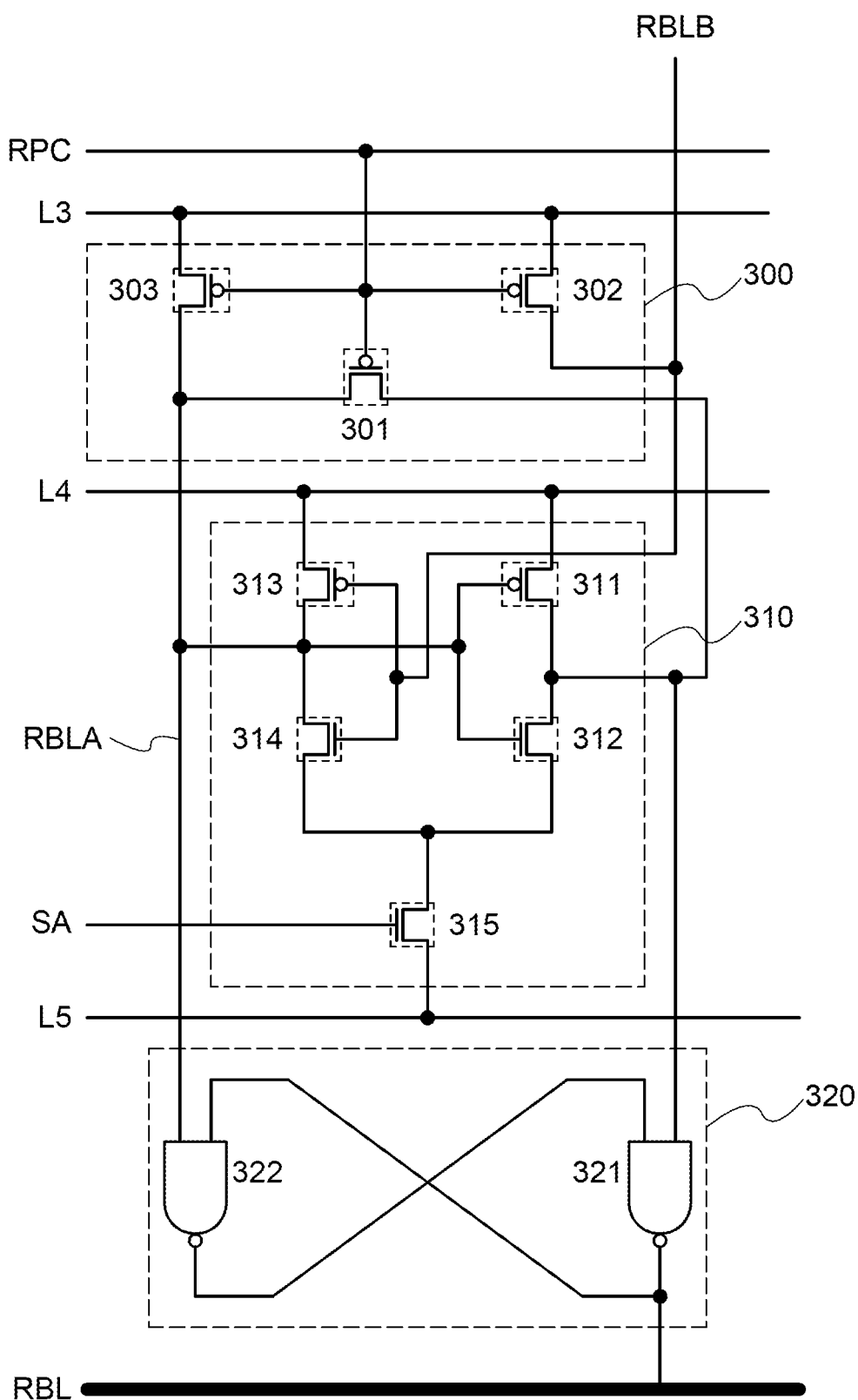
FIG. 34 is a circuit diagram illustrating one embodiment of the present invention.

Note that the precharge circuit 300 and the sense amplifier 310 may have structures illustrated in FIG. 34. In other words, in the sense amplifier 310, the wiring RBLB may be connected to the gates of the transistors 313 and 314, the second terminals of the transistors 311 and 312 may be connected to the first input terminal of the NAND circuit 321. In addition, in the precharge circuit 300, the first terminal of the transistor 301 may be connected to the first input terminal of the NAND circuit 321. Furthermore, although not illustrated, in the precharge circuit 300 of FIG. 34, the second terminal of the transistor 301 may be connected to the wiring L3.

Note that the description of this embodiment can be combined with description disclosed in this specification and the like, such as another description disclosed in this embodiment and the description of any of the other embodiments, as appropriate.

Embodiment 4

In this embodiment, an oxide semiconductor layer is described. An oxide semiconductor in this embodiment can be used for a semiconductor layer of an OS transistor.

An oxide semiconductor used for a channel formation region in the semiconductor layer of the transistor preferably contains at least indium (In) or zinc (Zn). In particular, In and Zn are preferably contained. A stabilizer for strongly bonding oxygen is preferably contained in addition to In and Zn. As a stabilizer, at least one of gallium (Ga), tin (Sn), zirconium (Zr), hafnium (Hf), and aluminum (Al) may be contained.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor used for the semiconductor layer of the transistor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—

Ga—Zn-based oxide, an In—Sn—Al—Zn-based oxide, an In—Sn—Hf—Zn-based oxide, and an In—Hf—Al—Zn-based oxide.

For example, an In—Ga—Zn-based oxide with an atomic ratio of In:Ga:Zn=1:1:1, In:Ga:Zn=3:1:2, or In:Ga:Zn=2:1:3, or an oxide whose composition is in the neighborhood of the above composition is preferably used.

When an oxide semiconductor film included in the semiconductor layer contains a large amount of hydrogen, hydrogen and the oxide semiconductor are bonded to each other, so that part of hydrogen serves as a donor and causes an electron (carrier). As a result, the threshold voltage of the transistor is shifted in a negative direction. Thus, it is preferable that after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is reduced by the dehydration treatment (dehydrogenation treatment) in some cases. Thus, it is preferable that oxygen be added to the oxide semiconductor film to fill oxygen vacancies increased by the dehydration treatment (dehydrogenation treatment). In this specification and the like, supplying oxygen to an oxide semiconductor film is expressed as oxygen adding treatment, and treatment for making the oxygen content of an oxide semiconductor film be in excess of that in the stoichiometric composition is expressed as treatment for making an oxygen-excess state in some cases.

In this manner, hydrogen or moisture is removed from the oxide semiconductor film by dehydration treatment (dehydrogenation treatment) and oxygen vacancies are filled by oxygen adding treatment, so that the oxide semiconductor film can be an intrinsic (i-type) or substantially intrinsic oxide semiconductor film. Note that the substantially intrinsic oxide semiconductor film means an oxide semiconductor film that contains extremely few (close to zero) carriers derived from a donor and has a carrier density of lower than or equal to $1\times10^{17}/cm^3$, lower than or equal to $1\times10^{16}/cm^3$, lower than or equal to $1\times10^{15}/cm^3$, lower than or equal to $1\times10^{14}/cm^3$, or lower than or equal to $1\times10^{13}/cm^3$. The carrier density is preferably lower than $8\times10^{11}/cm^3$, still further preferably lower than $1\times10^{11}/cm^3$, yet further preferably lower than $1\times10^{10}/cm^3$, and is higher than or equal to $1\times10^{-9}/cm^3$.

In this manner, the transistor including an intrinsic (i-type) or substantially intrinsic i-type oxide semiconductor film can have extremely favorable off-state current characteristics. For example, the drain current when the transistor including an oxide semiconductor film is off can be less than or equal to $1\times10^{-18}$ A, preferably less than or equal to $1\times10^{-21}$ A, and more preferably $1\times10^{-24}$ A at room temperature (approximately 25° C.); or less than or equal to $1\times10^{-15}$ A, preferably $1\times10^{-18}$ A, more preferably less than or equal to $1\times10^{-21}$ A at 85° C. The off state of a transistor refers to a state where gate voltage is much lower than the threshold voltage in an n-channel transistor. Specifically, when the gate voltage is lower than the threshold voltage by 1 V or more, 2 V or more, or 3 V or more, the transistor is off.

The structure of the oxide semiconductor film is described below.

An oxide semiconductor film is classified into a non-single-crystal oxide semiconductor film and a single crystal oxide semiconductor film. Alternatively, an oxide semiconductor is classified into, for example, a crystalline oxide semiconductor and an amorphous oxide semiconductor.

Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. In addition, examples of a crystalline oxide semiconductor include a single crystal oxide semiconductor, a CAAC-OS, a polycrystalline oxide semiconductor, and a microcrystalline oxide semiconductor.

First, a CAAC-OS film is described.

The CAAC-OS film is one of oxide semiconductor films having a plurality of c-axis aligned crystal parts.

With a transmission electron microscope (TEM), a combined analysis image (also referred to as a high-resolution TEM image) of a bright-field image and a diffraction pattern of the CAAC-OS film is observed. Consequently, a plurality of crystal parts are observed clearly. However, in the high-resolution TEM image, a boundary between crystal parts, i.e., a grain boundary is not observed clearly. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a morphology reflecting a surface over which the CAAC-OS film is formed (also referred to as a formation surface) or a top surface of the CAAC-OS film, and is provided in parallel to the formation surface or the top surface of the CAAC-OS film.

On the other hand, according to the high-resolution planar TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic order of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic order of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as "highly purified intrinsic" or "substantially highly purified intrinsic." A highly purified intrinsic or substantially highly purified intrinsic oxide semiconductor film has few carrier generation sources, and thus can have low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has few variations in electrical characteristics and high reliability. Charge trapped by the carrier traps in the oxide semiconductor film takes a long time to be released and may behave like fixed charge. Thus, the transistor that includes the oxide semiconductor film having high impurity concentration and high density of defect states has unstable electrical characteristics in some cases.

In a transistor including the CAAC-OS film, changes in electrical characteristics of the transistor due to irradiation with visible light or ultraviolet light are small.

Next, a microcrystalline oxide semiconductor film is described.

A microcrystalline oxide semiconductor film has a region in which a crystal part is observed and a region in which a crystal part is not observed clearly in a high-resolution TEM image. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as a nanocrystalline oxide semiconductor (nc-OS) film. In a high-resolution TEM image of the nc-OS film, a grain boundary cannot be found clearly in the nc-OS film in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has periodic atomic order. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak that shows a crystal plane does not appear. Furthermore, a halo pattern is shown in a selected-area electron diffraction pattern of the nc-OS film obtained by using an electron beam having a probe diameter larger than the diameter of a crystal part (e.g., larger than or equal to 50 nm). Meanwhile, spots are shown in a nanobeam electron diffraction pattern of the nc-OS film obtained by using an electron beam having a probe diameter close to or smaller than the diameter of a crystal part. Furthermore, in a nanobeam electron diffraction pattern of the nc-OS film, regions with high luminance in a circular (ring) pattern are observed in some cases. Also in a nanobeam electron diffraction pattern of the nc-OS film, a plurality of spots are shown in a ring-like region in some cases.

The nc-OS film is an oxide semiconductor film that has high regularity than an amorphous oxide semiconductor film. Thus, the nc-OS film has a lower density of defect states than the amorphous oxide semiconductor film. Note that there is no regularity of crystal orientation between different crystal parts in the nc-OS film; thus, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state as in quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (amorphous-like OS or a-like OS) film.

In a high-resolution TEM image of the a-like OS film, a void may be seen. Furthermore, in the high-resolution TEM image, there are a region where a crystal part is clearly observed and a region where a crystal part is not observed. In the a-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as a d value). The value is calculated to be 0.29 nm from crystal structure analysis. Thus, each of the lattice fringes in which the spacing therebetween is from 0.28 nm to 0.30 nm corresponds to the a-b plane of the $InGaZnO_4$ crystal, focusing on the lattice fringes in the high-resolution TEM image.

The density of an oxide semiconductor film might vary depending on its structure. For example, if the composition of an oxide semiconductor film is determined, the structure of the oxide semiconductor film can be estimated from a comparison between the density of the oxide semiconductor film and the density of a single-crystal oxide semiconductor film having the same composition as the oxide semiconductor film. For example, the density of an a-like OS film is higher than or equal to 78.6% and lower than 92.3% of that of the single-crystal oxide semiconductor film. In addition, for example, the density of an nc-OS film or a CAAC-OS film is higher than or equal to 92.3% and lower than 100% of that of the single-crystal oxide semiconductor film. Note that it is difficult to deposit an oxide semiconductor film whose density is lower than 78% of that of the single-crystal oxide semiconductor film.

Specific examples of the above are described. For example, in the case of an oxide semiconductor film with an atomic ratio of In:Ga:Zn=1:1:1, the density of single-crystal InGaZnO$_4$ with a rhombohedral crystal structure is 6.357 g/cm$^3$. Thus, for example, in the case of the oxide semiconductor film with an atomic ratio of In:Ga:Zn=1:1:1, the density of an a-like OS film is higher than or equal to 5.0 g/cm$^3$ and lower than 5.9 g/cm$^3$. In addition, for example, in the case of the oxide semiconductor film with an atomic ratio of In:Ga:Zn=1:1:1, the density of an nc-OS film or a CAAC-OS film is higher than or equal to 5.9 g/cm$^3$ and lower than 6.3 g/cm$^3$.

Note that single crystals with the same composition do not exist in some cases. In such a case, by combining single crystals with different compositions at a given proportion, it is possible to calculate density that corresponds to the density of a single crystal with a desired composition. The density of the single crystal with a desired composition may be calculated using weighted average with respect to the combination ratio of the single crystals with different compositions. Note that it is preferable to combine as few kinds of single crystals as possible for density calculation.

Note that an oxide semiconductor film may be a stacked film including two or more films of an amorphous oxide semiconductor film, an a-like OS film, a microcrystalline oxide semiconductor film, and a CAAC-OS film, for example.

In this specification, the term "parallel" indicates that an angle formed between two straight lines is −10 to 10°, and accordingly includes the case where the angle is −5 to 5°. The term "substantially parallel" indicates that an angle formed between two straight lines is −30 to 30°. In addition, the term "perpendicular" indicates that an angle formed between two straight lines is 80 to 100°, and accordingly includes the case where the angle is 85 to 95°. The term "substantially perpendicular" indicates that an angle formed between two straight lines is 60 to 120°.

In this specification, trigonal and rhombohedral crystal systems are included in a hexagonal crystal system.

Note that the description of this embodiment can be combined with description disclosed in this specification and the like, such as another description disclosed in this embodiment and the description of any of the other embodiments, as appropriate.

Embodiment 5

In this embodiment, a semiconductor device is described.

A cross-sectional structure example of a semiconductor device is described with reference to a cross-sectional view of a semiconductor device in FIG. 28.

Figure 28:
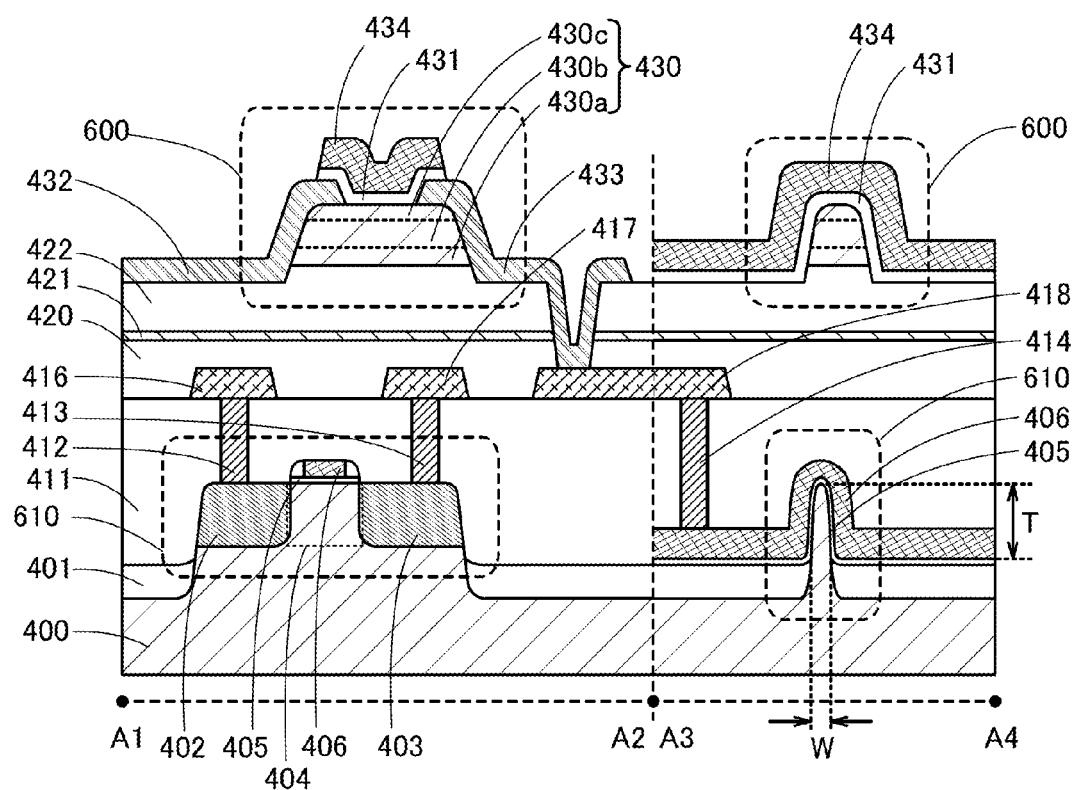
FIG. 28 is a cross-sectional view illustrating one embodiment of the present invention.

The semiconductor device in FIG. 28 includes transistors 600 and 610. The transistor 600 can be used as an OS transistor. The transistor 610 can be used as a Si transistor. For example, the transistor 600 corresponds to the transistor 102 in Embodiments 1 and 2, and the transistor 610 corresponds to the transistor 103 in Embodiments 1 and 2. Alternatively, the transistor 600 corresponds to the transistor 105 in Embodiments 1 and 2, and the transistor 610 corresponds to the transistor 107 in Embodiments 1 and 2. Alternatively, the transistor 600 corresponds to the transistor 109 in Embodiment 2, and the transistor 610 corresponds to the transistor 107 in Embodiments 1 and 2.

Note that the structures of transistors 600 and 610 in a channel length direction are shown in a region indicated by broken line A1-A2, and the structures of the transistors 600 and 610 in a channel width direction are shown in a region indicated by broken line A3-A4. In one embodiment of the present invention, the channel length direction of the transistor 600 is not necessarily aligned with the channel length direction of the transistor 610.

The channel length direction denotes a direction in which carriers move at the shortest distance between a pair of impurity regions serving as a source region and a drain region. The channel width direction denotes a direction perpendicular to the channel length direction.

The transistor 610 is formed using a single crystal silicon substrate, and the transistor 600 is formed over the transistor 610. The transistor 600 includes a channel formation region in an oxide semiconductor film.

The transistor 610 may include a channel formation region in a semiconductor film or a semiconductor substrate of silicon, germanium, or the like in an amorphous, microcrystalline, polycrystalline, or single crystal state. Alternatively, the transistor 610 may include a channel formation region in an oxide semiconductor film or an oxide semiconductor substrate. In the case where the transistors each include a channel formation region in an oxide semiconductor film or an oxide semiconductor substrate, the transistor 600 is not necessarily stacked over the transistor 610, and the transistors 600 and 610 may be formed in the same layer.

In the case where the transistor 610 is formed using a silicon thin film, any of the following can be used for the thin film: amorphous silicon formed by sputtering or vapor phase growth such as plasma-enhanced CVD; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A substrate 400 where the transistor 610 is formed can be, for example, a silicon substrate, a germanium substrate, or a silicon germanium substrate. In FIG. 28, a single crystal silicon substrate is used as the substrate 400.

The transistor 610 is electrically isolated by element isolation. Trench isolation (e.g., shallow trench isolation (STI)) or the like can be used as the element isolation. In FIG. 28, the transistor 610 is electrically isolated by trench isolation. Specifically, in FIG. 28, the transistor 610 is electrically isolated by element isolation using an element isolation region 401 formed in such a manner that an insulator including silicon oxide or the like is buried in a trench formed in the substrate 400 by etching or the like and then the insulator is removed partly by etching or the like.

On a projection of the substrate 400 in a region other than the trench, impurity regions 402 and 403 of the transistor 610 and a channel formation region 404 positioned between the impurity regions 402 and 403 are provided. The transistor 610 includes an insulating film 405 covering the channel formation region 404 and a gate electrode 406 overlapping with the channel formation region 404 with the insulating film 405 positioned therebetween.

In the transistor 610, a side portion and an upper portion of the projection in the channel formation region 404 overlaps with the gate electrode 406 with the insulating film 405 positioned therebetween, so that carriers flow in a wide area (including a side portion and an upper portion of the channel formation region 404). Thus, the area of the transistor 610 in the substrate can be small, and the amount of transfer of carriers in the transistor 610 can be increased. As a result, the on-state current and field-effect mobility of the transistor 610 are increased. In particular, if the width (channel width) of the projection in the channel formation region 404 in a channel width direction is denoted by W and the film thickness of the projection in the channel formation region 404 is denoted by T, carriers flow in a wider area when the aspect ratio that corresponds to the ratio of the film thickness T to the channel width W is high. Consequently, the on-state current and field-effect mobility of the transistor 610 can be further increased.

Note that in the case of the transistor 610 formed using a bulk semiconductor substrate, the aspect ratio is preferably 0.5 or higher, more preferably 1 or higher.

An insulating film 411 is provided over the transistor 610. Openings are formed in the insulating film 411. In the openings, conductive films 412 and 413 electrically connected to the impurity regions 402 and 403, respectively, and a conductive film 414 electrically connected to the gate electrode 406 are formed.

The conductive film 412 is electrically connected to a conductive film 416 formed over the insulating film 411. The conductive film 413 is electrically connected to a conductive film 417 formed over the insulating film 411. The conductive film 414 is electrically connected to a conductive film 418 formed over the insulating film 411.

An insulating film 420 is provided over the conductive films 416 to 418. An insulating film 421 having an effect of blocking diffusion of oxygen, hydrogen, and water is provided over the insulating film 420. As the insulating film 421 has higher density and becomes denser or has a fewer dangling bonds and becomes more chemically stable, the insulating film 421 has a higher blocking effect. The insulating film 421 having an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. The insulating film 421 having an effect of blocking diffusion of hydrogen and water can be formed using, for example, silicon nitride or silicon nitride oxide.

An insulating film 422 is provided over the insulating film 421. The transistor 600 is provided over the insulating film 422.

The transistor 600 includes, over the insulating film 422, a semiconductor film 430 including an oxide semiconductor; conductive films 432 and 433 that are electrically connected to the semiconductor film 430 and function as a source electrode and a drain electrode; a gate insulating film 431 covering the semiconductor film 430; and a gate electrode 434 overlapping with the semiconductor film 430 with the gate insulating film 431 positioned therebetween. Note that an opening is provided in the insulating films 420 to 422, and the conductive film 433 is connected to the conductive film 418 through the opening.

Note that in FIG. 28, the transistor 600 includes at least the gate electrode 434 on one side of the semiconductor film 430, and may further include a gate electrode overlapping with the semiconductor film 430 with the insulating film 422 positioned therebetween.

When the transistor 600 includes a pair of gate electrodes, a signal for controlling an on state or an off state may be supplied to one of the gate electrodes, and the other of the gate electrodes may be supplied with a potential from another element. In that case, potentials at the same level may be supplied to the pair of gate electrodes, or a fixed potential such as a ground potential may be supplied only to the other of the gate electrodes. By controlling the level of a potential applied to the other of the gate electrodes, the threshold voltage of the transistor can be controlled.

In FIG. 28, the transistor 600 has a single-gate structure where one channel formation region corresponding to one gate electrode 434 is provided. However, the transistor 600 may have a multi-gate structure where a plurality of channel formation regions are formed in one active layer by providing a plurality of gate electrodes electrically connected to each other.

As illustrated in FIG. 28, in the transistor 600, the semiconductor film 430 includes oxide semiconductor films 430a to 430c stacked sequentially over the insulating film 422. Note that in one embodiment of the present invention, the semiconductor film 430 of the transistor 600 may be formed using a single-layer metal oxide film.

The insulating film 422 preferably has a function of supplying part of oxygen to the oxide semiconductor films 430a to 430c by heating. In addition, the insulating film 422 preferably has few defects, typically, spin density at g=2.001 due to a dangling bond of silicon is preferably lower than or equal to $1 \times 10^{18}$ spins/cm$^3$ when measured by ESR.

The insulating film 422 is preferably formed using an oxide to have a function of supplying part of oxygen to the oxide semiconductor films 430a to 430c by heating. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 422 can be formed by plasma-enhanced CVD, sputtering, or the like.

Note that in this specification, oxynitride contains more oxygen than nitrogen, and nitride oxide contains more nitrogen than oxygen.

Note that in the transistor 600 in FIG. 28, the gate electrode 434 overlaps with end portions of the oxide semiconductor film 430b including a channel region that do not overlap with the conductive films 432 and 433, i.e., end portions of the oxide semiconductor film 430b that are in a region different from a region where the conductive films 432 and 433 are located. When the end portions of the oxide semiconductor film 430b are exposed to plasma by etching for forming the end portions, a chlorine radical, a fluorine radical, or other radicals generated from an etching gas are easily bonded to a metal element contained in an oxide semiconductor. For this reason, in the end portion of the oxide semiconductor film, oxygen bonded to the metal element is easily eliminated, so that an oxygen vacancy is easily formed; thus, the oxide semiconductor film easily has n-type conductivity. However, an electric field applied to the end portions can be controlled by controlling the potential of the gate electrode 434 because the end portions of the oxide semiconductor film 430b that do not overlap with the conductive films 432 and 433 overlap with the gate electrode 434 in the transistor 600 in FIG. 28. Consequently, current that flows between the conductive films 432 and 433 through the end portions of the oxide semiconductor film 430b can be controlled by the potential applied to the gate electrode 434. Such a structure of the transistor 600 is referred to as a surrounded channel (s-channel) structure.

With the s-channel structure, specifically, when a potential at which the transistor 600 is turned off is supplied to the gate electrode 434, the amount of off-state current that flows between the conductive films 432 and 433 through the end portions can be reduced. For this reason, in the transistor 600, even when the distance between the conductive films 432 and 433 at the end portions of the oxide semiconductor film 430b is reduced as a result of reducing the channel length to obtain high on-state current, the transistor 600 can have low off-state current. Consequently, with the short channel length, the transistor 600 can have high on-state current when it is on and have low off-state current when it is off.

With the s-channel structure, specifically, when a potential at which the transistor 600 is turned on is supplied to the gate electrode 434, the amount of current that flows between the conductive films 432 and 433 through the end portions of the oxide semiconductor film 430b can be increased. The current contributes to an increase in the field-effect mobility and on-state current of the transistor 600. When the end portions of the oxide semiconductor film 430b overlap with the gate electrode 434, carriers flow in a wide region of the oxide semiconductor film 430b without being limited to a region in the vicinity of the interface between the oxide semiconductor film 430b and the gate insulating film 431, which results in an increase in the amount of carrier movement in the transistor 600. As a result, the on-state current of the transistor 600 is increased, and the field-effect mobility is increased. Typically, the field-effect mobility is greater than or equal to 10 $cm^2/V \cdot s$ or greater than or equal to 20 $cm^2/V \cdot s$. Note that here, the field-effect mobility is not an approximate value of the mobility as the physical property of the oxide semiconductor film but is an index of current drive capability and the apparent field-effect mobility of a saturation region of the transistor.

Figure 29:
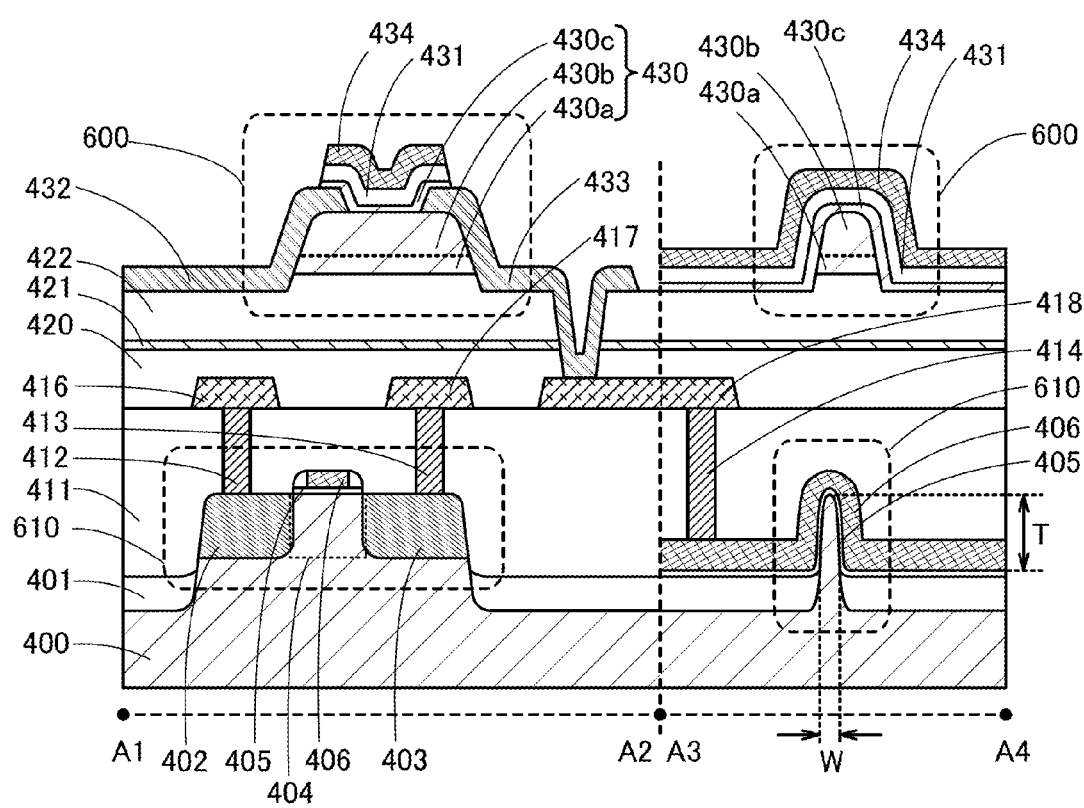
FIG. 29 is a cross-sectional view illustrating one embodiment of the present invention.

Although this embodiment is described with reference to FIG. 28, one embodiment of the present invention is not limited to this structure. For example, a structure illustrated in FIG. 29 may be employed.

Note that the description of this embodiment can be combined with description disclosed in this specification and the like, such as another description disclosed in this embodiment and the description of any of the other embodiments, as appropriate.

Embodiment 6

Although the conductive film and the semiconductor film described in the above embodiments can be formed by sputtering, they may be formed by another method, for example, thermal CVD. Metal organic chemical vapor deposition (MOCVD) or atomic layer deposition (ALD) may be employed as an example of thermal CVD.

Thermal CVD does not generate plasma and thus has an advantage that no defect due to plasma damage is caused.

Deposition by thermal CVD may be performed in such a manner that the pressure in a chamber is set to an atmospheric pressure or a reduced pressure, and a source gas and an oxidizer are supplied to the chamber at the same time and react with each other in the vicinity of the substrate or over the substrate.

Deposition by ALD may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). In such a case, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at the same time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed. The sequence of the gas introduction is repeated more than once until desired thickness is obtained, so that a thin film with excellent step coverage can be formed. The thickness of the thin film can be adjusted by the number of repetition times of the sequence of the gas introduction; therefore, ALD makes it possible to accurately adjust thickness and thus is suitable for manufacturing a minute FET.

The conductive film and the semiconductor film that are described in the above embodiment can be formed by thermal CVD such as MOCVD or ALD. For example, in the case where an $InGaZnO_X$ (X>0) film is formed, trimethylindium, trimethylgallium, and dimethylzinc are used. Note that the chemical formula of trimethylindium is $(CH_3)_3In$. The chemical formula of trimethylgallium is $(CH_3)_3Ga$. The chemical formula of dimethylzinc is $(CH_3)_2Zn$. Without limitation to the above combination, triethylgallium (chemical formula: $(C_2H_5)_3Ga$) can be used instead of trimethylgallium and diethylzinc (chemical formula: $(C_2H_5)_2Zn$) can be used instead of dimethylzinc.

For example, in the case where a tungsten film is formed using a deposition apparatus employing ALD, a $WF_6$ gas and a $B_2H_6$ gas are sequentially introduced more than once to form an initial tungsten film, and then a $WF_6$ gas and an $H_2$ gas are introduced at the same time, so that a tungsten film is formed. Note that an $SiH_4$ gas may be used instead of a $B_2H_6$ gas.

For example, in the case where an oxide semiconductor film, e.g., an $InGaZnO_X$ (X>0) film is formed using a deposition apparatus employing ALD, an $In(CH_3)_3$ gas and an $O_3$ gas are sequentially introduced more than once to form an $InO_2$ layer, a $Ga(CH_3)_3$ gas and an $O_3$ gas are introduced at the same time to form a GaO layer, and then a $Zn(CH_3)_2$ gas and an $O_3$ gas are introduced at the same time to form a ZnO layer. Note that the order of these layers is not limited to this example. A mixed compound layer such as an $InGaO_2$ layer, an $InZnO_2$ layer, a GaInO layer, a ZnInO layer, or a GaZnO layer may be formed by mixing these gases. Note that although an $H_2O$ gas that is obtained by bubbling with an inert gas such as Ar may be used instead of an $O_3$ gas, it is preferable to use an $O_3$ gas, which does not contain H. Instead of an $In(CH_3)_3$ gas, an $In(C_2H_5)_3$ gas may be used. Instead of a $Ga(CH_3)_3$ gas, a $Ga(C_2H_5)_3$ gas may be used. Instead of an $In(CH_3)_3$ gas, an $In(C_2H_5)_3$ gas may be used. Furthermore, a $Zn(CH_3)_2$ gas may be used.

Note that the description of this embodiment can be combined with description disclosed in this specification and the like, such as another description disclosed in this embodiment and the description of any of the other embodiments, as appropriate.

Embodiment 7

In this embodiment, examples in which the semiconductor device described in the above embodiment is used in an electronic component and examples in which the semiconductor device described in the above embodiment is used in an electronic device including the electronic component are described with reference to FIGS. 30A and 30B and FIGS. 31A to 31E.

Figure 30A:
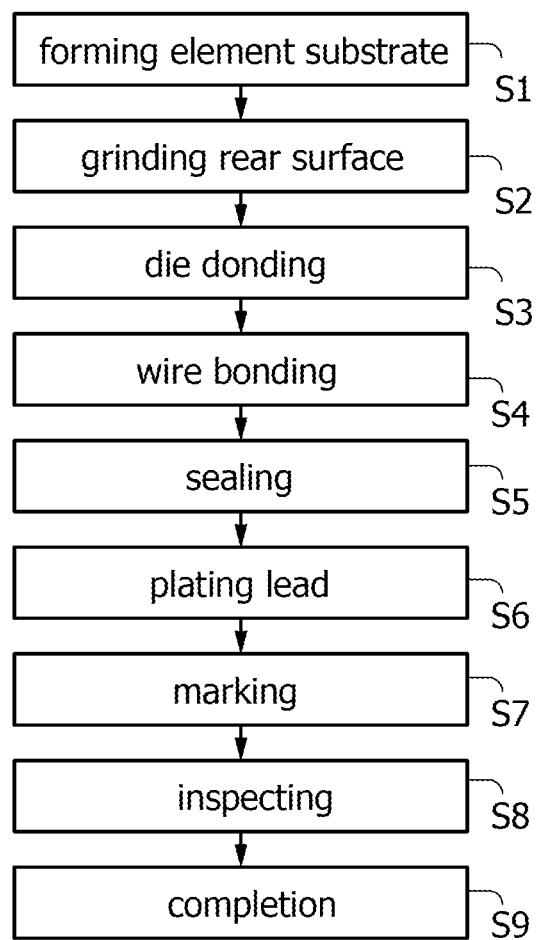
FIG. 30A is a flow chart illustrating steps of manufacturing an electronic component.

FIG. 30A illustrates an example in which the semiconductor device described in the above embodiment is used in an electronic component. Note that the electronic component is also referred to as a semiconductor package or an IC package. This electronic component has a plurality of standards and names depending on a terminal extraction direction and a terminal shape. Thus, examples of the electronic component are described in this embodiment.

A circuit portion including a transistor as illustrated in FIG. 28 in Embodiment 5 can be completed after an assembly process (post-process) by using a plurality of components that can be detached and attached from and to a printed wiring board in combination.

The post-process can be finished through each step in FIG. 30A. Specifically, after an element substrate obtained in the preceding process is completed (Step S1), a rear surface of the substrate is ground (Step S2). By thinning the substrate at this stage, the warpage or the like of the substrate in the preceding process is reduced and the component is downsized.

The rear surface of the substrate is ground so that the substrate is divided into a plurality of chips in a dicing process. Then, the divided chips are separately picked up to be mounted on and bonded to a lead frame in a die bonding process (Step S3). In this die bonding process, the chip is bonded to the lead frame by an appropriate method depending on a product, for example, bonding with a resin or a tape. Note that in the die bonding process, bonding between the chip and the lead frame may be conducted by mounting the chip on an interposer.

Then, wire bonding is performed to electrically connect lead of the lead frame to an electrode on the chip with a metal fine line (wire) (Step S4). A silver line or a gold line can be used as the metal fine line. Ball bonding or wedge bonding can be used as the wire bonding.

A molding process is performed to seal the wire bonded chip with an epoxy resin or the like (Step S5). With the molding process, the electronic component is filled with the resin, so that a mounted circuit portion or wire can be protected against mechanical external force. Furthermore, deterioration in characteristics due to moisture or dust can be reduced.

Next, plate processing is performed on the lead of the lead frame. After that, the lead is cut and processed (Step S6). This plate processing prevents rust of the lead and facilitates soldering at the time of mounting the chip on a printed wiring board in a later step.

Then, printing (marking) is performed on a surface of the package (Step S7). Through the final inspection process (Step S8), the electronic component that includes the circuit portion including the semiconductor device described in the above embodiment is completed (Step S9).

The above electronic component can include the semiconductor device described in the above embodiment. Thus, the electronic component can consume less power and have higher reliability.

Figure 30B:
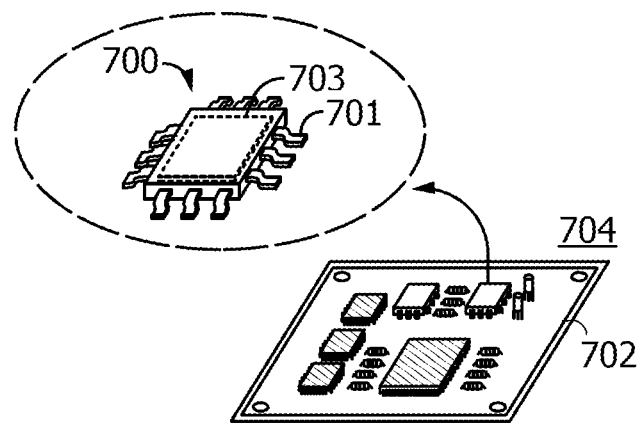
FIG. 30B is a schematic perspective view of the electronic component.

FIG. 30B is a schematic perspective view of the completed electronic component. FIG. 30B illustrates a schematic perspective view of a quad flat package (QFP) as an example of the electronic component. A lead 701 and a circuit portion 703 of an electronic component 700 are illustrated in FIG. 30B. The electronic component 700 in FIG. 30B is mounted on a printed wiring board 702, for example. When a plurality of electronic components 700 are used in combination and electrically connected to each other over the printed wiring board 702, the electronic components 700 can be mounted on an electronic device. A completed circuit board 704 is provided in the electronic device or the like.

Then, applications of the electronic component to an electronic device such as a computer, a portable information terminal (including a cellular phone, a portable game machine, an audio reproducing device, and the like), electronic paper, a television device (also referred to as a television or a television receiver), or a digital video camera are described.

Figure 31A:
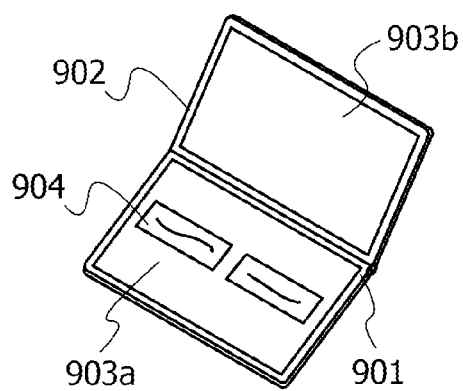
FIGS. 31A to 31F are electronic devices including electronic components.

FIG. 31A illustrates a portable information terminal, which includes a housing 901, a housing 902, a first display portion 903a, a second display portion 903b, and the like. An electronic component including the semiconductor device described in the above embodiment is provided in at least one of the housings 901 and 902. Thus, a portable information terminal that consumes less power and has higher reliability is obtained.

Note that the first display portion 903a is a touch panel, and for example, as illustrated in the left of FIG. 31A, which of "touch input" and "keyboard input" is performed can be selected by a selection button 904 displayed on the first display portion 903a. Since the selection buttons with a variety of sizes can be displayed, the portable information terminal can be easily used by people of any generation. In the case where "keyboard input" is selected, for example, a keyboard 905 is displayed on the first display portion 903a as illustrated in the right of FIG. 31A. With the keyboard 905, letters can be input quickly by keyboard input as in the case of using a conventional information terminal, for example.

Furthermore, one of the first display portion 903a and the second display portion 903b can be detached from the portable information terminal as illustrated in the right in FIG. 31A. The second display portion 903b can also function as a touch panel for a reduction in weight to carry around to be operated by one hand while the other hand supports the housing 902, which is convenient.

The portable information terminal in FIG. 31A can have a function of displaying various kinds of information (e.g., a still image, a moving image, and a text image), a function of displaying a calendar, a date, the time, or the like on the display portion, a function of operating or editing the information displayed on the display portion, a function of controlling processing by various kinds of software (programs), and the like. Furthermore, an external connection terminal (e.g., an earphone terminal or a USB terminal), a recording medium insertion portion, and the like may be provided on the rear surface or the side surface of the housing.

The portable information terminal in FIG. 31A may transmit and receive data wirelessly. Through wireless communication, desired book data or the like can be purchased and downloaded from an electronic book server.

Furthermore, the housing 902 in FIG. 31A may have an antenna, a microphone function, or a wireless communication function to be used as a cellular phone.

Figure 31B:
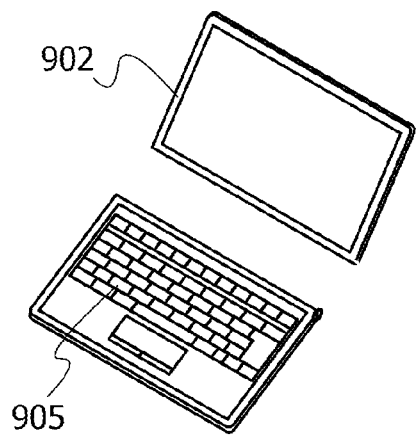

FIG. 31B illustrates an e-book reader 910 including electronic paper. The e-book reader 910 includes two housings 911 and 912. The housing 911 and the housing 912 include a display portion 913 and a display portion 914, respectively. The housings 911 and 912 are connected to each other by a hinge 915, so that the e-book reader 910 can be opened and closed using the hinge 915 as an axis. The housing 911 includes a power button 916, operation keys 917, a speaker 918, and the like. An electronic component including the semiconductor device described in the above embodiment is provided in at least one of the housings 911 and 912. Thus, an e-book reader that consumes less power and has higher reliability is obtained.

Figure 31C:
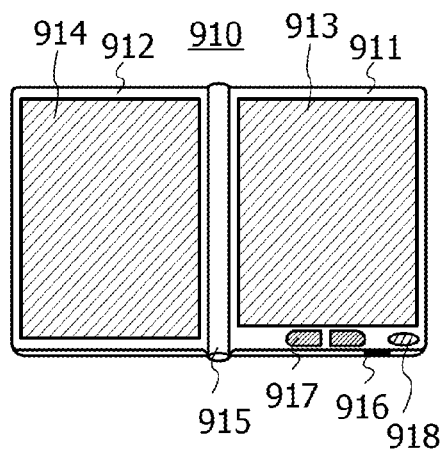

FIG. 31C is a television device, which includes a housing 921, a display portion 922, a stand 923, and the like. The television device 920 can be operated with a switch of the housing 921 and a remote control 924. An electronic component including the semiconductor device described in the above embodiment is provided in the housing 921 and the remote control 924. Thus, a television device that consumes less power and has higher reliability is obtained.

Figure 31D:
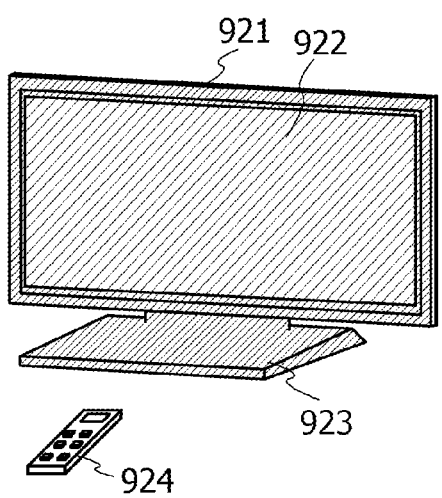

FIG. 31D illustrates a smartphone in which a main body 930 includes a display portion 931, a speaker 932, a microphone 933, operation buttons 934, and the like. An electronic component including the semiconductor device described in the above embodiment is provided in the main body 930. Thus, a smartphone that consumes less power and has higher reliability is obtained.

Figure 31E:
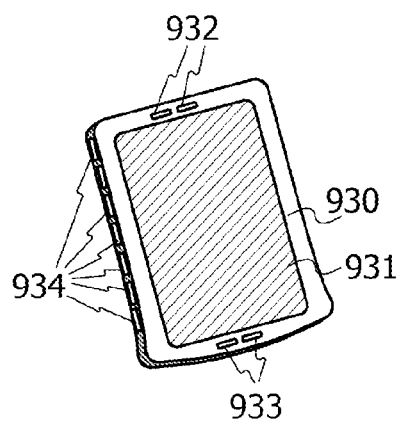
Figure 31F:
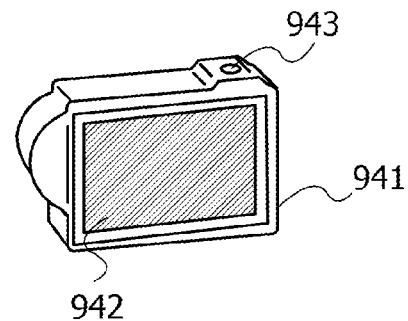

FIG. 31E illustrates a digital camera, which includes a main body 941, a display portion 942, an operation switch 943, and the like. An electronic component including the semiconductor device described in the above embodiment is provided in the main body 941. Thus, a digital camera that consumes less power and has higher reliability is obtained.

As described above, an electronic component including the semiconductor device described in the above embodiment is provided in each of the electronic devices described in this embodiment. Thus, an electronic device that consumes less power and has higher reliability is obtained.

This application is based on Japanese Patent Application serial No. 2013-268614 filed with Japan Patent Office on Dec. 26, 2013, the entire contents of which are hereby incorporated by reference.

What is claimed is:

1. A semiconductor device comprising:
   a first transistor;
   a second transistor;
   a third transistor;
   a fourth transistor; and
   a capacitor,
   wherein one of a source and a drain of the first transistor is electrically connected to a first wiring,
   wherein the other of the source and the drain of the first transistor is electrically connected to a first terminal of the capacitor,
   wherein one of a source and a drain of the second transistor is electrically connected to the first terminal of the capacitor,
   wherein the other of the source and the drain of the second transistor is electrically connected to a gate of the third transistor,
   wherein one of a source and a drain of the third transistor is electrically connected to a second wiring,
   wherein the other of the source and the drain of the third transistor is electrically connected to a third wiring,
   wherein the other of the source and the drain of the third transistor is electrically connected to a gate of the fourth transistor,
   wherein one of a source and a drain of the fourth transistor is electrically connected to a fourth wiring, and
   wherein the other of the source and the drain of the fourth transistor is directly connected to the gate of the third transistor.

2. The semiconductor device according to claim 1, further comprising a fifth transistor, a sixth transistor, and a seventh transistor,
   wherein the other of the source and the drain of the third transistor is electrically connected to the third wiring through the fifth transistor,
   wherein the other of the source and the drain of the third transistor is electrically connected to the gate of the fourth transistor through the sixth transistor, and
   wherein the gate of the fourth transistor is electrically connected to the fourth wiring through the seventh transistor.

3. The semiconductor device according to claim 1,
   wherein each of the first transistor and the second transistor comprises a channel formation region comprising an oxide semiconductor.

4. The semiconductor device according to claim 1, further comprising an eighth transistor,
   wherein one of a source and a drain of the eighth transistor is electrically connected to the one of the source and the drain of the third transistor, and
   wherein the other of the source and the drain of the eighth transistor is electrically connected to the gate of the third transistor.

5. The semiconductor device according to claim 1, further comprising a ninth transistor,
   wherein one of a source and a drain of the ninth transistor is electrically connected to one of the source and the drain of the first transistor, and
   wherein the other of the source and the drain of the ninth transistor is electrically connected to the gate of the third transistor.

6. A semiconductor device comprising:
   a first transistor;
   a second transistor;
   a third transistor;
   a fourth transistor;
   a fifth transistor;
   a sixth transistor;
   a seventh transistor; and
   a capacitor,
   wherein one of a source and a drain of the first transistor is electrically connected to a first wiring,
   wherein the other of the source and the drain of the first transistor is electrically connected to a first terminal of the capacitor,
   wherein one of a source and a drain of the second transistor is electrically connected to the first terminal of the capacitor,
   wherein the other of the source and the drain of the second transistor is electrically connected to a gate of the third transistor,
   wherein one of a source and a drain of the third transistor is electrically connected to a second wiring,
   wherein the other of the source and the drain of the third transistor is electrically connected to one of a source and a drain of the fourth transistor,
   wherein the other of the source and the drain of the fourth transistor is electrically connected to a third wiring,
   wherein the other of the source and the drain of the third transistor is electrically connected to one of a source and a drain of the fifth transistor,
   wherein the other of the source and the drain of the fifth transistor is electrically connected to a gate of the seventh transistor,
   wherein the other of the source and the drain of the fifth transistor is electrically connected to one of a source and a drain of the sixth transistor,
   wherein the other of the source and the drain of the sixth transistor is electrically connected to a fourth wiring, wherein one of a source and a drain of the seventh transistor is electrically connected to the fourth wiring, and wherein the other of the source and the drain of the seventh transistor is electrically connected to the gate of the third transistor.

7. The semiconductor device according to claim 6, wherein each of the first transistor and the second transistor comprises a channel formation region comprising an oxide semiconductor.

8. The semiconductor device according to claim 6, further comprising an eighth transistor, wherein one of a source and a drain of the eighth transistor is electrically connected to the one of the source and the drain of the third transistor, and wherein the other of the source and the drain of the eighth transistor is electrically connected to the gate of the third transistor.

9. The semiconductor device according to claim 6, further comprising a ninth transistor, wherein one of a source and a drain of the ninth transistor is electrically connected to one of the source and the drain of the first transistor, and wherein the other of the source and the drain of the ninth transistor is electrically connected to the gate of the third transistor.

10. A semiconductor device comprising:

a first transistor;
a second transistor;
a third transistor;
a fourth transistor;
an eighth transistor; and
a capacitor, wherein the first transistor is configured to supply a first signal to the capacitor, wherein the capacitor is configured to hold a potential based on the first signal, wherein the second transistor is configured to supply the potential based on the first signal to a gate of the third transistor, wherein the third transistor is configured to output a first potential to a wiring and is configured to supply the first potential to a gate of the fourth transistor, wherein the fourth transistor is configured to supply a second potential to the capacitor through the second transistor, and wherein the eighth transistor is configured to supply the first potential to the gate of the third transistor.

11. The semiconductor device according to claim 10, wherein each of the first transistor and the second transistor comprises a channel formation region comprising an oxide semiconductor.

12. The semiconductor device according to claim 10, further comprising a ninth transistor, wherein the ninth transistor is configured to supply the first signal to the gate of the third transistor.

13. A semiconductor device comprising:

a first transistor;
a second transistor;
a third transistor;
a fourth transistor;
a fifth transistor;
a sixth transistor;
a seventh transistor; and
a capacitor, wherein the first transistor is configured to supply a first signal to the capacitor, wherein the capacitor is configured to hold a potential based on the first signal, wherein the second transistor is configured to supply the potential based on the first signal to a gate of the third transistor, wherein the third transistor is configured to supply a first potential to a first wiring through the fourth transistor and is configured to supply the first potential to a gate of the seventh transistor through the fifth transistor, wherein the sixth transistor is configured to supply a second potential to the gate of the seventh transistor, and wherein the seventh transistor is configured to supply the second potential to the capacitor through the second transistor.

14. The semiconductor device according to claim 13, wherein each of the first transistor and the second transistor comprises a channel formation region comprising an oxide semiconductor.

15. The semiconductor device according to claim 13, further comprising an eighth transistor, wherein the eighth transistor is configured to supply the first potential to the gate of the third transistor.

16. The semiconductor device according to claim 13, further comprising a ninth transistor, wherein the ninth transistor is configured to supply the first signal to the gate of the third transistor.

* * * * *